United States Patent
Xiong et al.

(10) Patent No.: US 8,981,489 B2
(45) Date of Patent: Mar. 17, 2015

(54) SEMICONDUCTOR DEVICES INCLUDING A RESISTOR STRUCTURE AND METHODS OF FORMING THE SAME

(71) Applicant: Samsung Electronics Co., Ltd., Suwon-si (KR)

(72) Inventors: Junjie Xiong, Suwon-si (KR); Yoon-Hae Kim, Suwon-si (KR); Hong-Seong Kang, Hwaseong-si (KR); Yoon-Seok Lee, Seoul (KR); You-Shin Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/102,736

(22) Filed: Dec. 11, 2013

(65) Prior Publication Data

US 2014/0167181 A1  Jun. 19, 2014

(30) Foreign Application Priority Data

Dec. 13, 2012  (KR) .................. 10-2012-0145747

(51) Int. Cl.
| | |
|---|---|
| H01L 29/76 | (2006.01) |
| H01L 29/94 | (2006.01) |
| H01L 31/062 | (2012.01) |
| H01L 31/113 | (2006.01) |
| H01L 31/119 | (2006.01) |
| H01L 27/06 | (2006.01) |
| H01L 49/02 | (2006.01) |

(52) U.S. Cl.
CPC ............ *H01L 27/0629* (2013.01); *H01L 28/20* (2013.01); *H01L 28/24* (2013.01)

USPC ...... 257/369; 257/380; 257/536; 257/E27.06; 257/E27.062; 257/E27.016

(58) Field of Classification Search
USPC .......... 257/350, 369, 380, 528, 536, E27.016, 257/E27.062, E17.06
See application file for complete search history.

(56) References Cited

U.S. PATENT DOCUMENTS

| | | | |
|---|---|---|---|
| 6,406,956 B1 | 6/2002 | Tsai et al. |
| 6,518,642 B2 | 2/2003 | Kim et al. |
| 7,314,786 B1 | 1/2008 | Yang et al. |
| 7,858,484 B2 | 12/2010 | Mizumura |
| 7,883,983 B2 | 2/2011 | Hase |
| 7,951,644 B2 | 5/2011 | Tsai |
| 8,003,461 B1 | 8/2011 | Hsu et al. |

(Continued)

FOREIGN PATENT DOCUMENTS

| | | |
|---|---|---|
| JP | 2009-043944 | 2/2009 |
| JP | 2009-283497 | 12/2009 |
| KR | 1020020094889 | 12/2002 |

*Primary Examiner* — Hoai V Pham
(74) *Attorney, Agent, or Firm* — Myers Bigel Sibley Sajovec, P.A.

(57) ABSTRACT

Semiconductor devices including a resistor structure is provided. The semiconductor device may include a gate structure on an active region, a resistor structure on a field region and a first interlayer insulating layer on the gate structure and the resistor structure. The semiconductor devices may also include a resistor trench plug vertically penetrating through the first interlayer insulating layer and contacting the resistor structure and a second interlayer insulating layer on the first interlayer insulating layer and the resistor trench plug. Further, the semiconductor devices may include a resistor contact plug vertically penetrating through the first and second interlayer insulating layers and contacting the resistor structure.

20 Claims, 81 Drawing Sheets

(56) References Cited

U.S. PATENT DOCUMENTS

| | | |
|---|---|---|
| 8,154,104 B2 | 4/2012 | Shin et al. |
| 8,436,424 B2 | 5/2013 | Ikeda |
| 2010/0052058 A1 | 3/2010 | Hsu et al. |
| 2010/0059823 A1 | 3/2010 | Chung et al. |
| 2010/0328022 A1 | 12/2010 | Fan et al. |
| 2011/0057267 A1 | 3/2011 | Chuang et al. |
| 2011/0073957 A1 | 3/2011 | Chiu et al. |
| 2011/0266633 A1 | 11/2011 | Beyer et al. |
| 2013/0341731 A1* | 12/2013 | Chen et al. .......... 257/379 |

* cited by examiner

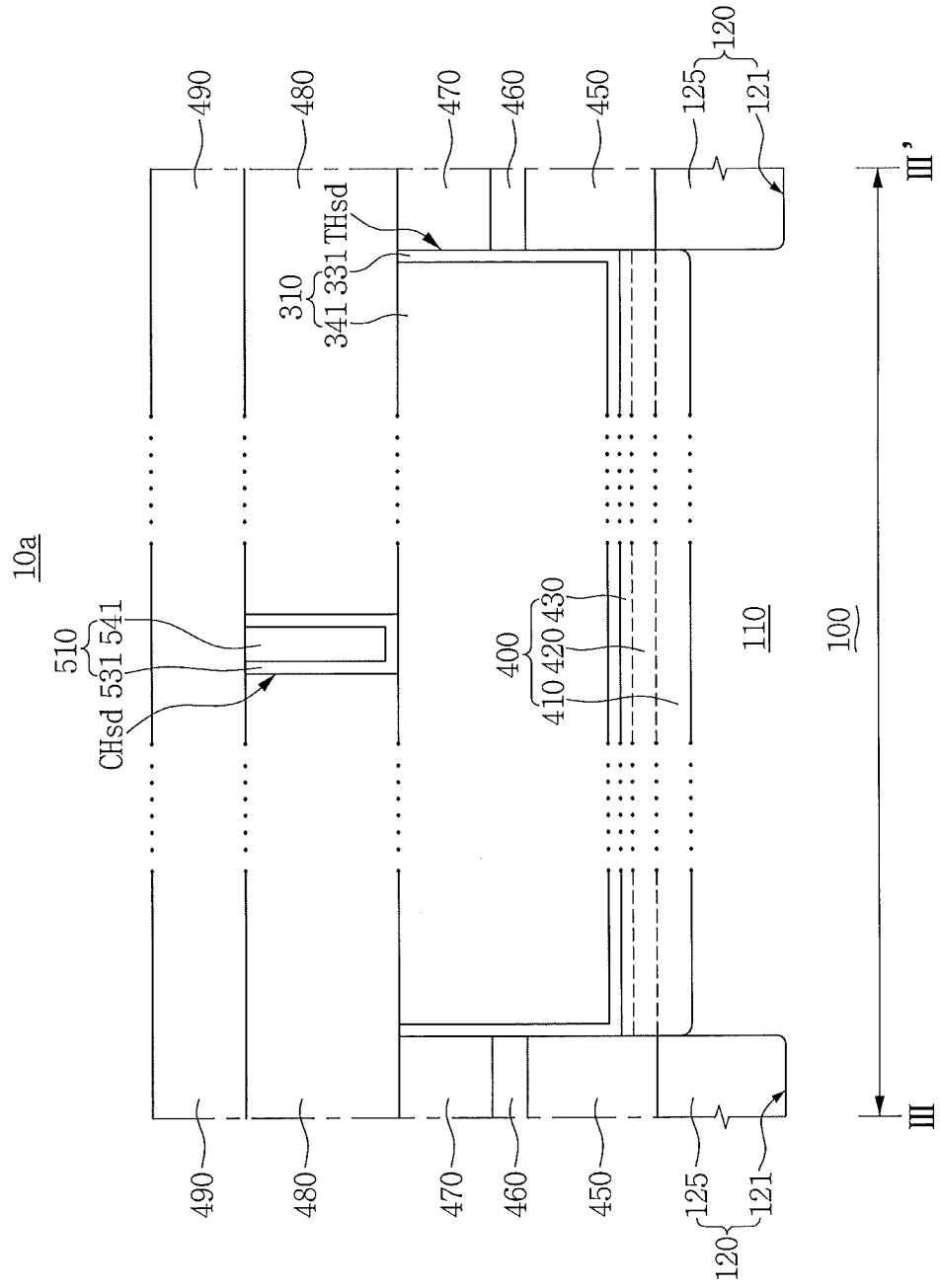

SEMICONDUCTOR DEVICES INCLUDING A RESISTOR STRUCTURE AND METHODS OF FORMING THE SAME

CROSS-REFERENCE TO RELATED APPLICATION

This U.S. non-provisional application claims priority under 35 U.S.C. §119 to Korean Patent Application No. 10-2012-0145747, filed on Dec. 13, 2012, in the Korean Intellectual Property Office, the disclosure of which is hereby incorporated by reference in its entirety.

FIELD

The present disclosure generally relates to the field of electronics, and more particularly, to semiconductor devices.

BACKGROUND

To increase densities of semiconductor devices by reducing design rules, technologies to downscale resistors in the semiconductor devices have been developed.

SUMMARY

A semiconductor device may include a substrate including an active region and a field region, a gate structure on the active region, a resistor structure on the field region and a first interlayer insulating layer on the gate structure and the resistor structure. The semiconductor device may also include a resistor trench plug vertically penetrating through the first interlayer insulating layer and contacting the resistor structure, a second interlayer insulating layer on the first interlayer insulating layer and the resistor trench plug, and a resistor contact plug vertically penetrating through the first and second interlayer insulating layers and contacting the resistor structure. The resistor contact plug may be spaced apart from the resistor trench plug.

In various embodiments, the semiconductor device may further include a source/drain region on the active region adjacent a side of the gate structure and a source/drain trench plug vertically penetrating through the first interlayer insulating layer and contacting the source/drain region.

According to various embodiments, a top surface of the resistor trench plug may be at a level equal to a top surface of the source/drain trench plug.

According to various embodiments, the semiconductor device may additionally include a source/drain contact plug vertically penetrating through the second interlayer insulating layer and contacting the source/drain trench plug.

According to various embodiments, the source/drain trench plug may include a source/drain trench electrode and a source/drain trench barrier layer surrounding bottom and side surfaces of the source/drain trench electrode. The source/drain contact plug may include a source/drain contact electrode and a source/drain contact barrier layer surrounding bottom and side surfaces of the source/drain contact electrode. The source/drain contact barrier layer may contact a top surface of the source/drain trench electrode. A top surface of the resistor contact plug may be at a level equal to a top surface of the source/drain contact plug. The semiconductor device may additionally include a gate contact plug vertically penetrating the first and second interlayer insulating layers and contacting the gate structure. A top surface of the gate contact plug, a top surface of the resistor contact plug, and a top surface of the source/drain contact plug may be at an equal level.

In various embodiments, the semiconductor device may further include a gate contact plug vertically penetrating the first and second interlayer insulating layers and contacting the gate structure. According to various embodiments, the field region may be a first field region and the device may also include a second field region. The gate structure may include a portion of the gate structure extending on the second field region, and the gate contact plug may contact the portion of the gate structure extending on the second field region.

In various embodiments, the resistor contact plug may contact a longitudinal edge portion of the resistor structure and the resistor trench plug may contact a longitudinal middle portion of the resistor structure.

In various embodiments, the resistor structure may include a resistor insulating layer on the field region, a resistor barrier layer on the resistor insulating layer, and a resistor electrode on the resistor barrier layer. The resistor insulating layer may have a U shape when viewed in cross section so as to surround bottom and side surfaces of the resistor barrier layer, and the resistor barrier layer may surround bottom and side surfaces of the resistor electrode.

According to various embodiments, the resistor insulating layer may include a metal oxide, the resistor barrier layer may include a metal or a metal nitride, and the resistor electrode may include a metal or a metal silicide.

According to various embodiments, the resistor trench plug may include a resistor trench electrode and a resistor trench barrier layer surrounding the resistor trench electrode. The resistor electrode and the resistor trench electrode may be contiguous with each other and the resistor barrier layer and the resistor trench barrier layer may be contiguous with each other.

A semiconductor device may include a substrate including an active region and a field region, a gate structure on the active region, a resistor structure on the field region, a source/drain region on the active region adjacent a side of the gate structure, and a first interlayer insulating layer covering the gate structure and the resistor structure. The semiconductor device may also include a source/drain trench plug vertically penetrating through the first interlayer insulating layer and contacting the source/drain region, a resistor trench plug vertically penetrating the first interlayer insulating layer and contacting the resistor structure, and a second interlayer insulating layer on the first interlayer insulating layer, the source/drain trench plug, and the resistor trench plug. The resistor trench plug may be contiguous with the resistor structure, and a top surface of the source/drain trench plug may be at a level equal to a top surface of the resistor trench plug. The semiconductor device may further include a gate contact plug vertically penetrating through the first and second interlayer insulating layers and contacting the gate structure.

In various embodiments, the semiconductor device may additionally include a source/drain contact plug vertically penetrating through the second interlayer insulating layer and contacting the source/drain trench plug. A top surface of the gate contact plug may be at a level equal to a top surface of the source/drain contact plug.

In various embodiments, the gate structure may include a gate electrode and a gate barrier layer surrounding the gate electrode, the resistor structure may include a resistor electrode and a resistor barrier layer surrounding the resistor electrode, the source/drain trench plug may include a source/drain trench electrode and a source/drain trench barrier layer surrounding the source/drain trench electrode, and the resistor trench plug may include a resistor trench electrode and a resistor trench barrier layer surrounding the resistor trench electrode. The resistor electrode, the source/drain trench electrode, and the resistor trench electrode may include a metal different from the gate electrode.

A semiconductor device may include a substrate including an active region and a field region, a first insulating layer on the substrate and a gate electrode on the active region in the first insulating layer. A top surface of the gate electrode and a top surface of the first insulating layer may be at an equal level. The semiconductor device may also include a second insulating layer on the first insulating layer and the gate electrode and a resistor electrode on the field region. The resistor electrode may include a lower resistor electrode in the first insulating layer and an upper resistor electrode in the second insulating layer, and the lower and upper resistor electrodes may be contiguous with each other. The semiconductor device may further include a resistor barrier layer including a lower portion extending between the first insulating layer and the lower resistor electrode and an upper portion extending between the second insulating layer and the upper resistor electrode.

In various embodiments, the lower and upper portions of the resistor barrier layer may be contiguous with each other.

In various embodiments, the semiconductor device may additionally include a gate insulating layer on a sidewall and a bottom surface of the gate electrode and a resistor insulating layer on a sidewall and a bottom surface of the resistor electrode. A top surface of the gate insulating layer may be at a level equal to a top surface of the resistor insulating layer.

In various embodiments, the semiconductor device may additionally include a source/drain region on the active region adjacent a side of the gate electrode and a source/drain contact contacting the source/drain region. The source/drain contact may include a source/drain electrode in the first and second insulating layers, and a top surface of the source/drain electrode may be at a level equal to a top surface of the resistor electrode.

According to various embodiments, the resistor electrode and the source/drain electrode may include a metal different from the gate electrode.

BRIEF DESCRIPTION OF THE DRAWINGS

FIGS. 2A through 2D are cross-sectional views of a semiconductor devices according to some embodiments of the inventive concept.

DETAILED DESCRIPTION

Figure 1A:
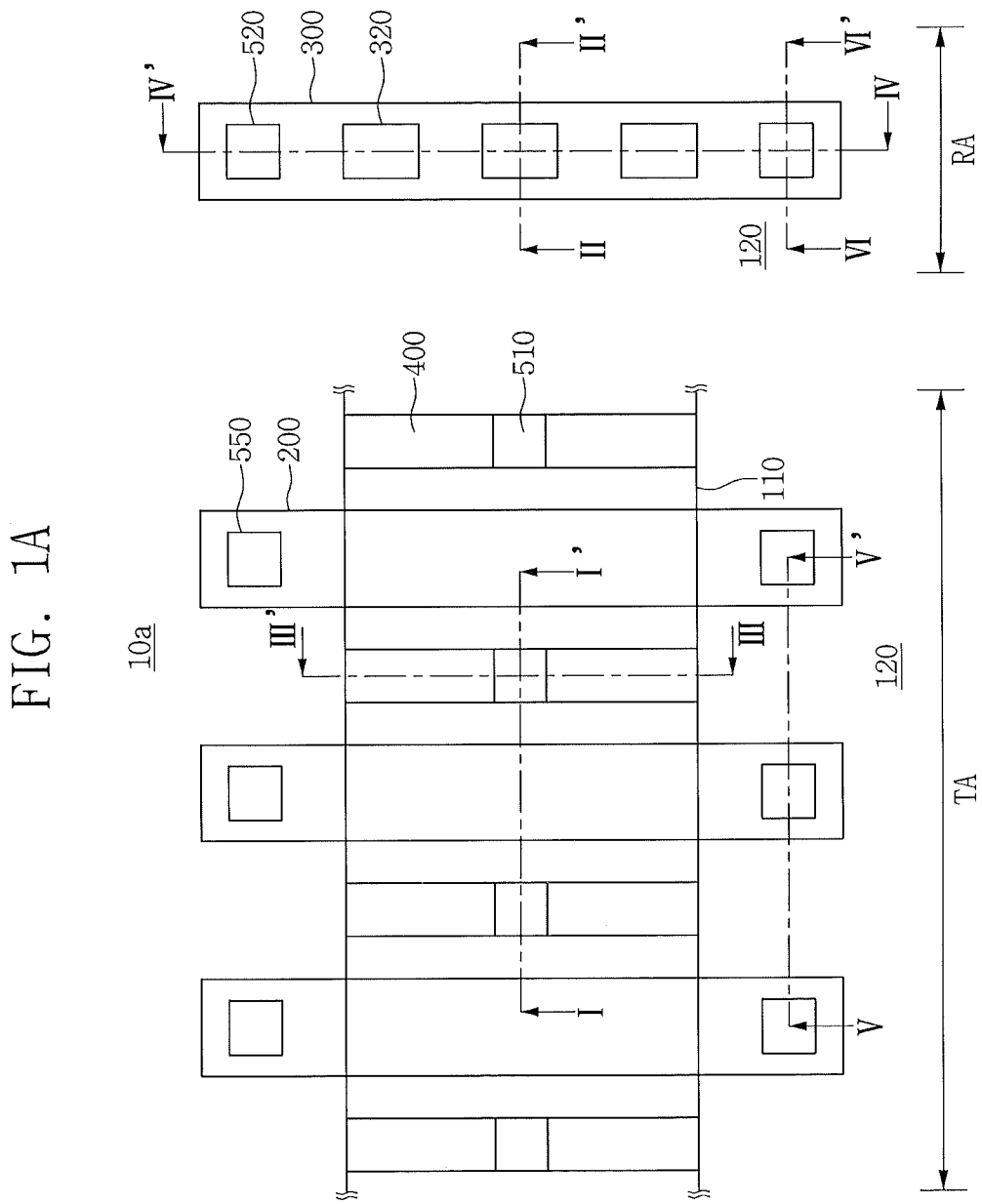
FIGS. 1A and 1B are layouts of semiconductor devices according to some embodiments of the inventive concept.

Embodiments of the inventive concept are described below in sufficient detail to enable those of ordinary skill in the art to embody and practice the inventive concept. It is important to understand that the inventive concept may be embodied in many alternate forms and should not be construed as limited to the embodiments set forth herein.

The terminology used herein to describe embodiments of the inventive concept is not intended to limit the scope of the inventive concept. The articles "a," "an," and "the" are singular in that they have a single referent, however the use of the singular form in the present document should not preclude the presence of more than one referent. In other words, elements of the inventive concept referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.). Like numbers refer to like elements throughout. As used herein, the term "and/or" includes any and all combinations of one or more of the associated listed items.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments of the inventive concept are described herein with reference to plan and cross-section illustrations that are schematic illustrations of idealized embodiments of the inventive concept. As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing. Thus, the regions illustrated in the figures are conceptual in nature and their shapes are not intended to illustrate the precise shape of a region of a device and are not intended to limit the scope of the inventive concept.

Like numbers refer to like elements throughout. Thus, the same or similar numbers may be described with reference to other drawings even if they are neither mentioned nor described in the corresponding drawing. Also, even elements that are not denoted by reference numbers may be described with reference to other drawings.

It will be understood that although the terms first, second, etc. may be used herein to describe various elements, these elements should not be limited by these terms. These terms are only used to distinguish one element from another. Thus, a first element could be termed a second element without departing from the teachings of the present embodiments.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As appreciated by the present inventors, forming resistors, which are disposed at a level different from gate patterns and include a material different from the gate patterns, may increase a number of processes for forming a semiconductor device because the resistors and the gate patterns may be formed separately. Various embodiments of the present inventive concepts, however, provide methods of forming the resistors and the gate patterns concurrently using same processes and thus may not increases the number of processes for forming a semiconductor device.

Figure 1B:
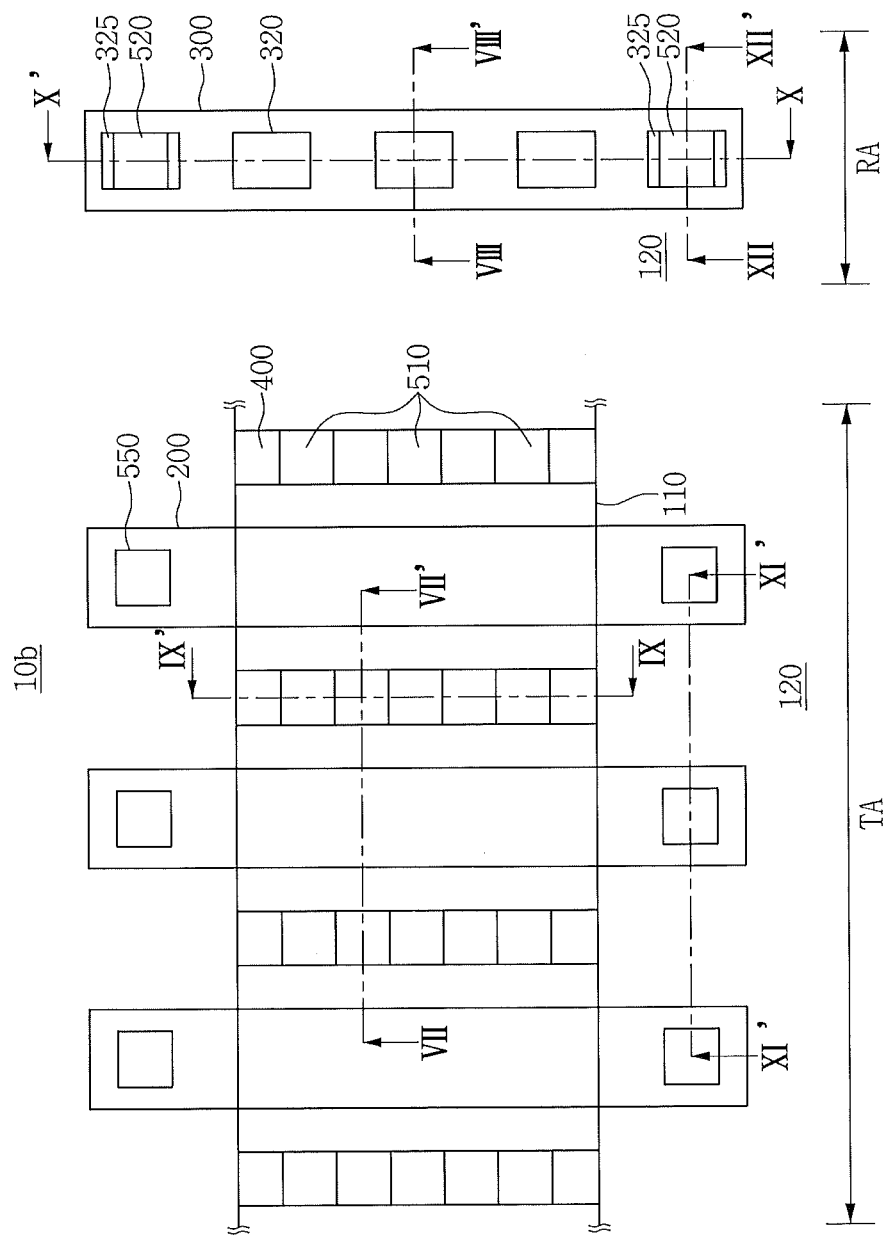
Figure 2A:
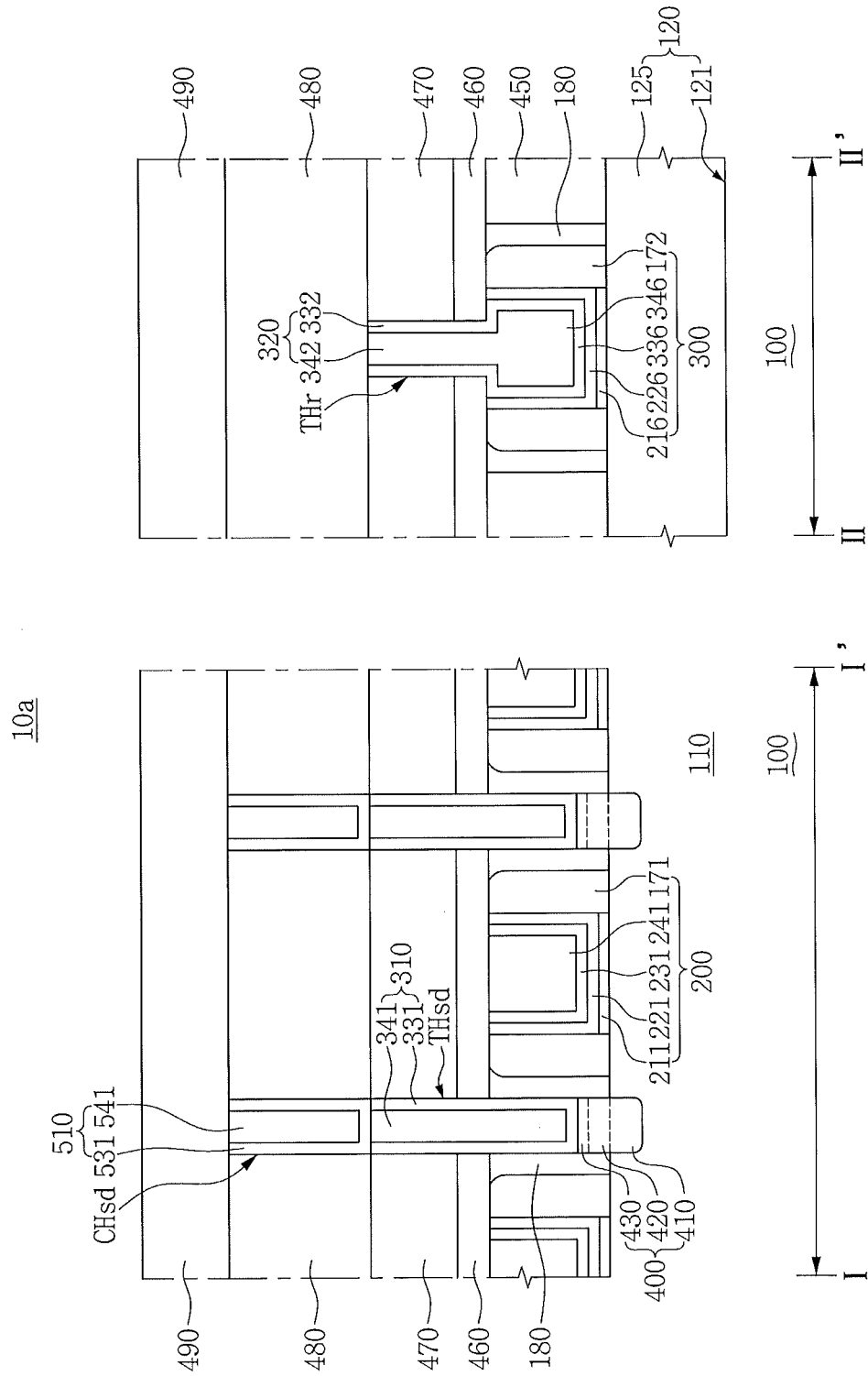
Figure 2C:
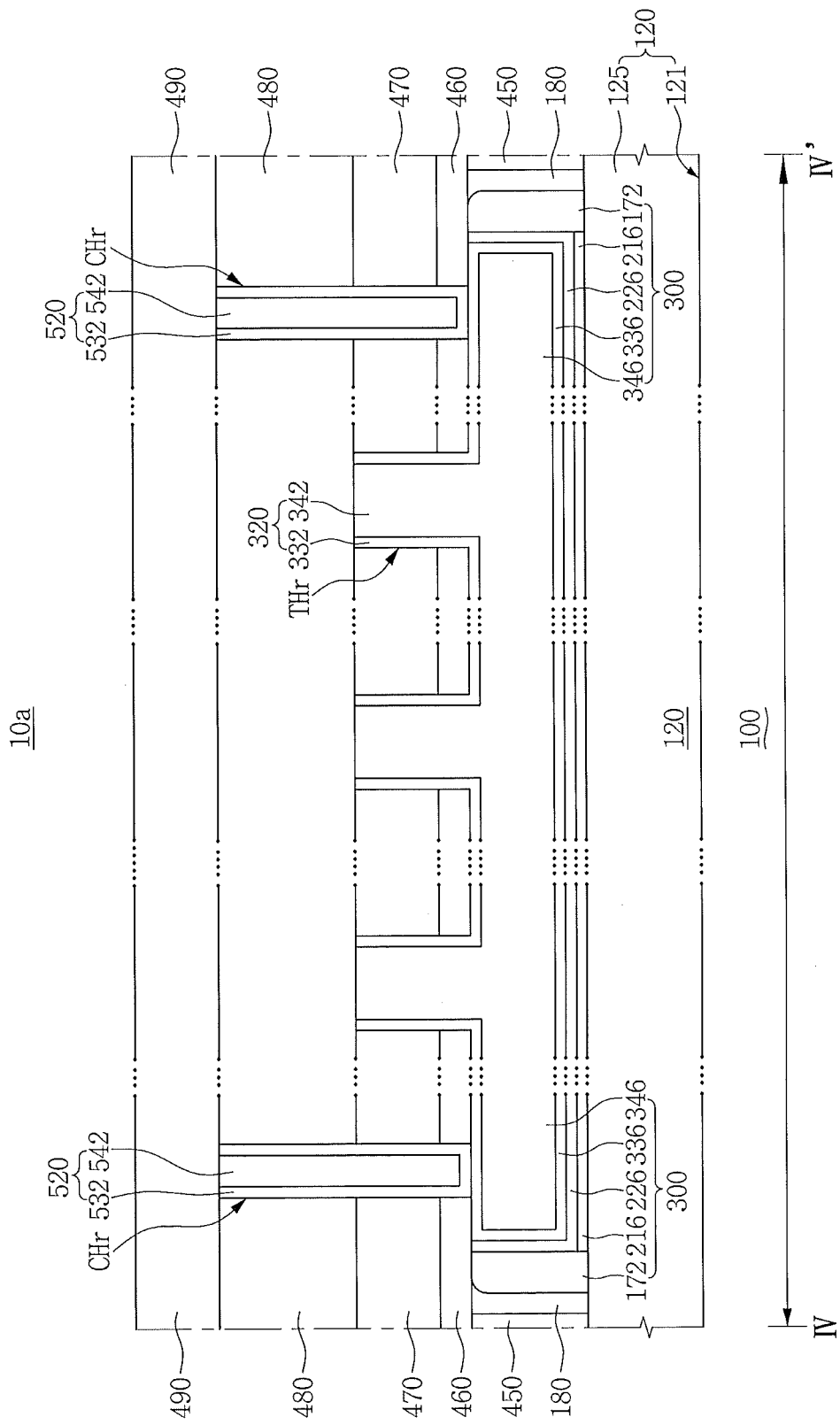
Figure 2D:
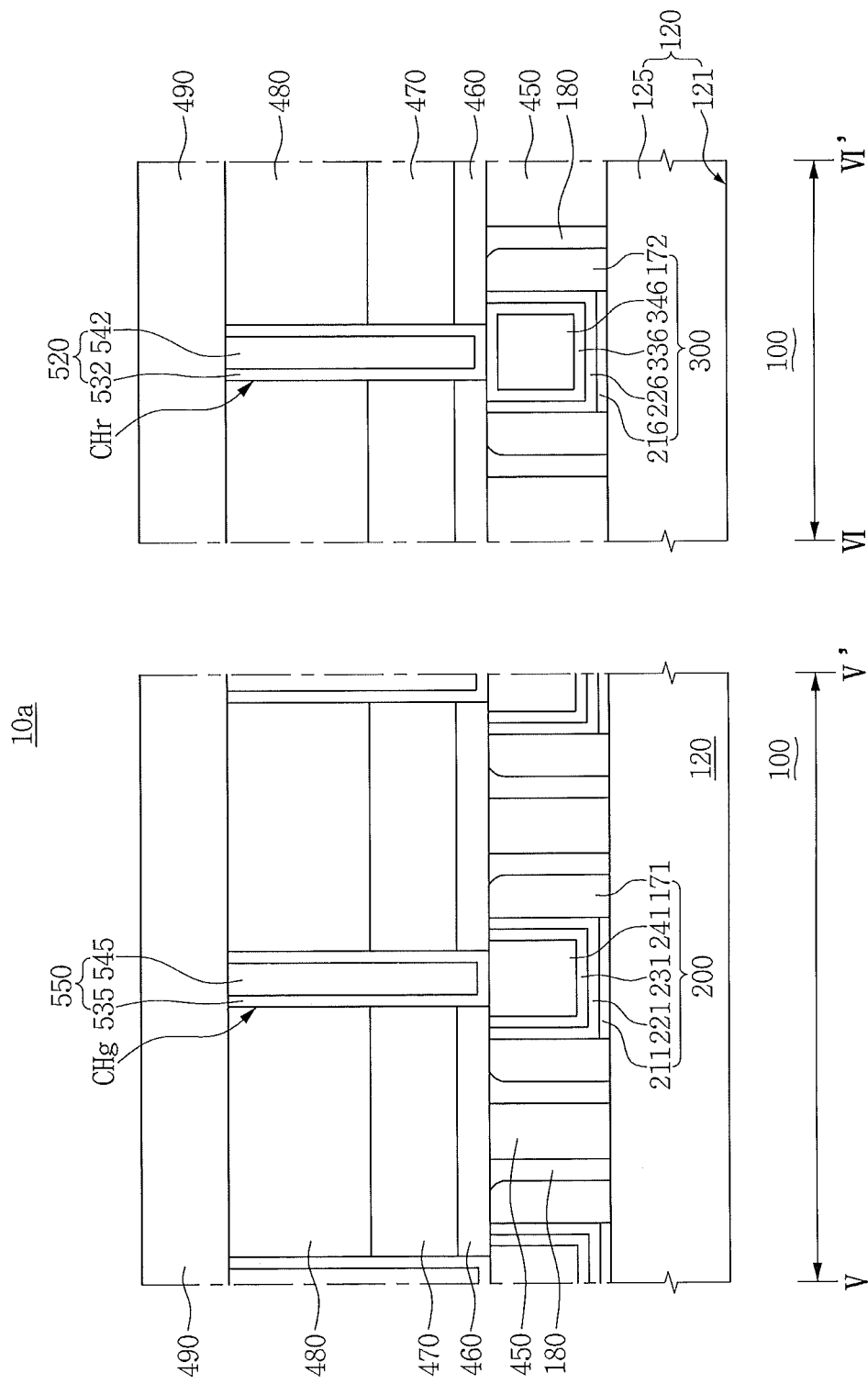
Figure 3A:
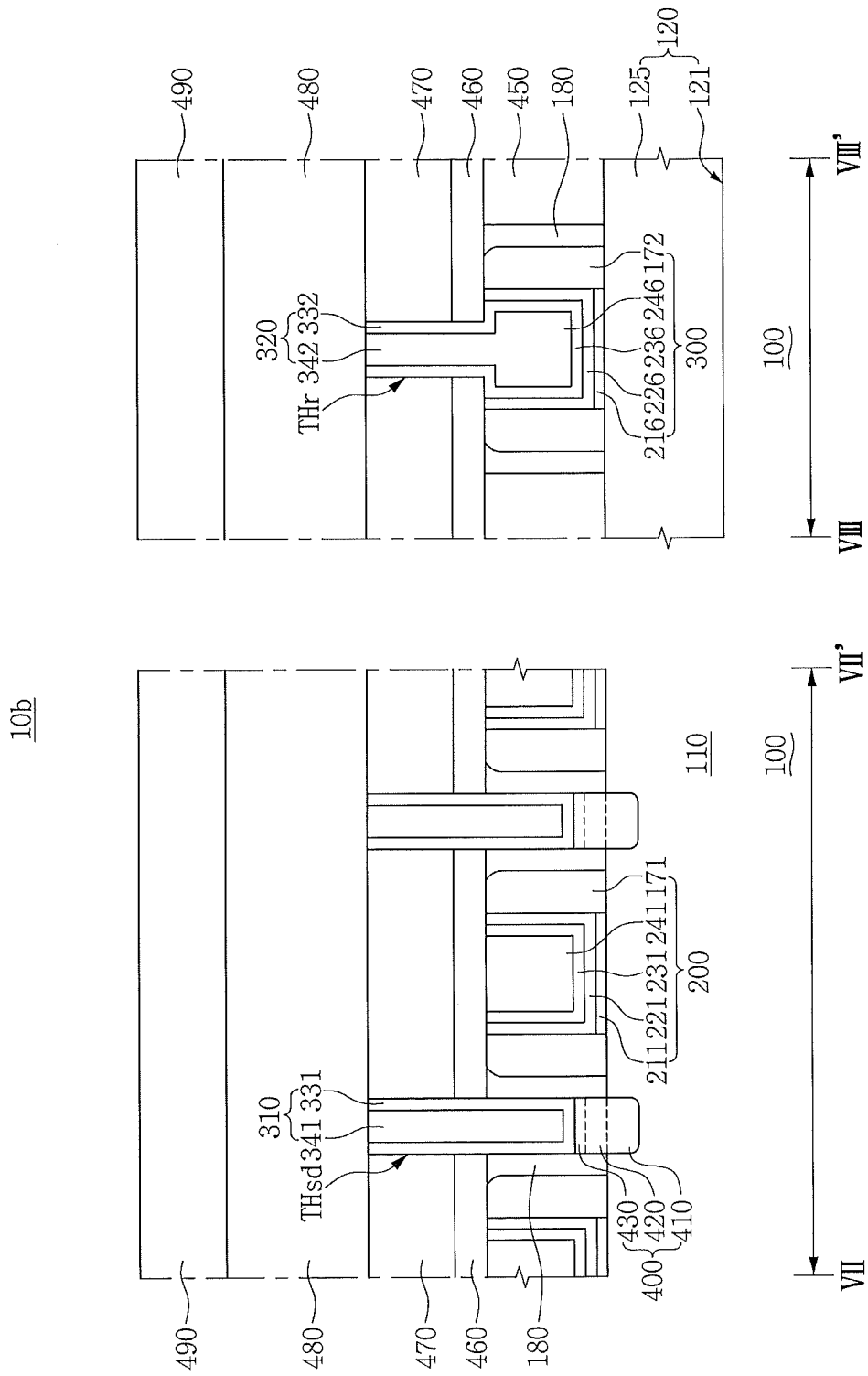
FIGS. 3A through 3D are cross-sectional views of a semiconductor devices according to some embodiments of the inventive concept.
Figure 3B:
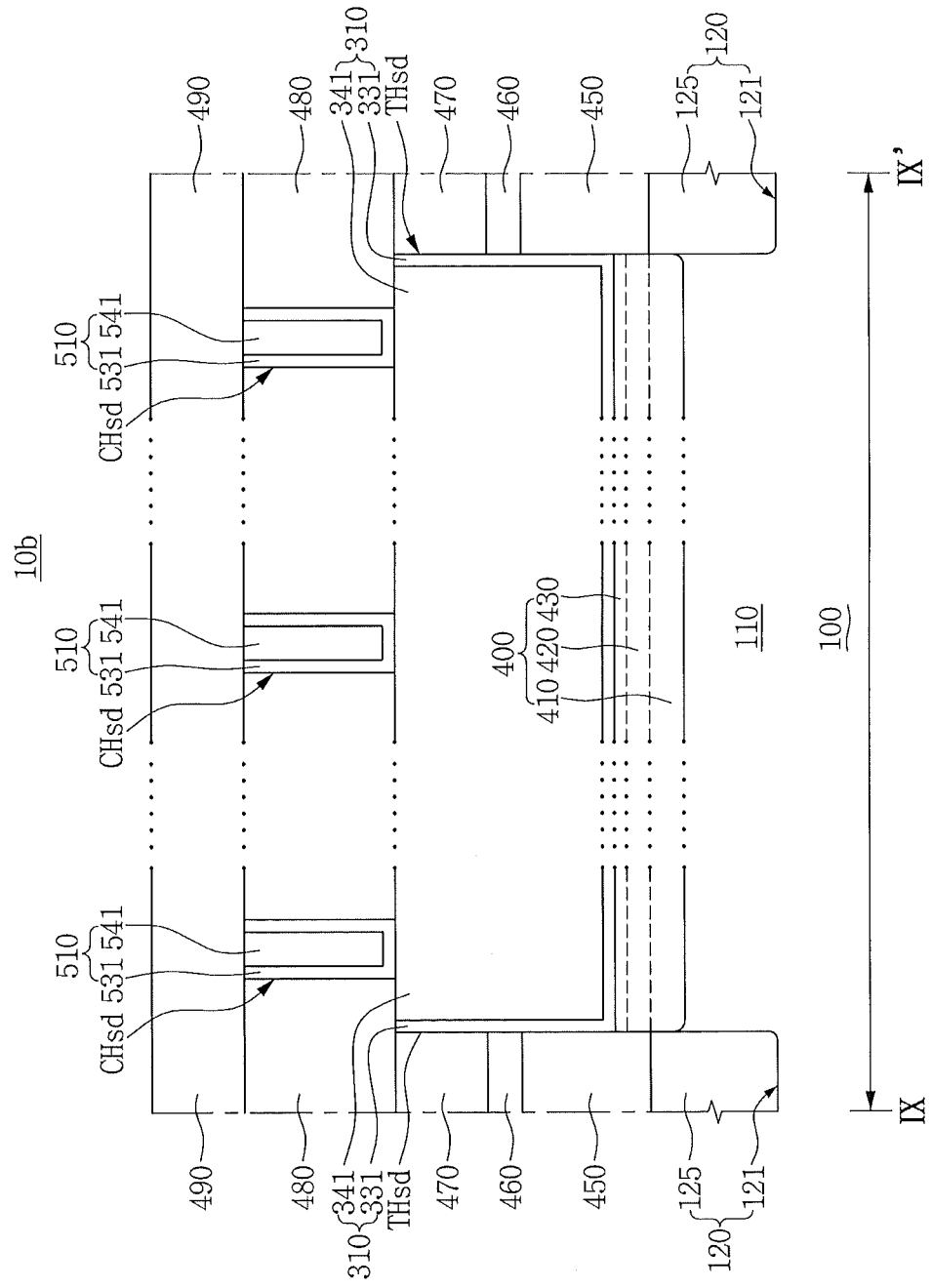
Figure 3C:
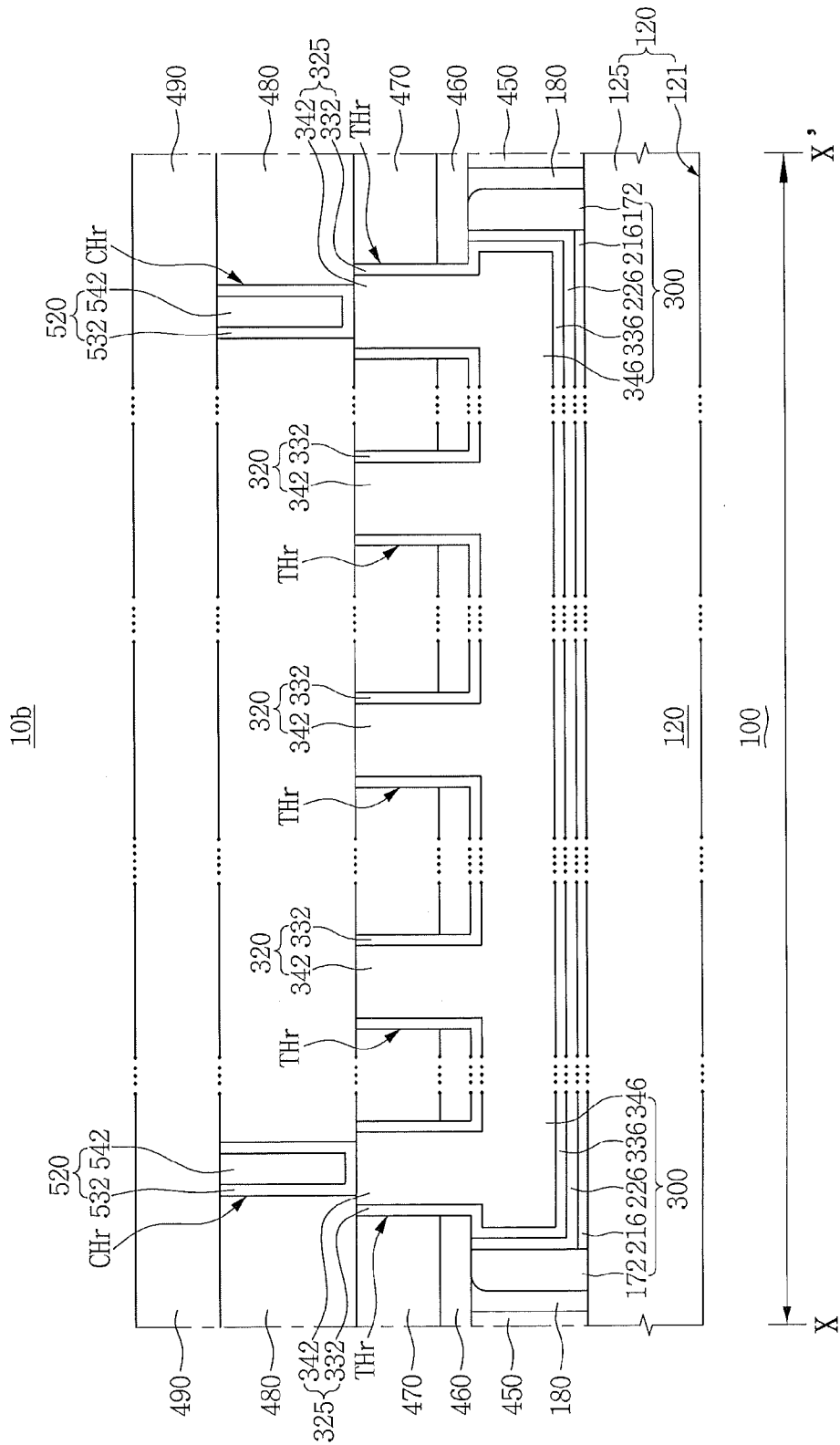
Figure 3D:
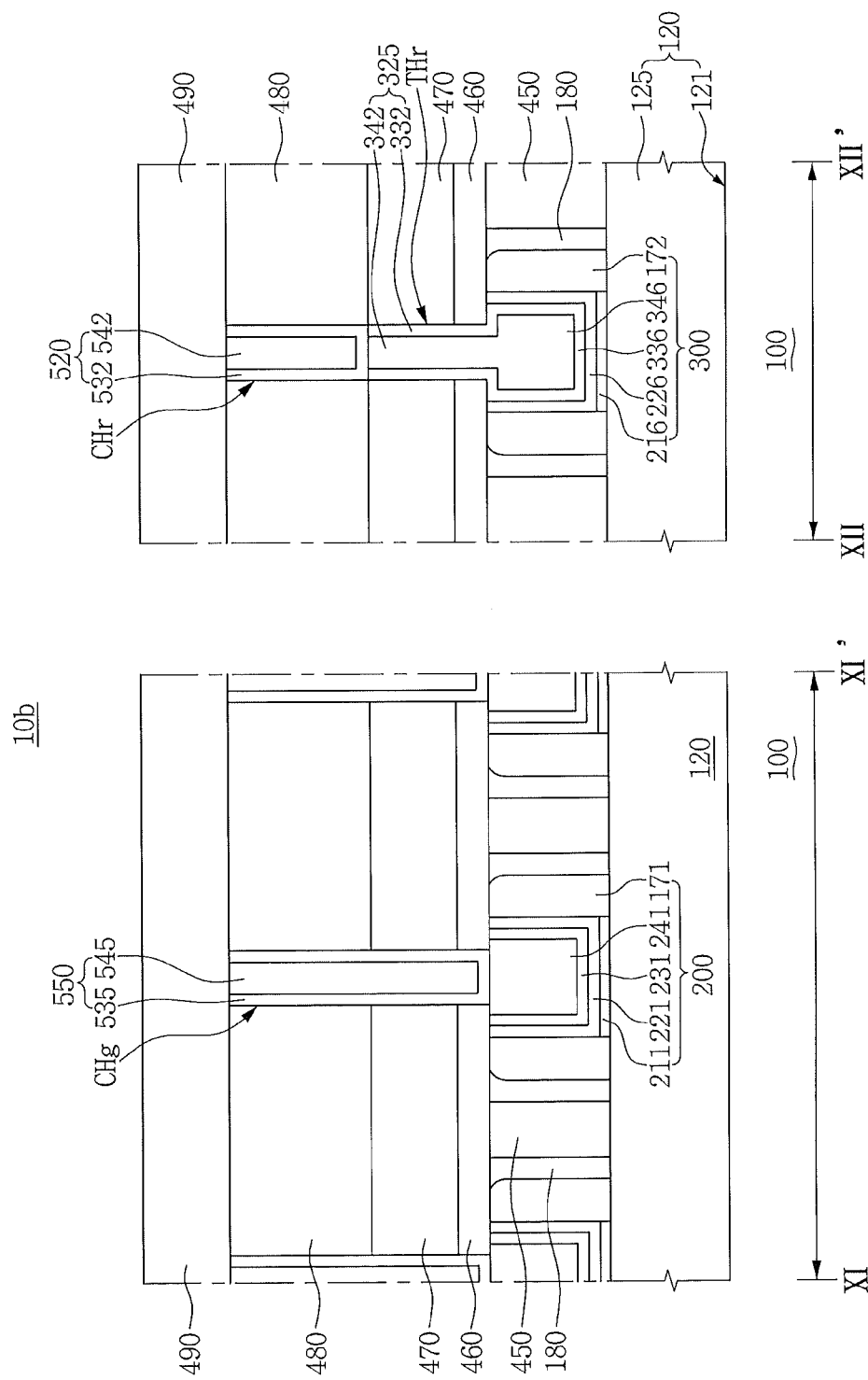

FIGS. 1A and 1B are layouts of semiconductor devices according to some embodiments of the inventive concept. Referring to FIGS. 1A and 1B, each of the semiconductor devices 10a and 10b according to some embodiments of the inventive concept may include a transistor area TA and a resistor area RA. The transistor area TA may include an active region 110 and a field region 120, and may further include a gate structure 200, a gate contact plug 550, a source/drain region 400, and a source/drain contact plug 510 disposed on the active region 110. The gate structure 200 may run across the active region 110 and extend onto the field region 120. The gate contact plug 550 may be disposed on the gate structure which extends onto the field region 120. The source/drain region 400 may be confined within the active region 110 parallel to the gate structure 200. The source/drain contact plug 510 may overlap the source/drain region 400. The resistor area RA may include a resistor structure 300, a resistor trench plug 320, and a resistor contact plug 520 disposed on the field region 120. The resistor trench plug 320 and the resistor contact plug 520 may overlap the resistor structure 300.

The semiconductor device 10b may include a plurality of source/drain plugs 510 overlapping one source/drain region 400, and may include resistive trench plugs 325 overlapping resistive contact plugs 520. At least one of the resistive trench plugs 320 and 325 may overlap at least one of the resistive contact plugs 520.

FIGS. 2A through 2D are cross-sectional views of a semiconductor devices according to some embodiments of the inventive concept. For example, FIGS. 2A through 2D are cross-sectional views taken along the lines I-I', II-II', III-III', IV-IV', V-V', and VI-VI' of FIG. 1A respectively.

Referring to FIGS. 1A and 2A through 2D, the semiconductor device 10a may include the gate structure 200 disposed on the active region 110 of the substrate 100, and the resistor structure 300 disposed on the field region 120 of the substrate 100. The semiconductor device 10a may further include the source/drain region 400, a source/drain trench plug 310, and the source/drain contact plug 510. The semiconductor device 10a may further include the resistive trench plug 320 and the resistive contact plug 520.

The field region 120 may include a field trench 121 formed in the substrate 100, and a field insulating material 125 filling the field trench 121. The field insulating material 125 may include silicon oxide.

The gate structure 200 may include a gate surface insulating layer 211, a gate insulating layer 221, a gate barrier layer 231, and a gate electrode 241. The gate structure 200 may further include gate spacers 171.

The gate surface insulating layer 211 may be formed directly on the surface of the substrate 100 and may extend on the surface of the substrate 100. The gate surface insulating layer 211 may include oxidized silicon or deposited silicon oxide.

The gate insulating layer 221 may be formed on the gate surface insulating layer 211. The gate insulating layer 221 may have a U shape and may surround the gate barrier layer 231. The gate insulating layer 221 may include a metal oxide, such as hafnium oxide (HfO), lanthanum oxide (LaO), or aluminum oxide (AlO).

The gate barrier layer 231 may have in a U shape and may surround the gate electrode 241. The gate barrier layer 231 may include titanium (Ti), titanium nitride (TiN), tantalum (Ta), tantalum nitride (TaN), titanium tungsten (TiW), or one of other barrier metals.

The gate electrode 241 may include a metal (e.g., aluminum (Al), tungsten (W), copper (Cu), nickel (Ni), cobalt (Co), titanium (Ti), or tantalum (Ta)), a metal alloy, and/or a metal compound (e.g., a metal nitride). For instance, the gate electrode 241 may include aluminum, an aluminum alloy, or an aluminum compound.

The gate spacers 171 may be formed on sidewalls of the gate surface insulating layer 211 and the gate insulating layer 221. The gate spacers 171 may be in contact with the surface of the substrate 100. The gate spacers 171 may include a single layer formed of silicon oxide or silicon nitride, or a double layer formed of a combination thereof.

The gate structure 200 may have a planar top surface. For example, top surfaces of the gate insulating layer 221, the gate barrier layer 231, the gate electrode 241, and/or the gate spacers 171 may be disposed at the same level.

The resistor structure 300 may include a resistive insulating layer 226, a resistive barrier layer 336, and a resistive electrode 346. The resistor structure 300 may further include resistive spacers 172. The resistor structure 300 may further include a resistive surface insulating layer 216.

The resistive surface insulating layer 216 may horizontally extend onto the surface of the field region 120. The resistive surface insulating layer 216 may include deposited silicon oxide. In some embodiments, the resistive surface insulating layer 216 may be omitted.

The resistive insulating layer 226 may be formed directly on the resistive surface insulating layer 216 or on the active region 120. The resistive insulating layer 226 may have a U shape and may surround the resistive barrier layer 336. The resistive insulating layer 236 may include a metal oxide, such as hafnium oxide, lanthanum oxide, or aluminum oxide.

The resistive barrier layer 336 may have a U shape or a square shape and may surround the resistive electrode 346.

The resistive barrier layer 336 may include titanium, titanium nitride, tantalum, tantalum nitride, titanium tungsten, or one of other barrier metals.

The resistive electrode 346 may include a metal (e.g., aluminum, tungsten, copper, nickel, cobalt, titanium, or tantalum), a metal alloy, a metal silicide, and/or a metal nitride. For instance, the resistive electrode 346 may include tungsten or tungsten silicide.

The resistor spacers 172 may be formed on sidewalls of the resistive surface insulating layer 216 and the resistive insulating layer 226. The resistor spacers 172 may be in contact with the surface of the field region 120. The resistor spacers 172 may include a single layer formed of silicon oxide or silicon nitride, or a double layer formed of a combination thereof.

The resistor structure 300 may have a planar top surface. For example, top surfaces of the resistive insulating layer 226, the resistive barrier layer 336, the resistive electrode 346, and/or the resistive spacers 172 may be disposed at the same level.

The top surfaces of the gate structure 200 and the resistor structure 300 may be disposed at the same level. For example, the top surfaces of the gate insulating layer 221, the gate barrier layer 231, the gate electrode 241, the gate spacers 171, the resistive insulating layer 226, the resistive barrier layer 336, the resistive electrode 346, and/or the resistive spacers 172 may be disposed at the same level.

A covering layer 180 may be conformally formed on outer surfaces of the gate spacers 171 and the resistive spacers 172. The covering layer 180 may be in contact with the surface of the substrate 100 and the surface of the field region 120. A top surface of the covering layer 180 may also be at the same level as the top surfaces of the gate structure 200 and the resistor structure 300. The covering layer 180 may include silicon oxide.

The source/drain region 400 may be formed in the substrate 100 between gate structures 200. The source/drain region 400 may include a lower source/drain region 410 formed in the substrate 100, and an upper source/drain region 420 formed on the lower source/drain region 410. The source/drain region 400 may further include a silicide region 430 formed in the upper source/drain region 420. The source/drain region 400 may include a Group III or V element, such as phosphorus (P), arsenic (As), or boron (B). The upper source/drain region 420 may include single crystalline silicon obtained using an epitaxial growth process. The silicide region 430 may include a metal silicide containing nickel, tungsten, titanium, or cobalt.

The lower interlayer insulating layer 450 may be formed on the substrate 100 to cover an outer surface of the covering layer 180. A top surface of the lower interlayer insulating layer 450 may be disposed at the same level as the top surface of the gate structure 200. The lower interlayer insulating layer 450 may include silicon oxide.

A buffer interlayer insulating layer 460 may be formed on the lower interlayer insulating layer 450, the gate structure 200, and the resistor structure 300. A middle interlayer insulating layer 470 may be formed on the buffer interlayer insulating layer 460. An upper interlayer insulating layer 480 may be formed on the middle interlayer insulating layer 470. The lower interlayer insulating layer 450 may include silicon oxide. The buffer interlayer insulating layer 460 may include carbon(C)-containing silicon oxide. The lower interlayer insulating layer 450 and the buffer interlayer insulating layer 460 may be formed using a process and may be contiguous with each other. The upper interlayer insulating layer 480 may include silicon oxide.

The source/drain trench plug 310 may vertically penetrate the middle interlayer insulating layer 470 and the buffer interlayer insulating layer 460, and be electrically connected to and/or in contact with the upper source/drain region 420. The source/drain trench plug 310 may include a source/drain trench barrier layer 331 and a source/drain trench electrode 341. The source/drain trench barrier layer 331 may be conformally formed on inner walls of a source/drain trench hole THsd and on the upper source/drain region 420 or the silicide region 430. The source/drain trench electrode 341 may fill the source/drain trench hole THsd. The source/drain trench barrier layer 331 may include titanium, titanium nitride, tantalum, tantalum nitride, titanium tungsten, or one of other barrier metals. The source/drain trench electrode 341 may include a metal, such as aluminum, tungsten, copper, nickel, cobalt, titanium, or tantalum, and/or a metal compound, such as a metal nitride.

The resistive trench plug 320 may vertically penetrate the middle interlayer insulating layer 470 and the buffer interlayer insulating layer 460, and be electrically connected to and in contact with the resistive electrode 346. The resistive trench plug 320 may include a resistive trench barrier layer 332 and a resistive trench electrode 342. The resistive trench barrier layer 332 may be conformally formed on inner walls of a resistive trench hole THr and on the resistive electrode 346. The resistive trench electrode 342 may fill the resistive trench hole THr. The resistive trench barrier layer 332 may include titanium, titanium nitride, tantalum, tantalum nitride, titanium tungsten (TiW), or one of other barrier metals. The resistive trench electrode 342 may include a metal, such as aluminum, tungsten, copper, nickel, cobalt, titanium, or tantalum, and/or a metal compound, such as a metal nitride. The resistive trench barrier layer 332 and the resistive barrier layer 336 may be formed concurrently and may be contiguous with each other. The resistive trench electrode 342 and the resistive electrode 346 may be formed as a unitary type and materially in continuity with each other.

The source/drain contact plug 510 may vertically penetrate the upper interlayer insulating layer 480 and may be in contact with the source/drain trench plug 310 to be aligned with and electrically connected to the source/drain trench plug 310. The source/drain contact plug 510 may include a source/drain contact barrier layer 531 and a source/drain contact electrode 541. The source/drain contact barrier layer 531 may be conformally formed on inner walls of a source/drain contact hole CHsd and on the source/drain trench plug 310. The source/drain contact plug 541 may fill the source/drain contact hole CHsd. The source/drain contact barrier layer 531 may include titanium, titanium nitride, tantalum, tantalum nitride, titanium tungsten, or one of other barrier metals. The source/drain contact electrode 541 may include a metal, such as aluminum, tungsten, copper, nickel, cobalt, titanium, or tantalum, and/or a metal compound, such as a metal nitride.

A resistive contact plug 520 may vertically penetrate the upper interlayer insulating layer 480, the middle interlayer insulating layer 470, and the buffer interlayer insulating layer 460, and may be electrically connected to and in contact with the resistor structure 300. The resistive contact plug 520 may be disposed on portions of the resistor structure 300 adjacent both ends of the resistor structure 300. The resistive contact plug 520 may include a resistive contact barrier layer 532 and a resistive contact electrode 542. The resistive contact barrier layer 532 may be conformally formed on inner walls of a resistive contact hole CHr and on the resistive barrier layer 336. The resistive contact barrier layer 532 may include titanium, titanium nitride, tantalum, tantalum nitride, titanium tungsten, or one of other barrier metals. The resistive contact electrode 542 may include a metal, such as aluminum, tungsten, copper, nickel, cobalt, titanium, or tantalum, and/or a metal compound, such as a metal nitride.

A capping insulating layer 490 may be further formed on the upper interlayer insulating layer 480 to cover the source/drain contact plug 510 and the resistive contact plug 520. The capping insulating layer 490 may include silicon oxide, carbon-containing silicon oxide, silicon nitride, or other insulating material.

FIGS. 3A through 3D are cross-sectional views of a semiconductor devices according to some embodiments of the inventive concept. For example, FIGS. 3A through 3D are cross-sectional views taken along the lines VII-VII', VIII-VIII', IX-IX', X-X', XI-XI', and XII-XII' of FIG. 1B respectively.

Referring to FIGS. 1B and 3A through 3D, the semiconductor device 10b may include a plurality of source/drain contact plugs 510 formed on one source/drain trench plug 310. The semiconductor device 10b may include a resistive contact plug 520 formed on the resistive trench plug 320. A resistive contact barrier layer 532 of the resistive contact plug 520 may be in direct contact with and electrically connected to a resistive trench electrode 342 of the resistive trench plug 320.

Each of the semiconductor devices 10a and 10b may include a resistive structure 300 including a metal, a metal silicide, or a metal compound. Accordingly, since the resistive structure 300 may have a low resistance, the resistive structure 300 may be formed to have a fine size. Each of the semiconductor devices 10a and 10b may include the resistive structure 300 having the same shape as or a similar shape to the gate structure 200. Accordingly, the resistive structure 300 may be formed using the process of forming the gate structure 200, and thus may have a fine size and desired resistance like the gate structure 200.

FIGS. 4 through 24D 4-16, 17A-17C, 18A-18C, 19A-19C, 20A-20C, 21A-21D, 22A-22D, 23A-23D and 24A-24D are cross-sectional views taken along the lines of FIG. 1A illustrating intermediate structures provided in operations of forming a semiconductor device according to some embodiments of the present inventive concept. For example, FIGS. 4 through 16, 17A, 18A, 19A, 20A, 21A, 22A, 23A and 24A are cross-sectional views taken along the lines I-I' and II-II' of FIG. 1A, FIGS. 17B, 18B, 19B, 20B, 21B, 22B, 23B and 24B are cross-sectional views taken along the line III-III' of FIG. 1A, FIGS. 17C, 18C, 19C, 20C, 21C, 22C, 23C and 24C cross-sectional views taken along the line IV-IV' of FIG. 1A, and FIGS. 21D, 22D, 23D and 24D cross-sectional views taken along the lines V-V' and VI-VI' of FIG. 1A.

Figure 4:
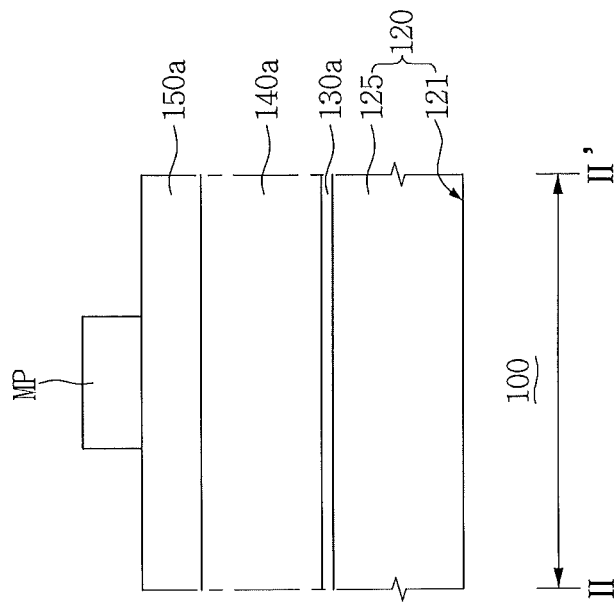
FIGS. 4-16, 17A-17C, 18A-18C, 19A-19C, 20A-20C, 21A-21D, 22A-22D, 23A-23D and 24A-24D are cross-sectional views taken along the lines of FIG. 1A illustrating intermediate structures provided in operations of forming a semiconductor device according to some embodiments of the present inventive concept.
Figure 4:
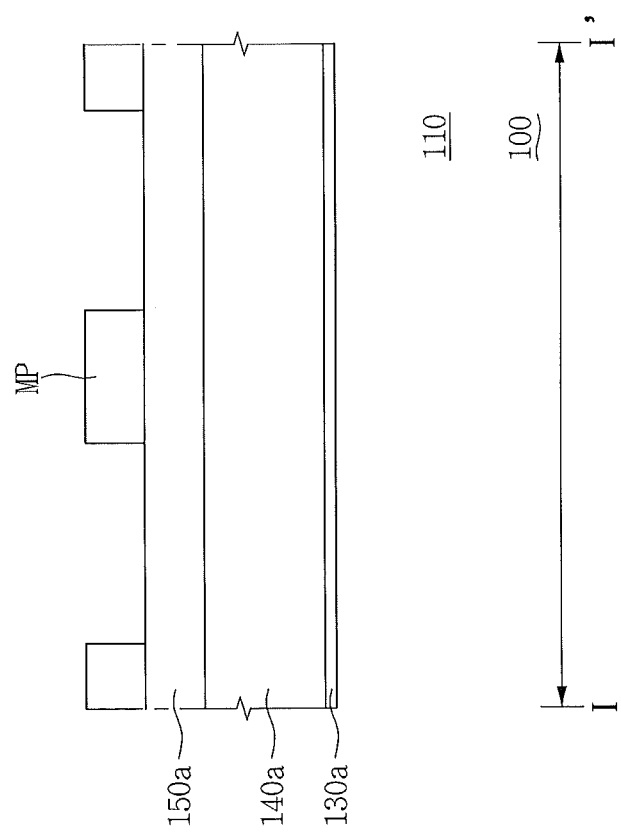

Referring to FIG. 4, the method of manufacturing a semiconductor device according to some embodiments may include forming a field region 120 in a substrate 100 to define an active region 110, forming a buffer insulating layer 130a on the active region 110 and the field region 120 of the substrate 100, forming a sacrificial layer 140a on the buffer insulating layer 130a, forming a hard mask layer 150a on the sacrificial layer 140a, and forming a mask pattern Mp on the hard mask layer 150a. The substrate 100 may include a bulk silicon wafer or a silicon-on-insulator (SOI) substrate. Forming the field region 120 may include forming a field trench 121 in the substrate 100, filling the field trench 121 with a field insulating material 125, and performing a planarization process, such as a chemical mechanical polishing (CMP) process, until an upper surface of the active region 110 of the substrate 100 becomes the same level as or a similar level to an upper surface of the field region 120. The field insulating material 125 may include silicon oxide, such as undoped silicate glass (USG) or tonen silazane (TOSZ). Forming the buffer insulating layer 130a may include forming a silicon oxide layer by performing a deposition process, such as an atomic layer deposition (ALD) process or a molecular layer deposition (MLD) process, on the active region 110 and the field region 120 of the substrate 100. Forming the sacrificial layer 140a may include forming a polysilicon (poly-Si) layer using a low-pressure chemical vapor deposition (LP-CVD) process. The forming the hard mask layer 150a may include forming a silicon nitride layer using a CVD process. The forming the mask pattern Mp may include forming a photoresist pattern using a photolithography process.

Figure 5:
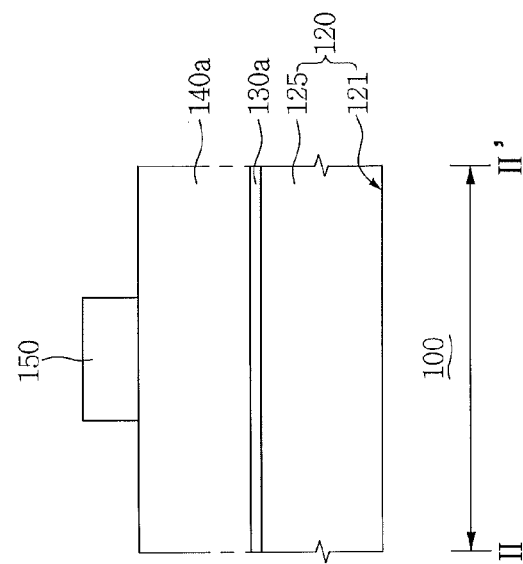
Figure 5:
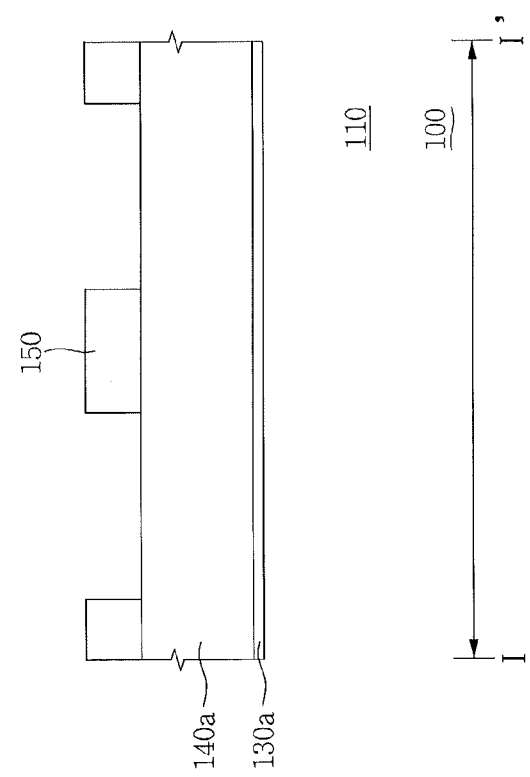

Referring to FIG. 5, the method may include etching the hard mask layer 150a using the mask pattern Mp as an etch mask to form a hard mask pattern 150. After that, the mask pattern Mp may be removed.

Figure 6:
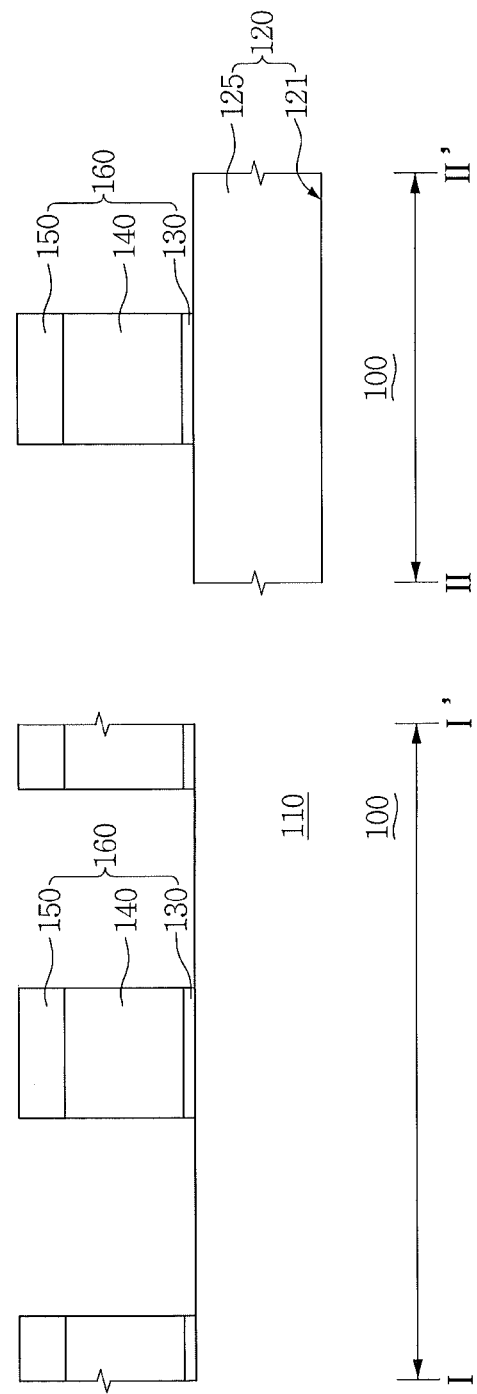

Referring to FIG. 6, the method may include etching the sacrificial layer 140a and the buffer insulating layer 130a using the hard mask pattern 150 as an etch mask to form first preliminary structures 160. Each of the first preliminary structures 160 may include a buffer insulating pattern 130, a sacrificial pattern 140, and a hard mask pattern 150 stacked sequentially. During forming the first preliminary structures 160, the hard mask pattern 150 may be thinned out.

Figure 7:
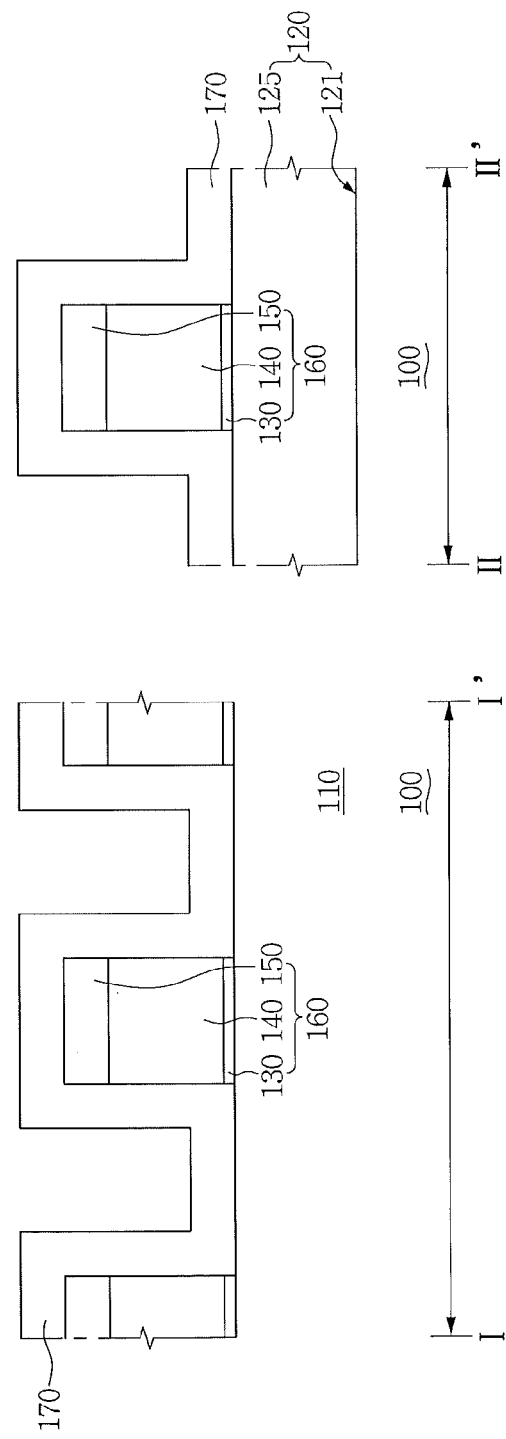

Referring to FIG. 7, the method may include forming a spacer layer 170 on the first preliminary structures 160. The spacer layer 170 may be conformally formed on surfaces of the first preliminary structures 160 and the surfaces of the active region 110 and the field region 120. The spacer layer 170 may include silicon oxide, silicon nitride, or combination thereof. For example, silicon oxide may be formed directly on the surfaces of the first preliminary structures 160, and silicon nitride layer may be formed on the silicon oxide. For brevity, it is assumed that the spacer layer 170 is a single layer including silicon nitride.

Figure 8:
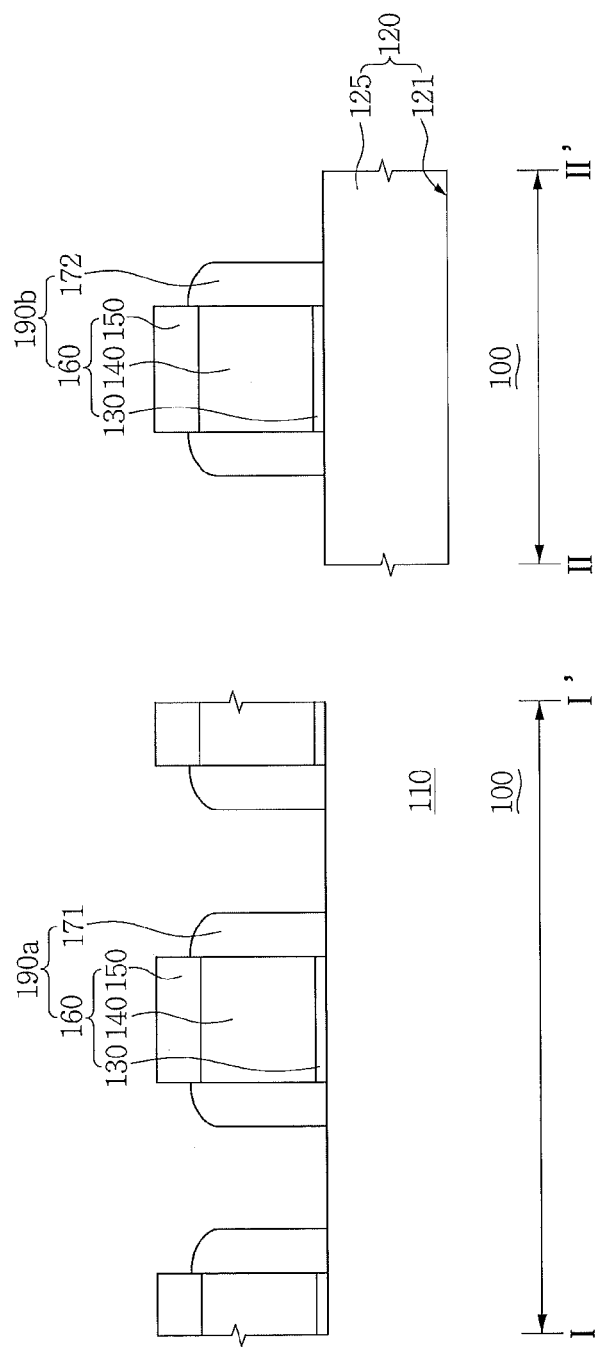

Referring to FIG. 8, the method may include performing a blanket etch process on the spacer layer 170 using an etch-back process to form second preliminary structures 190a and 190b. The second preliminary structures 190a and 190b may include first preliminary structures 160 formed on the active region 110 and the field region 120 of the substrate 100, and spacers 171 and 172 respectively formed on the active region 110 and the field region 120 of the substrate 100. For example, the second preliminary structures 190a and 190b may include a second preliminary structure 190a for gates, which may include a first preliminary structure 160 and gate spacers 171, and a second preliminary structure 190b for resistors, which may include another first preliminary structure 160 and resistive spacers 172.

Figure 9:
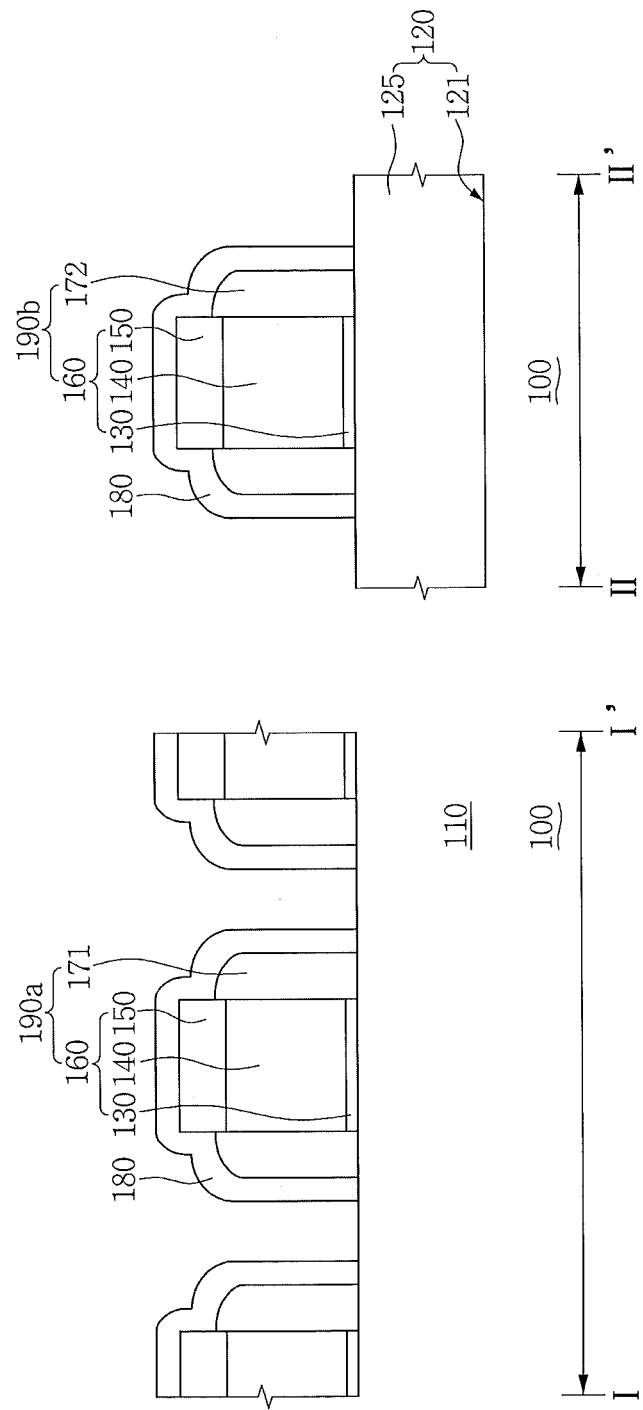

Referring to FIG. 9, the method may include forming a covering layer 180 to cover the second preliminary structures 190a and 190b. A portion of the surface of the active region 110 of the substrate 100 may not be covered by the covering layer 180 and may be exposed by the covering layer 180. Forming the covering layer 180 may include conformally forming silicon oxide using a deposition process, such as an atomic layer deposition (ALD) process. The surface of the active region 110 of the substrate 100 may be exposed using a photolithography process or an etchback process. In FIG. 9, it is assumed that an etchback process is performed.

Figure 10:
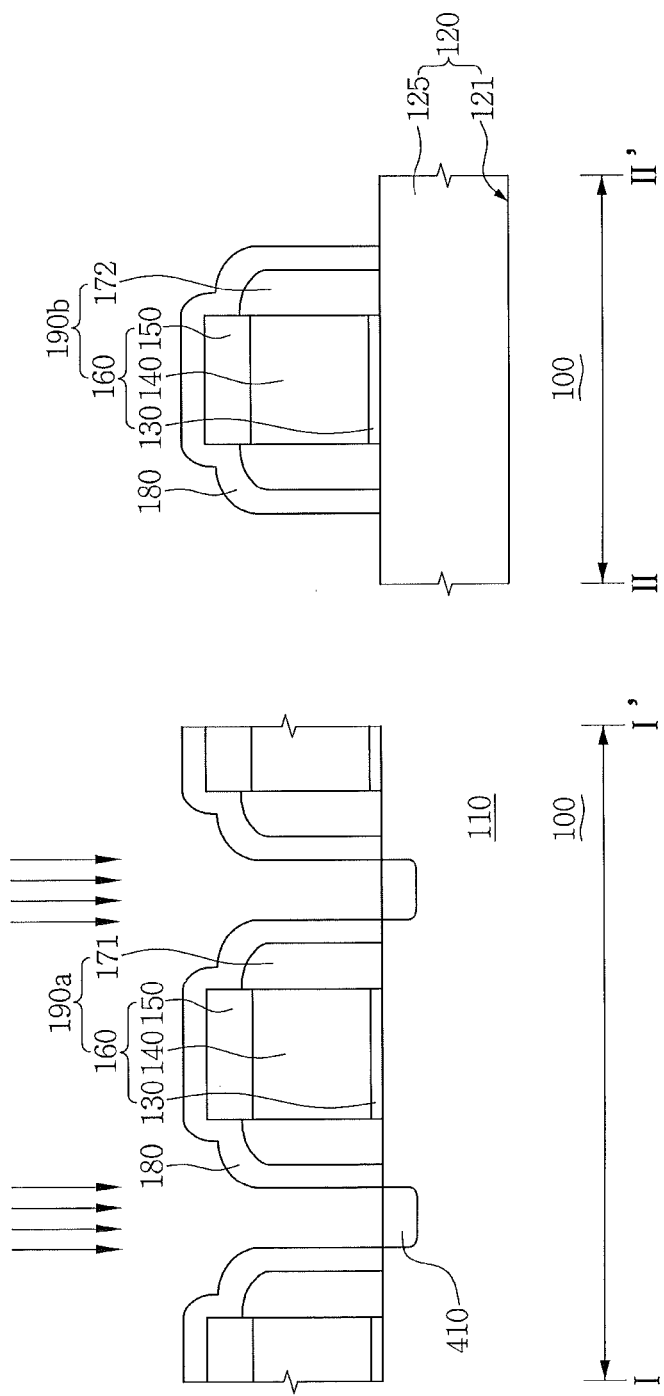

Referring to FIG. 10, the method may include implanting impurities into the exposed active region 110 of the substrate 100 to form lower source/drain regions 410 in the active region 110 at both sides of the second preliminary structure 190a for gates. The implantation of the impurity atoms may include implanting Group III or V atoms (e.g., P, as, or B) into the active region 110 of the substrate 100 using an ion implantation process or an ion diffusion process.

Figure 11:
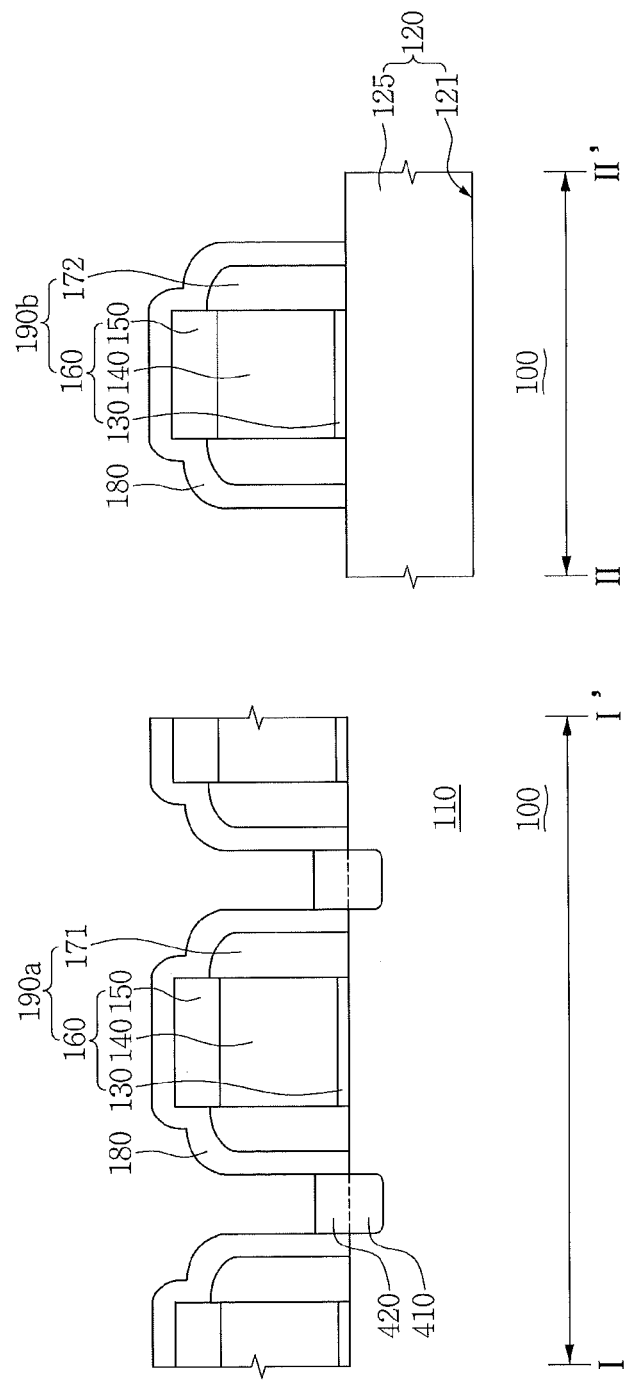

Referring to FIG. 11, the method may include forming upper source/drain regions 420 on the lower source/drain regions 410 using a selective epitaxial growth (SEG) process. For example, the upper source/drain regions 420 may include single crystalline silicon formed by an epitaxial growth process.

Figure 12:
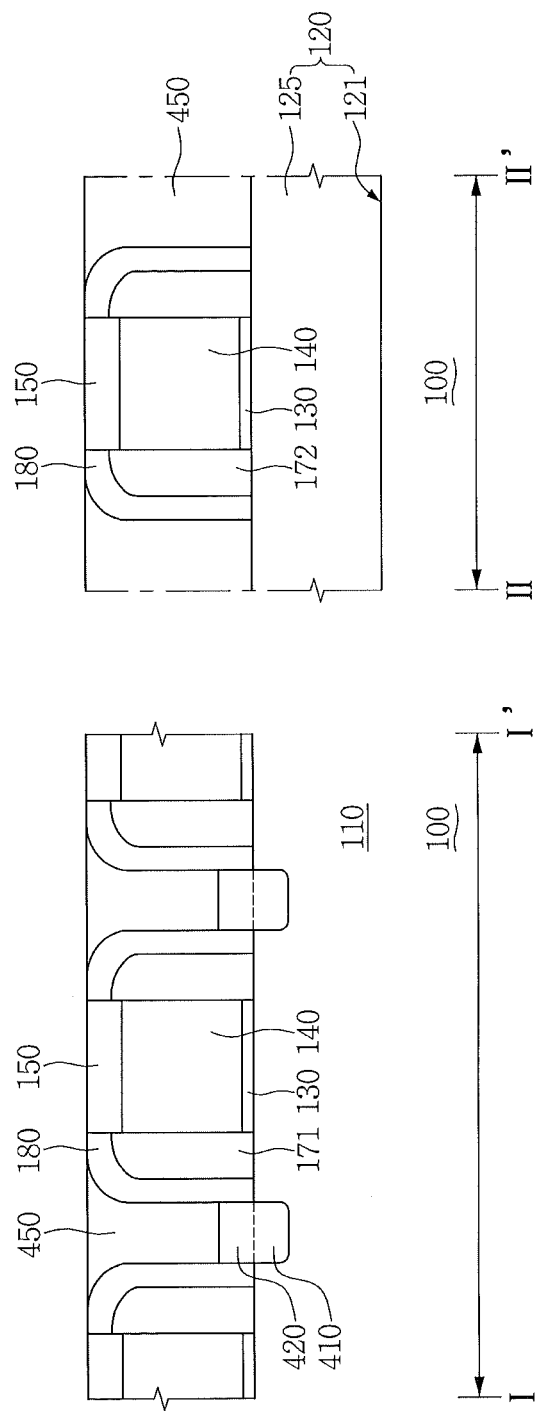

Referring to FIG. 12, the method may include forming a lower interlayer insulating layer 450 to cover the second preliminary structures 190a and 190b, the upper source/drain regions 420, and the covering layer 180. Forming the lower interlayer insulating layer 450 may include performing a CMP process to expose the hard mask pattern 150. Forming the lower interlayer insulating layer 450 may include forming silicon oxide using a deposition process or a coating process.

Figure 13:
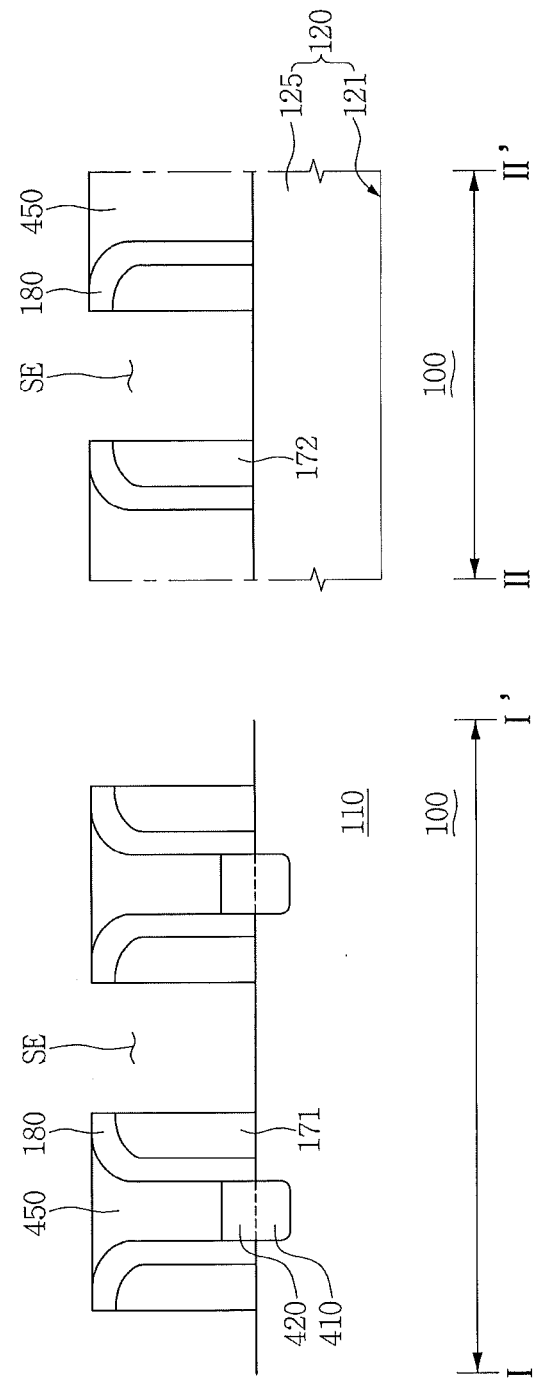

Referring to FIG. 13, the method may include removing the hard mask pattern 150, the sacrificial pattern 140, and the buffer insulating pattern 130 of the second preliminary structures 190a and 190b to form electrode spaces SE. The electrode spaces SE may be defined by the surface of the substrate 100, the gate spacers 171, and/or the covering layer 180, or the surface of the field region 120, the resistive spacers 172, and/or the covering layer 180. Removing the hard mask pattern 150 may include performing a dry etching process using a gas containing carbon (C) and fluorine (F), such as CF4, C2F6, C3F6, or C4F8, and/or a gas containing carbon, hydrogen (H), and fluorine, such as CHF3, or a wet process using phosphoric acid (H3PO4). Removal the sacrificial pattern 140 may include performing a dry etching process using chlorine ions (Cl—) or chlorine radicals (Cl*). Removing the buffer insulating pattern 130 may include performing a dry etching process using a gas containing carbon and fluorine, such as CF4, C2F6, C3F6, or C4F8, and/or a gas containing carbon, hydrogen, and fluorine, such as CHF3, or a wet process using fluorine acid (HF).

Figure 14:
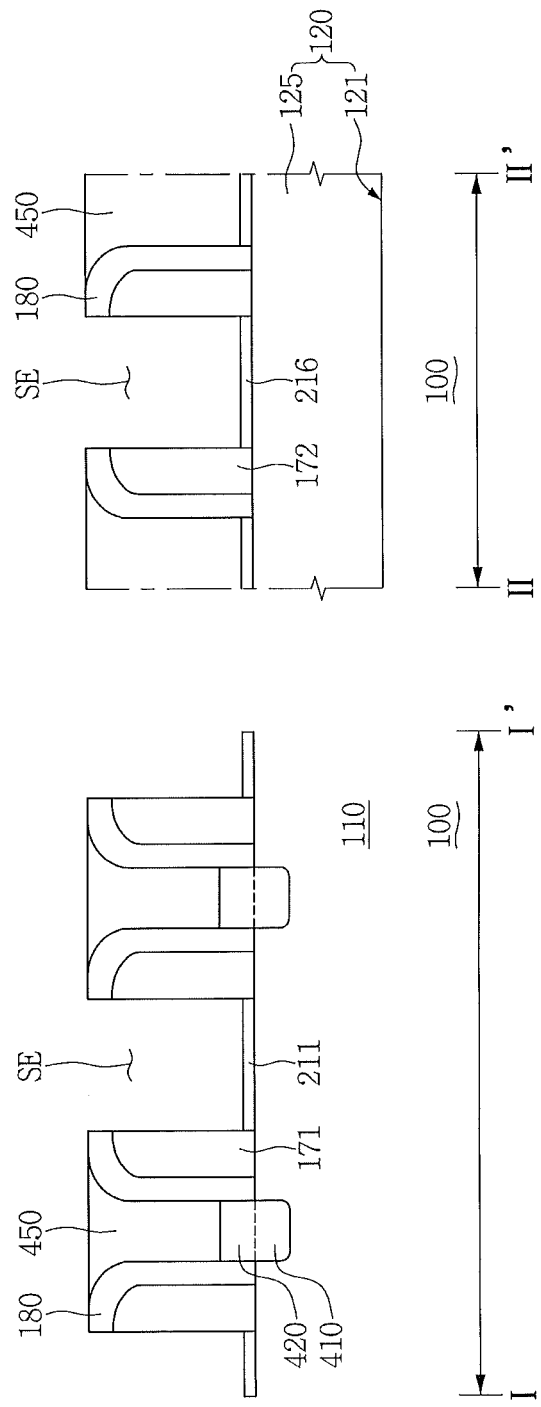

Referring to FIG. 14, the method may include forming a gate surface insulating layer 211 to fill the electrode spaces SE. The forming the gate surface insulating layer 211 may include oxidizing the surfaces of the active region 110 of the substrate 100, which are exposed by the electrode spaces SE, using a thermal oxidation process, a plasma oxidation process, or depositing silicon oxide. When an oxidation process is performed, a resistive surface insulating layer 216 may not be formed on the field region 120. However, for clarity, it is assumed here that the resistive surface insulating layer 216 is formed on the field region 120. Since the field region 120 and the resistive surface insulating layer 216 include insulating materials containing silicon oxide, the presence or absence of the resistive surface insulating layer 216 may not affect the inventive concept that will be described below.

Figure 15:
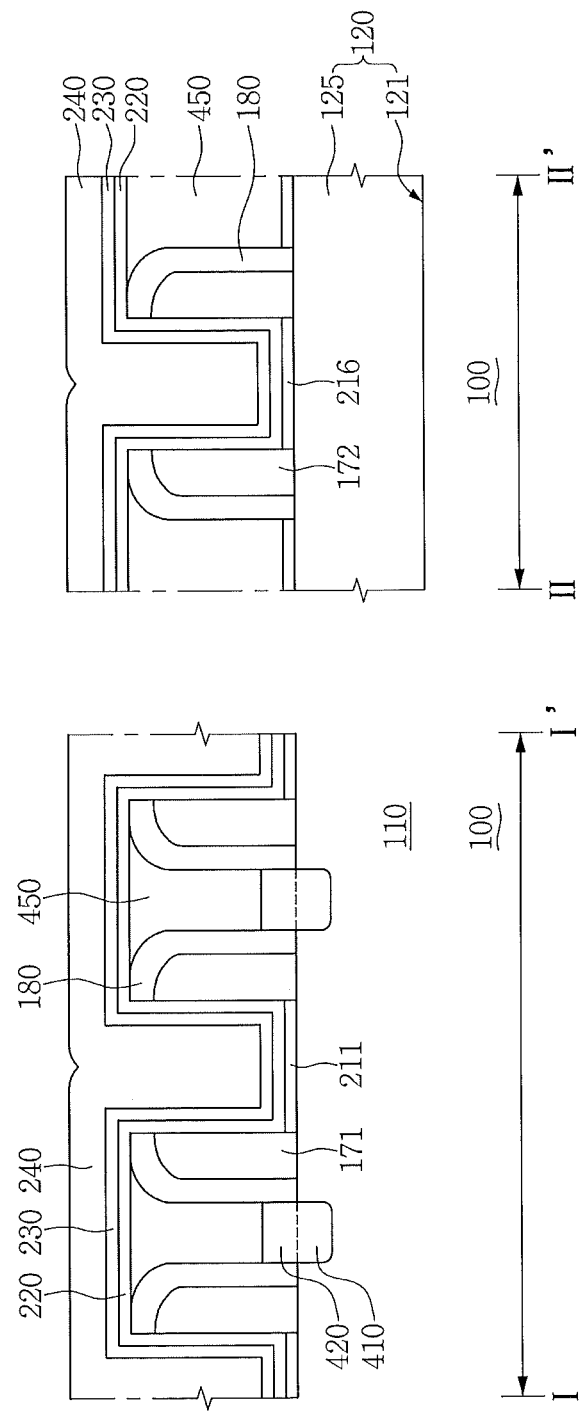

Referring to FIG. 15, the method may include forming a first insulating material layer 220, a first barrier material layer 230, and a first electrode material layer 240 in the electrode spaces SE. Forming the first insulating material layer 220 may include conformally forming a metal oxide layer on the surface insulating layers 211 and 216 and the spacers 171 and 172 using a deposition process, such as an ALD process. Here, the metal oxide layer may have a higher dielectric constant than silicon oxide. For example, the metal oxide layer may be hafnium oxide, lanthanum oxide, or aluminum oxide. The first insulating material layer 220 may also be formed on exposed side surfaces of the covering layer 180 and the lower interlayer insulating layer 450. When the resistive surface insulating layer 216 is omitted, the first insulating material layer 220 may be formed directly on the surface of the field region 120. The forming the first barrier material layer 230 may include forming a layer including titanium, titanium nitride, tantalum, tantalum nitride, titanium tungsten, or one of other barrier metals using a deposition process, such as an ALD process. Forming the first electrode material layer 240 may include forming a metal, such as aluminum, tungsten, copper, nickel, cobalt, titanium, or tantalum, and/or a metal compound, such as a metal nitride, using a deposition process (e.g., a CVD process or a physical vapor deposition (PVD) process) to fill the electrode spaces SE.

Figure 16:
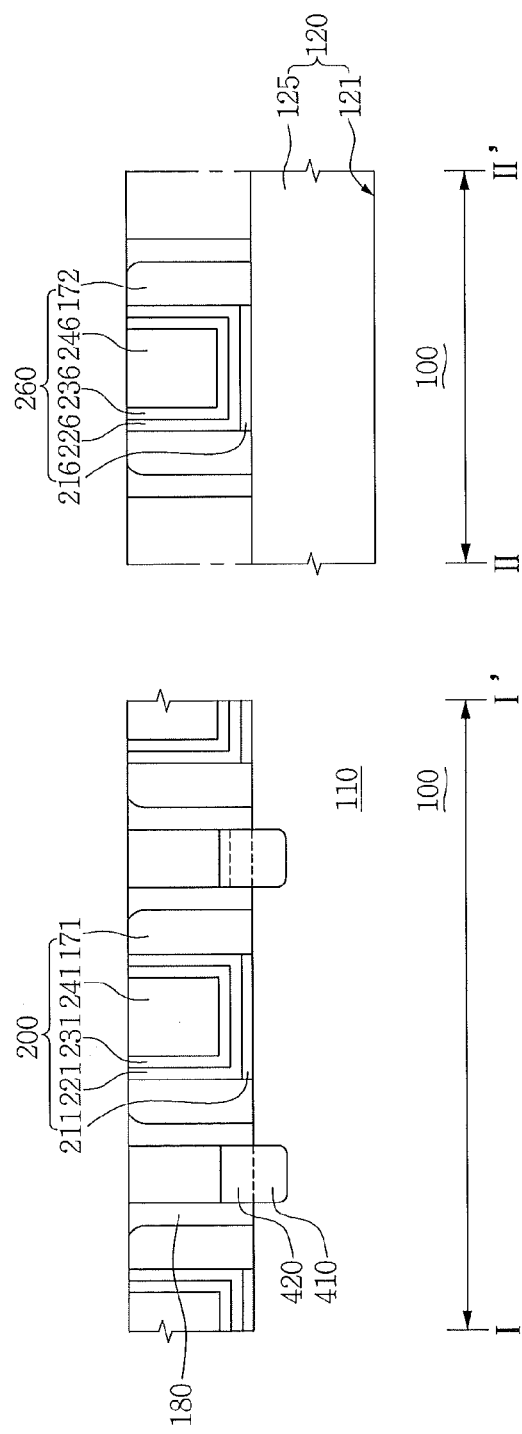

Referring to FIG. 16, the method may include performing a planarization process, such as a CMP process, to form a gate structure 200 on the active region 110 and a third preliminary structure 260 on the field region 120. For example, by performing a CMP process, the first electrode material layer 240 may be modified into a gate electrode 241 and a preliminary resistive electrode 246, and the first barrier material layer 230 may be modified into a gate barrier layer 231 and a preliminary resistive barrier layer 236. Also, the first insulating material layer 220 may be modified into a gate insulating layer 221 and a resistive insulating layer 226. Accordingly, the gate structure 200 may include the gate surface insulating layer 211, the gate insulating layer 221, the gate barrier layer 231, the gate electrode layer 241 and the gate spacers 171 formed on the active region 110 of the substrate 100. Also, the third preliminary structure 260 may include the resistive surface insulating layer 216, the preliminary resistive insulating layer 226, the preliminary resistive barrier layer 236, the preliminary resistive electrode 246, and the resistive spacers 172 formed on the field region 120.

Figure 17A:
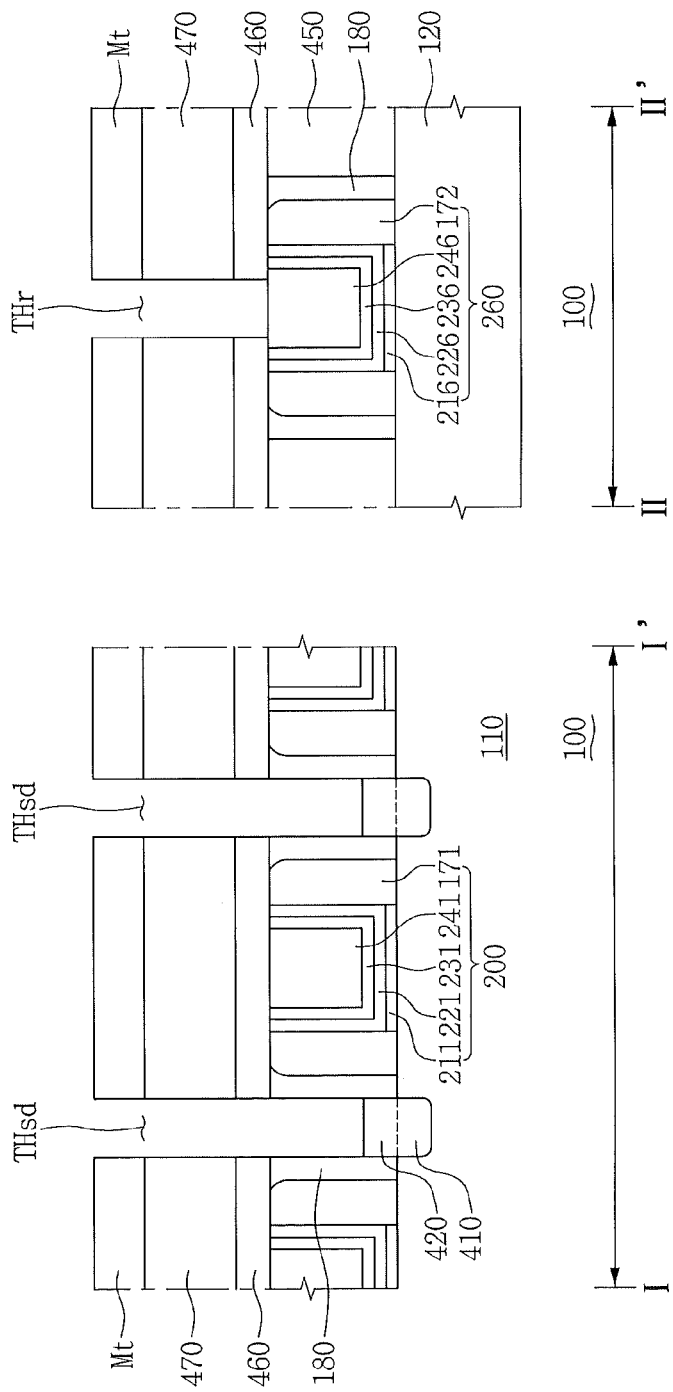
Figure 17B:
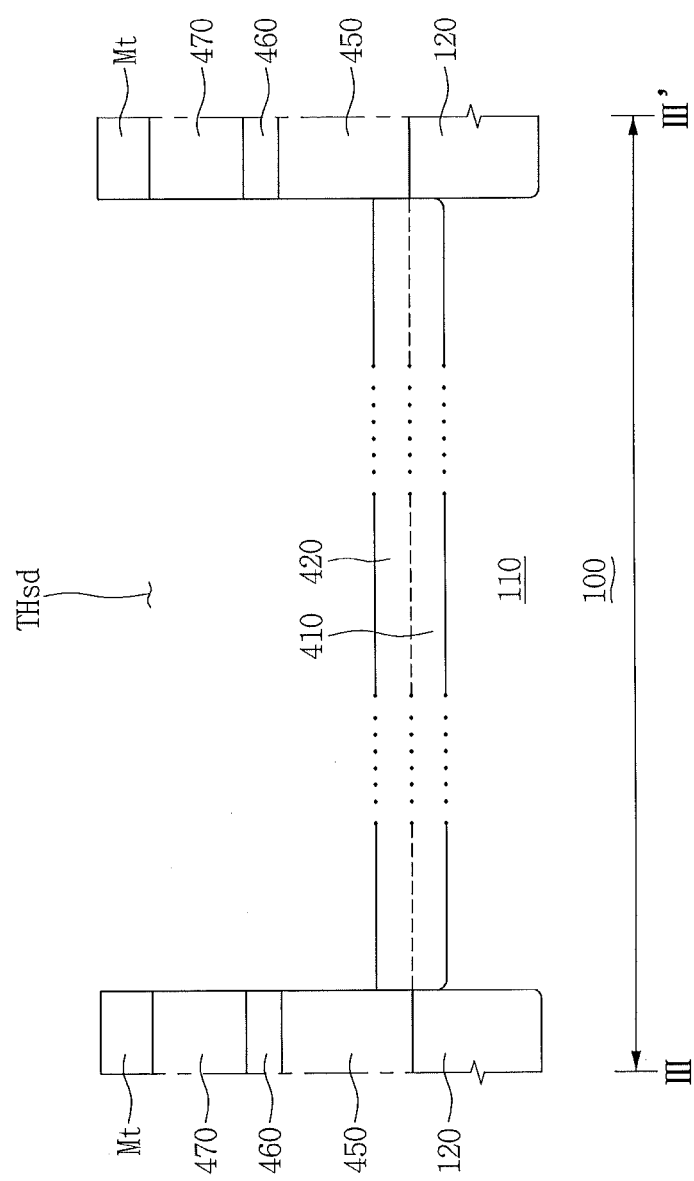
Figure 17C:
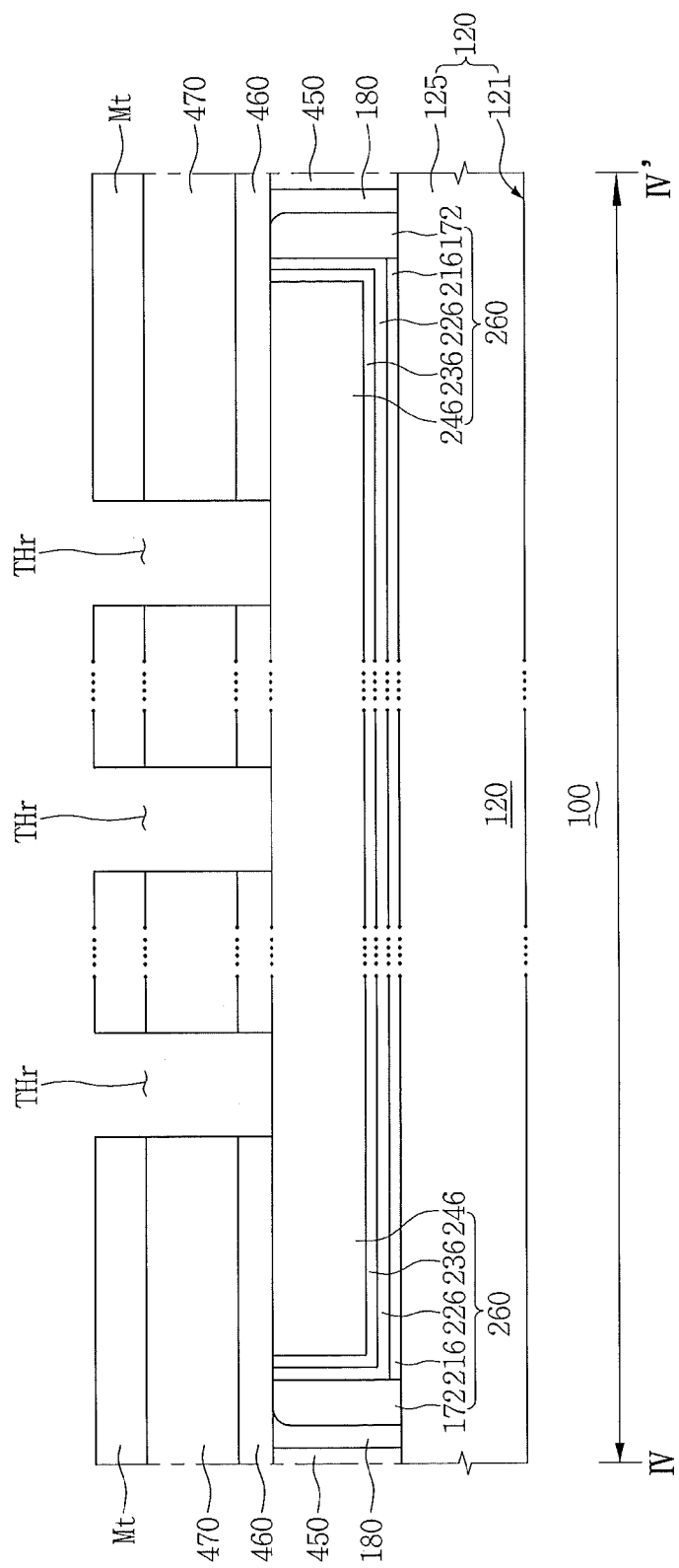

Referring to FIGS. 17A through 17C, the method may include forming a buffer interlayer insulating layer 460, a middle interlayer insulating layer 470, and a trench mask pattern Mt on the gate structure 200, the third preliminary structure 260, and the lower interlayer insulating layer 450. The method may also include forming source/drain trench holes THsd exposing the upper source/drain regions 420 and a resistive trench hole THr exposing a top surface of the preliminary resistive electrode 246 of the third preliminary structure 260. The resistive trench hole THr may be formed in a wide or elongated trench shape, or in a narrow or short hole shape. The buffer interlayer insulating layer 460 may include a material having an etch selectivity with respect to the lower interlayer insulating layer 450 and the middle interlayer insulating layer 470. The buffer interlayer insulating layer 460 may include a material having a dielectric constant lower than dielectric constants of the lower interlayer insulating layer 450 and the middle interlayer insulating layer 470. For example, the buffer interlayer insulating layer 460 may include a carbon-containing silicon oxide (SiOC). The middle interlayer insulating layer 470 may include silicon oxide. The trench mask pattern Mt may include an organic material, such as photoresist, or an inorganic material, such as silicon nitride or silicon oxynitride.

Figure 18A:
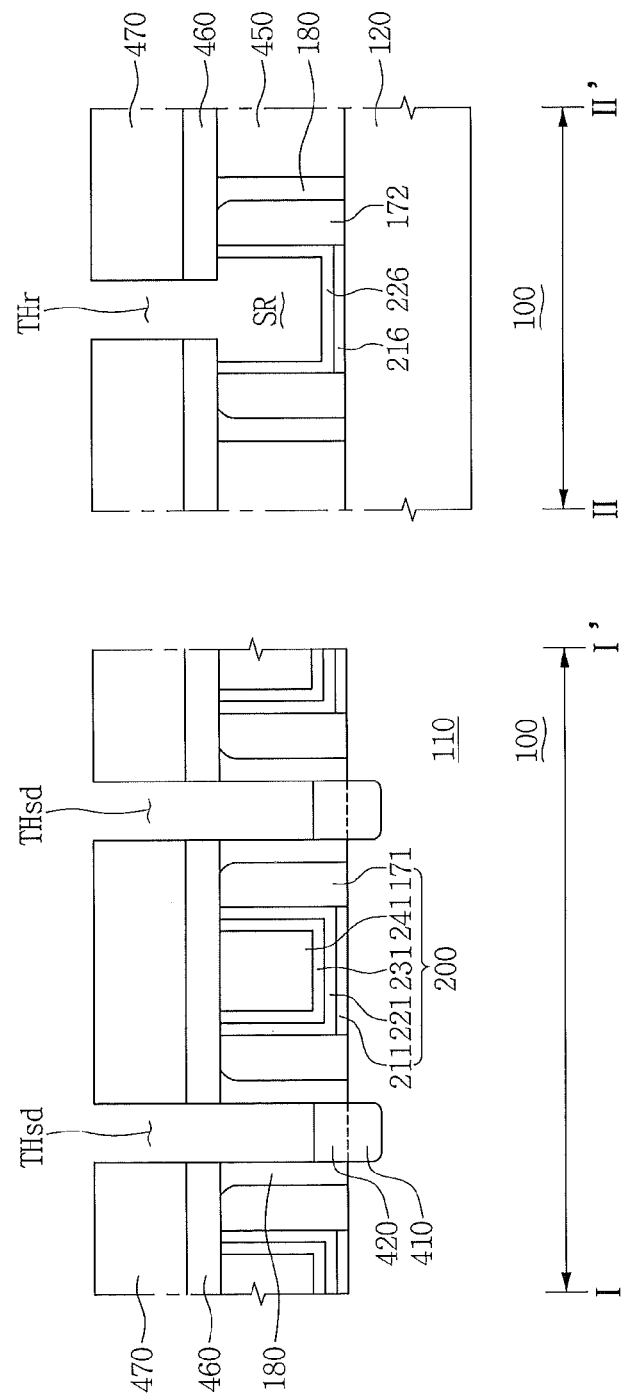
Figure 18B:
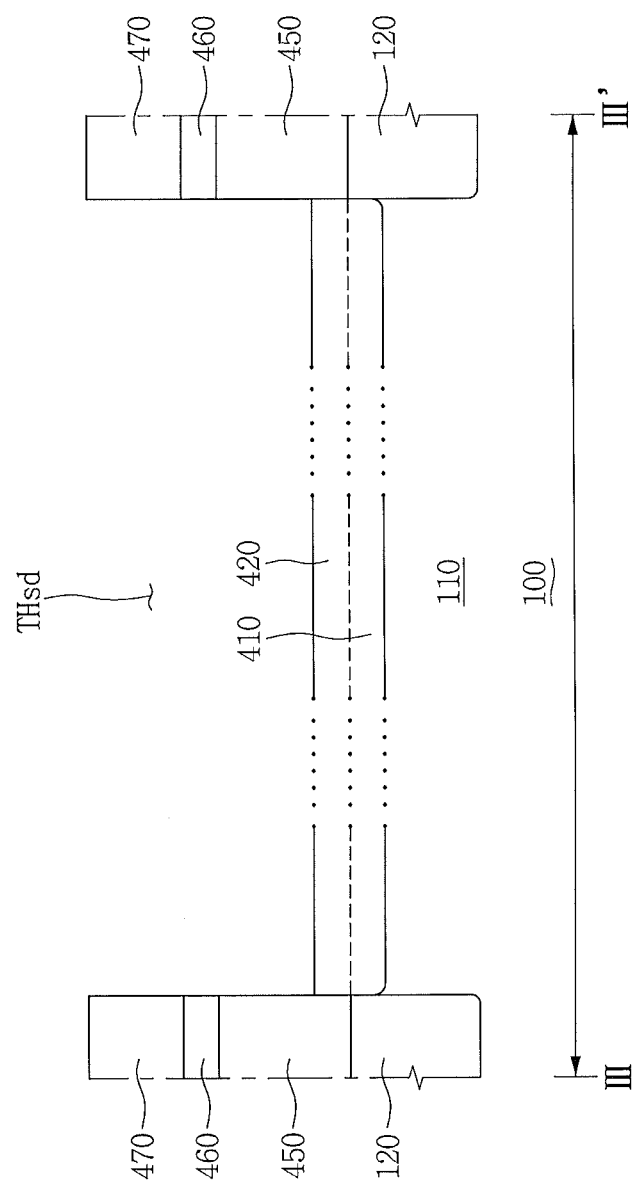
Figure 18C:
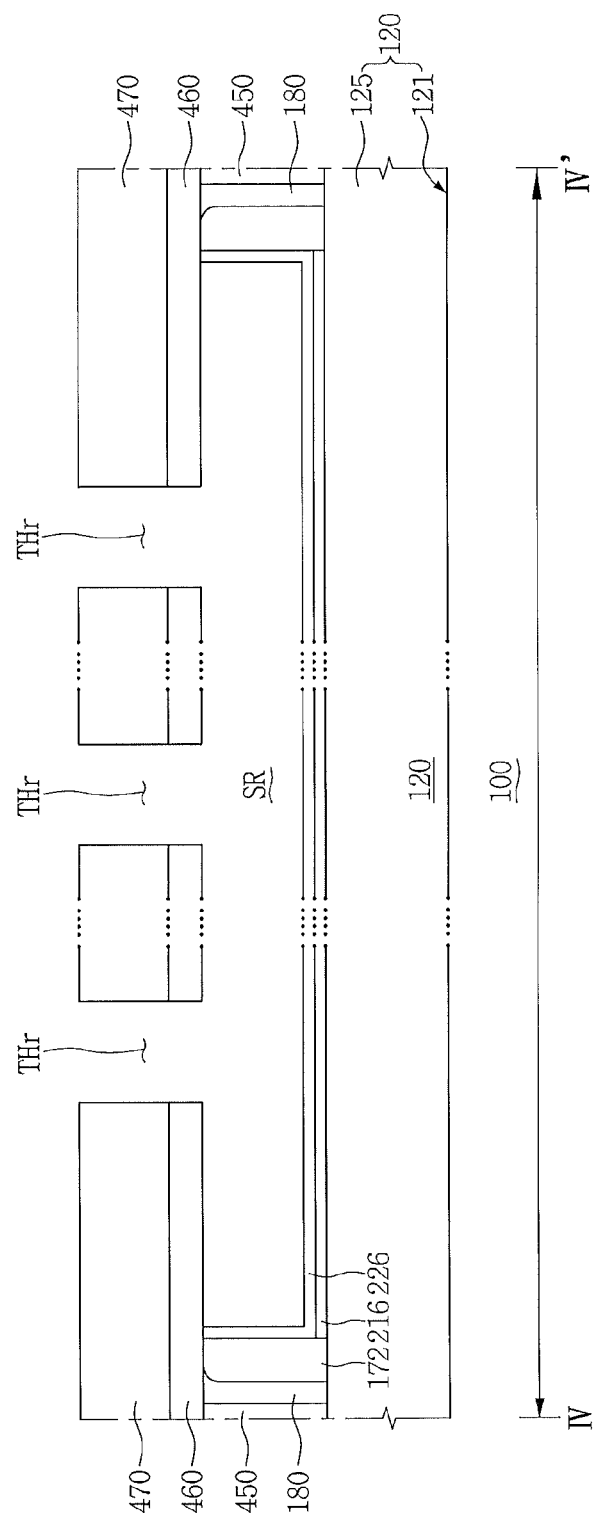

Referring to FIGS. 18A through 18C, the method may include removing the preliminary resistive electrode 246 and the preliminary resistive barrier layer 236 of the third preliminary structure 260 through the resistive trench holes THr to form resistive spaces SR. During the forming the resistive spaces SR, the trench mask pattern Mt may be removed. The forming the resistive spaces SR may include a wet etching process using a sulfuric acid ($H_2SO_4$) solution, a standard cleaning-1 (SC-1) solution, or a citric acid solution. The SC-1 solution may contain oxygenated water, ammonia water, and water.

Figure 19A:
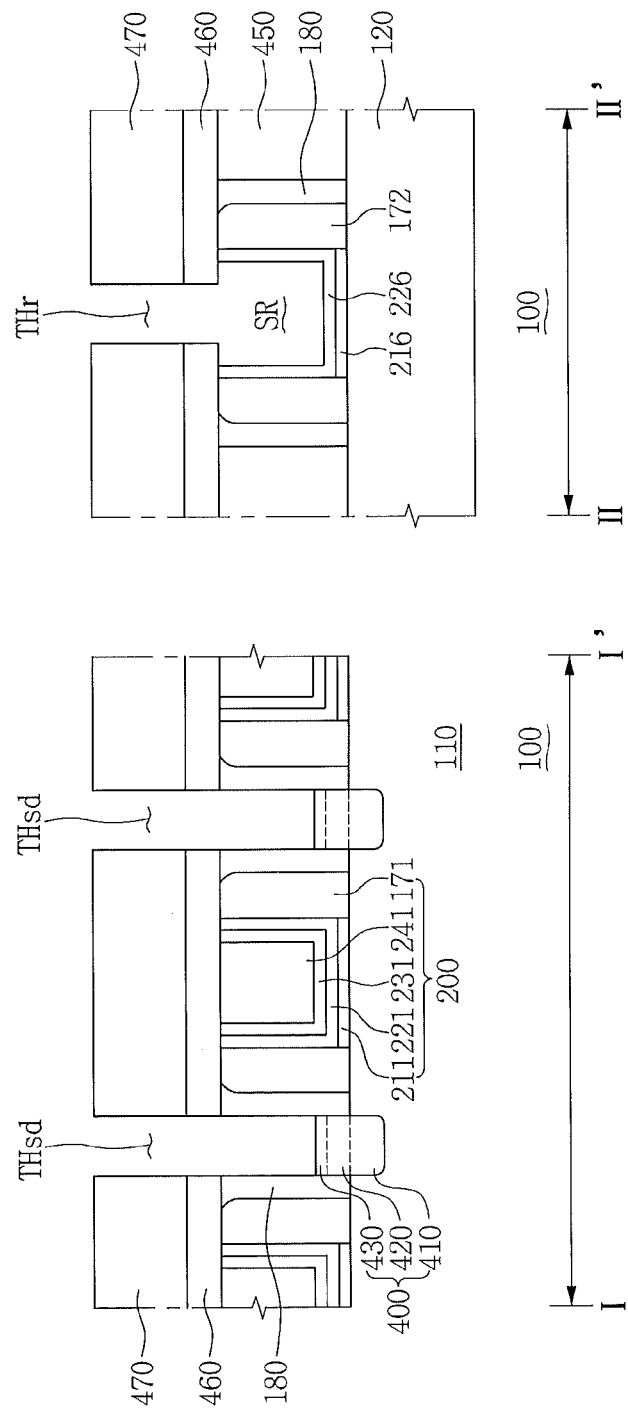
Figure 19B:
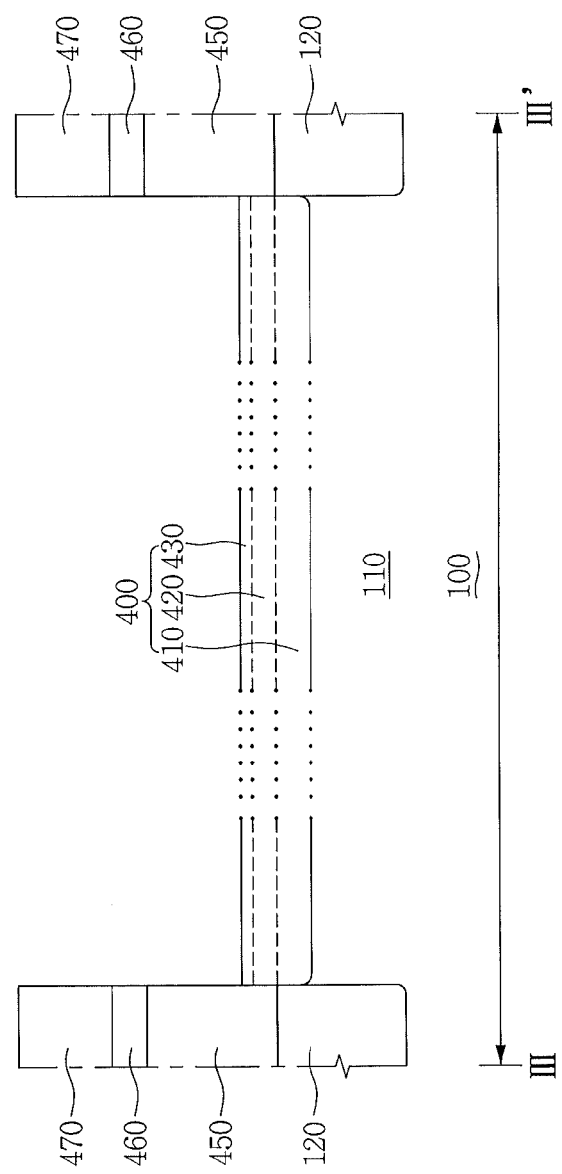
Figure 19C:
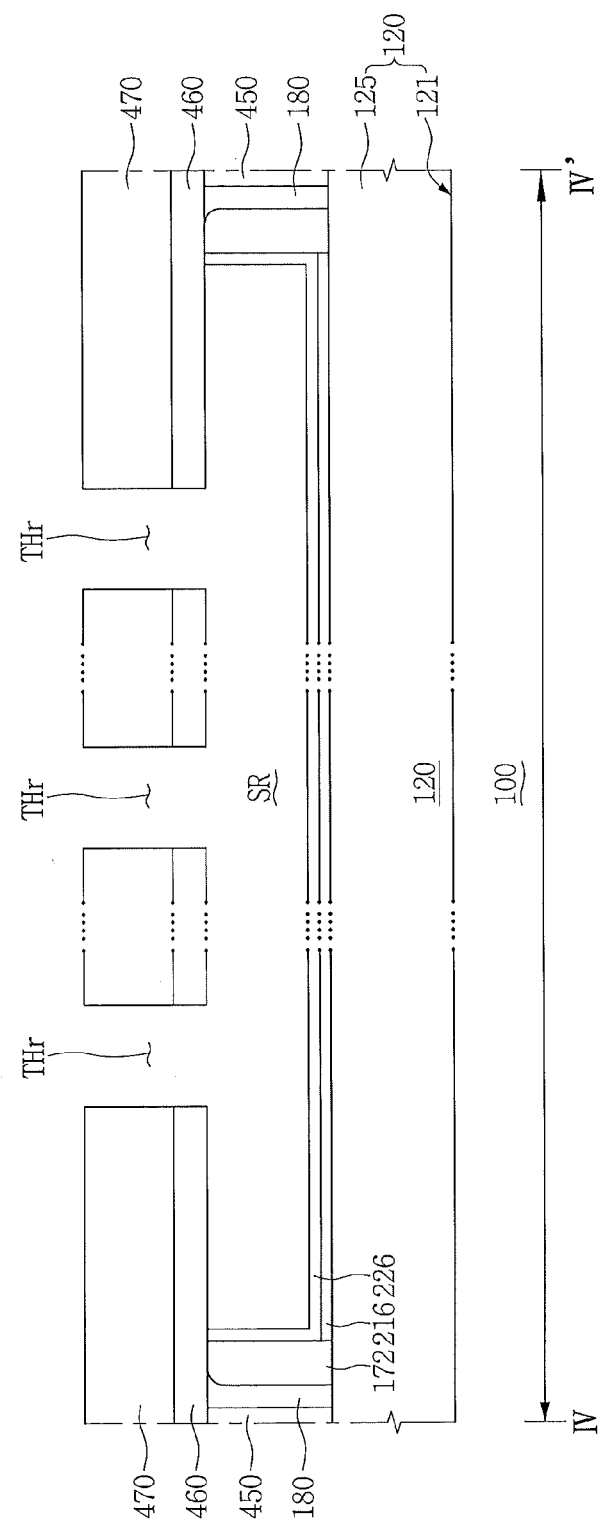

Referring to FIGS. 19A through 19C, the method may include forming silicide regions 430 in the upper source/drain regions 420. The forming the silicide regions 430 may include forming a metal, such as nickel, tungsten, titanium, or cobalt, on the upper source/drain regions 420, forming the silicide regions 430 using a silicidation process, and removing an unreacted metal. Accordingly, the silicide regions 430 may include, for example, nickel silicide, cobalt silicide, tungsten silicide, or titanium silicide. During the forming the silicide regions 430, the upper source/drain regions 420 may be wholly or partially modified into the silicide regions 430.

Figure 20A:
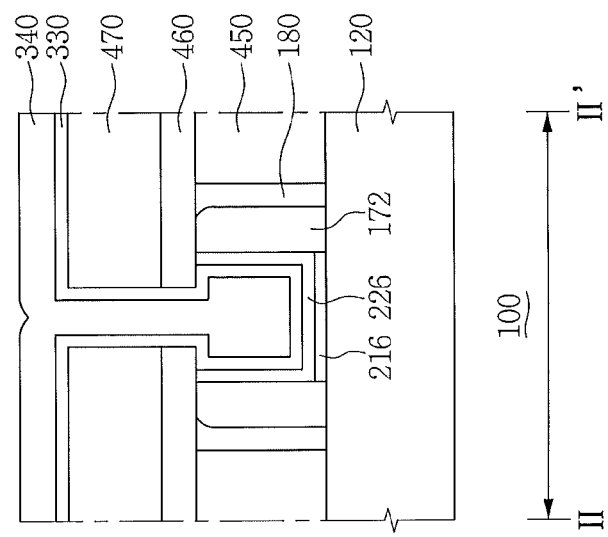
Figure 20A:
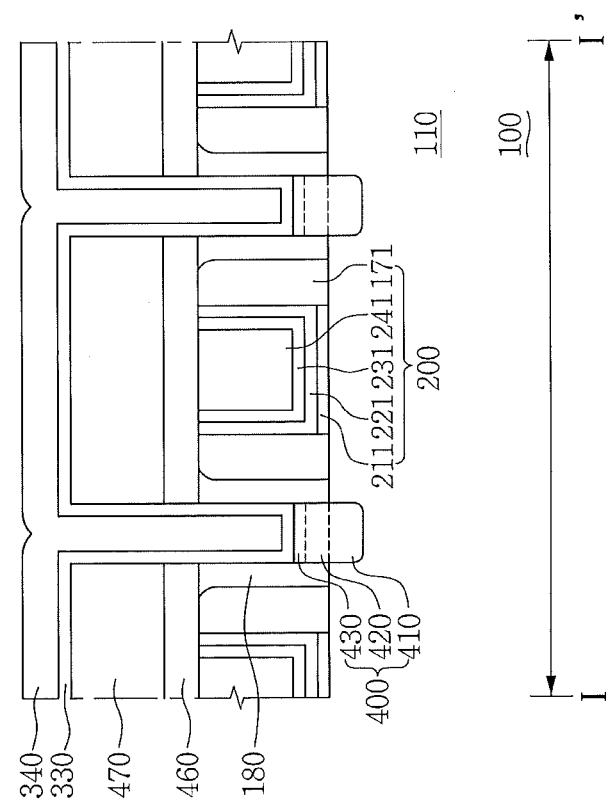
Figure 20B:
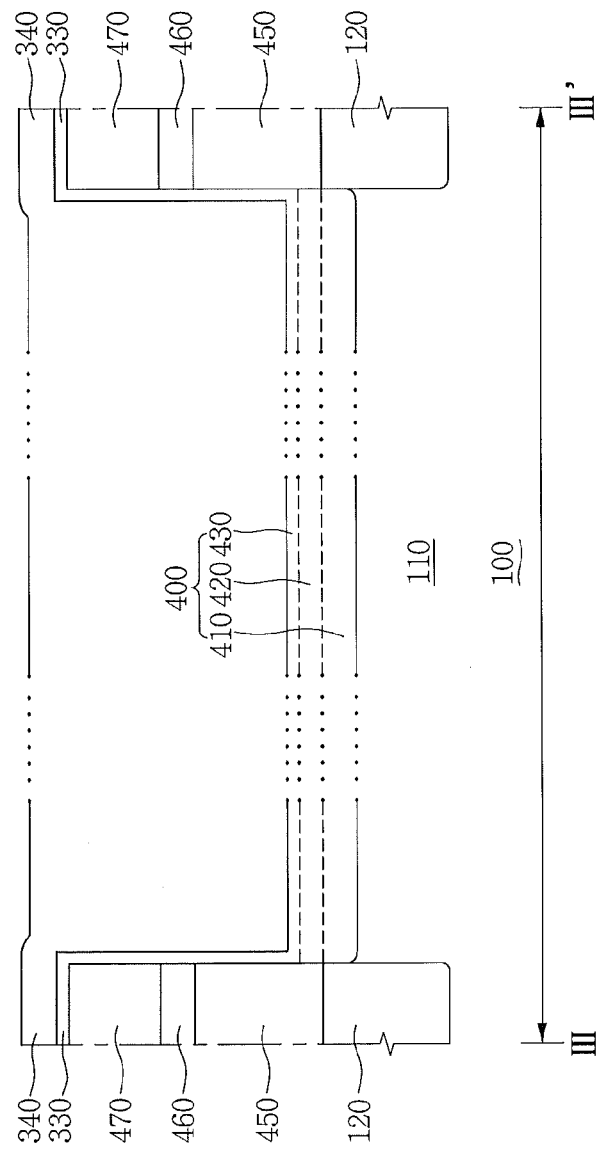
Figure 20C:
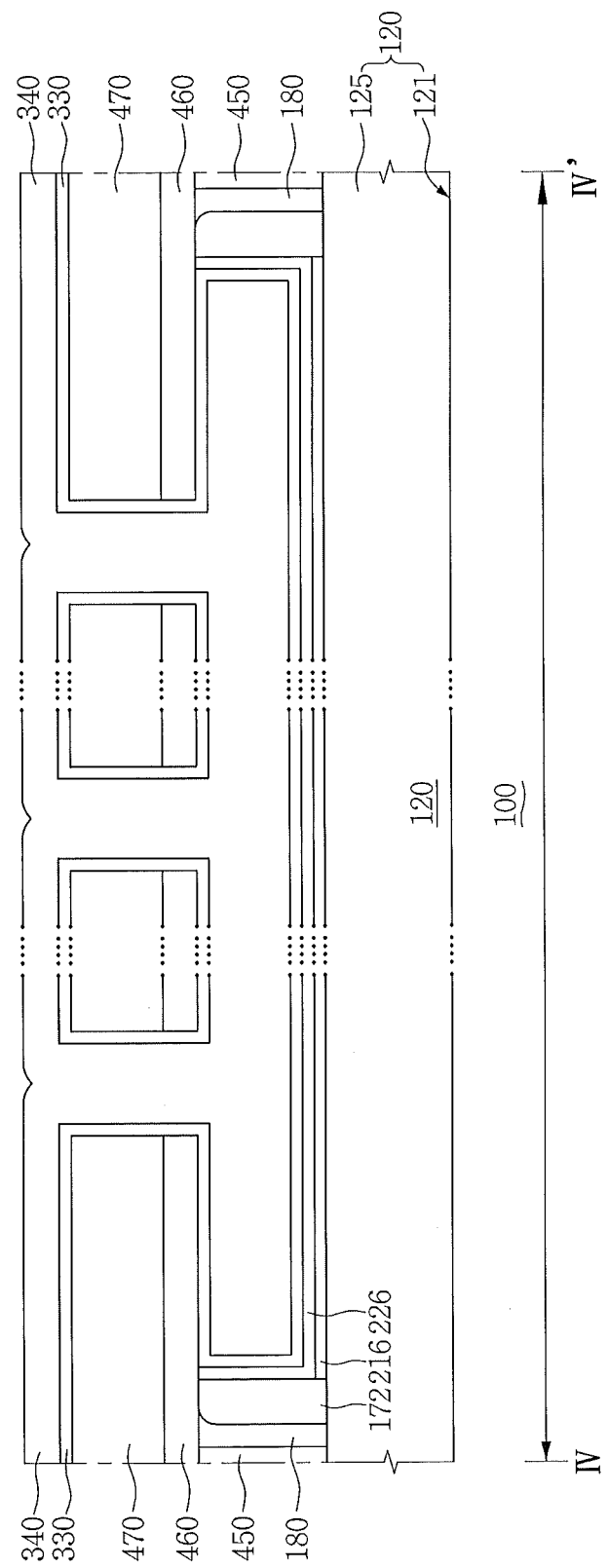
Figure 21A:
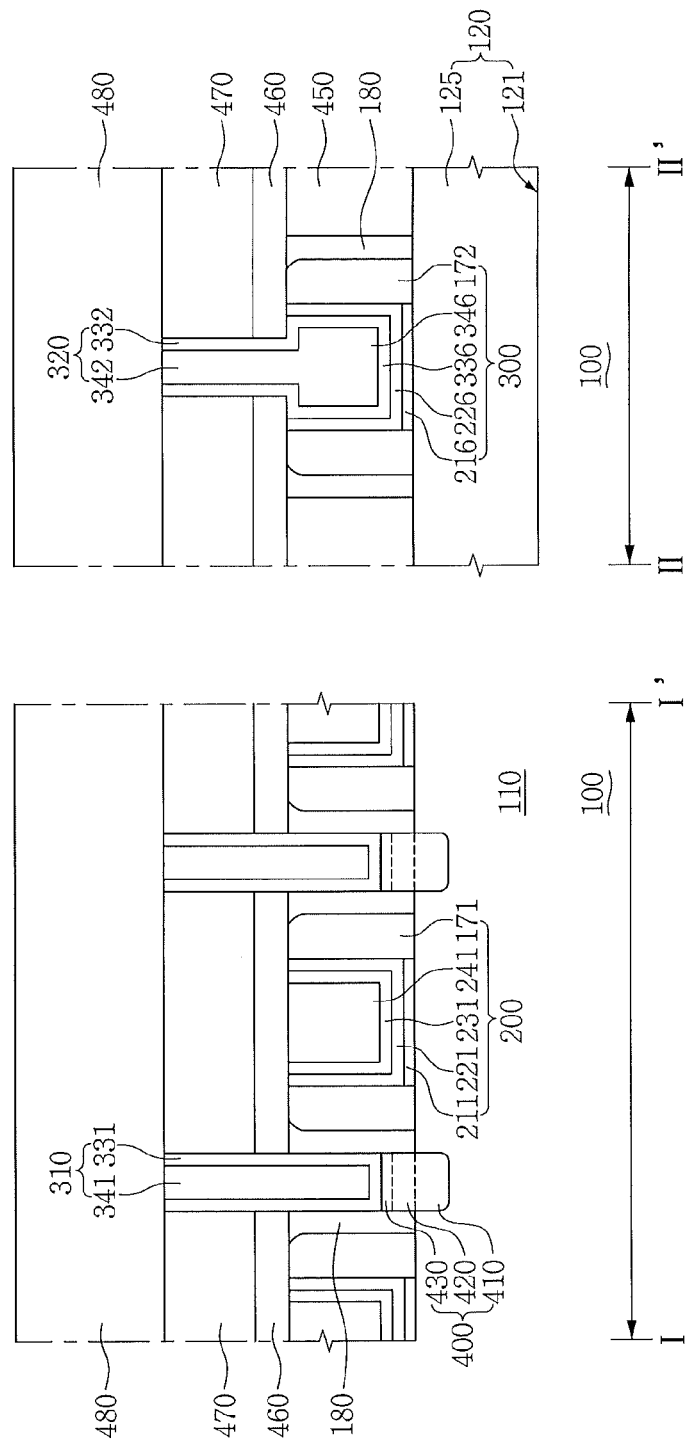
Figure 21B:
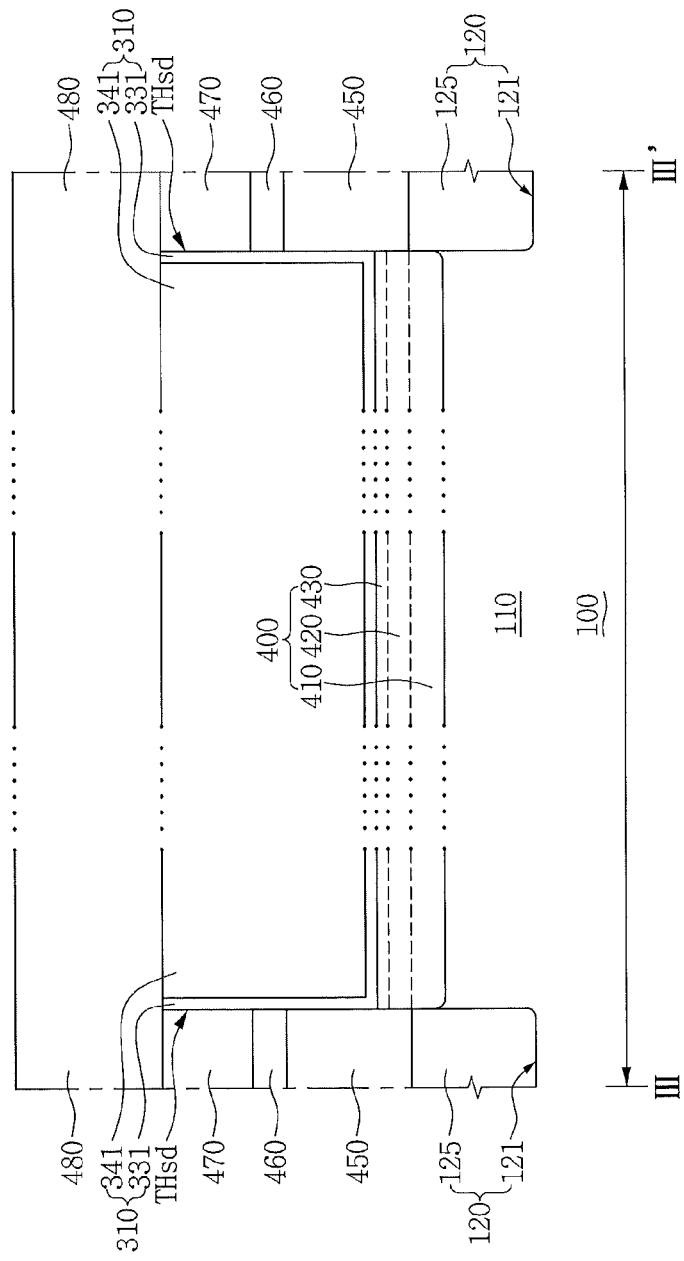
Figure 21C:
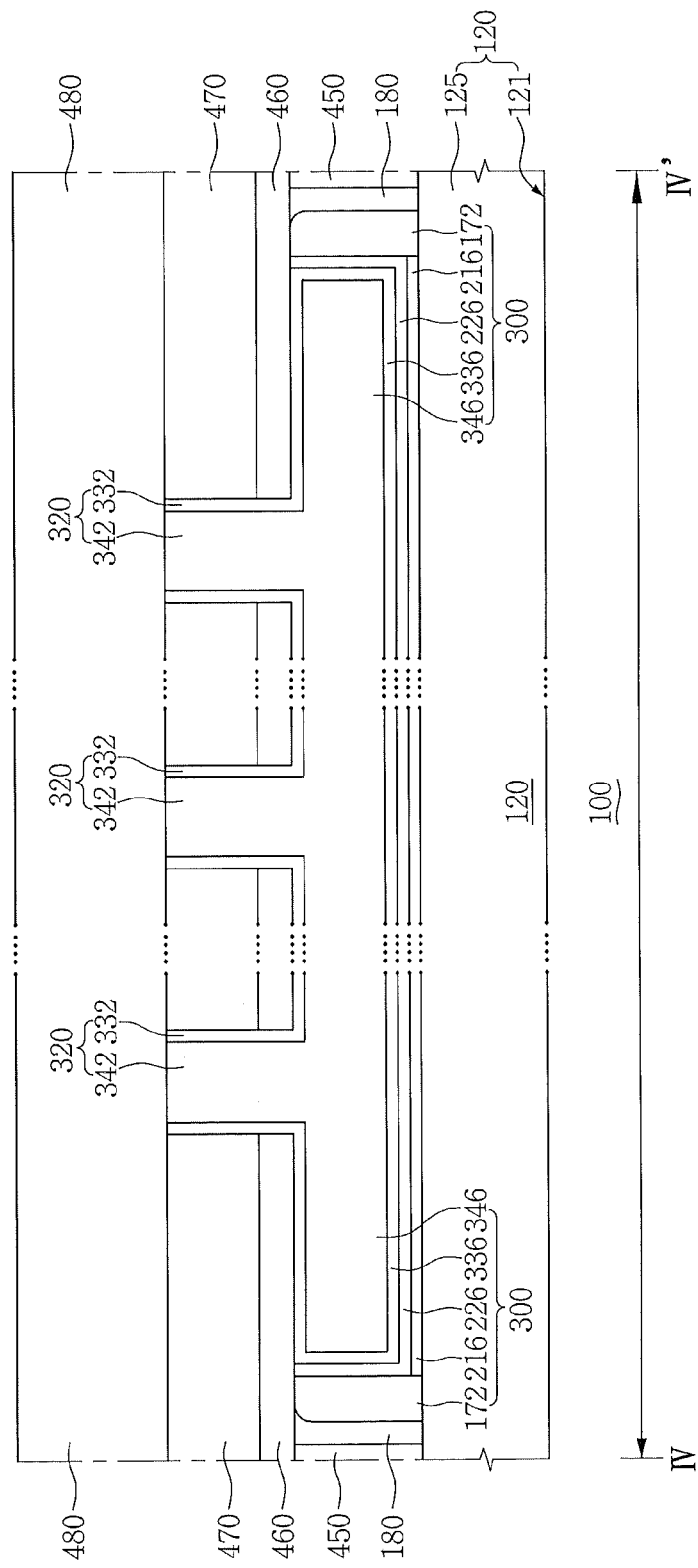
Figure 21D:
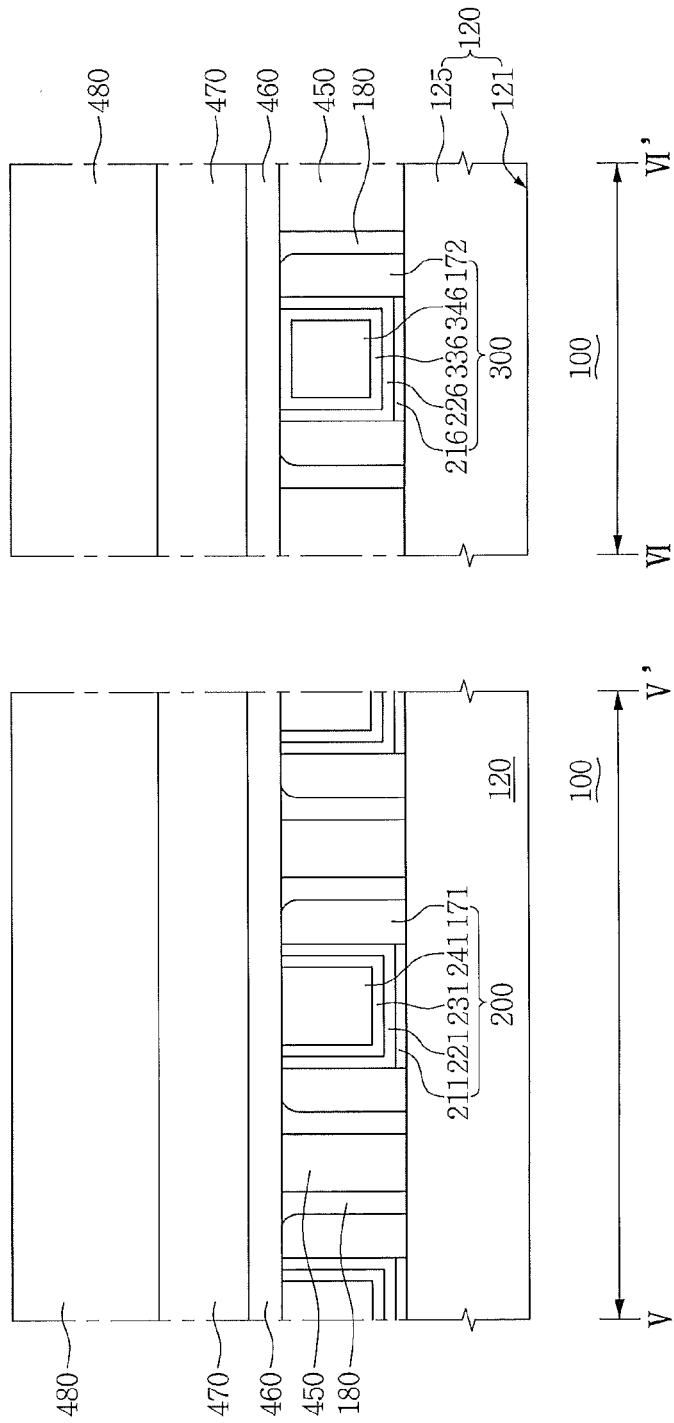
Figure 22A:
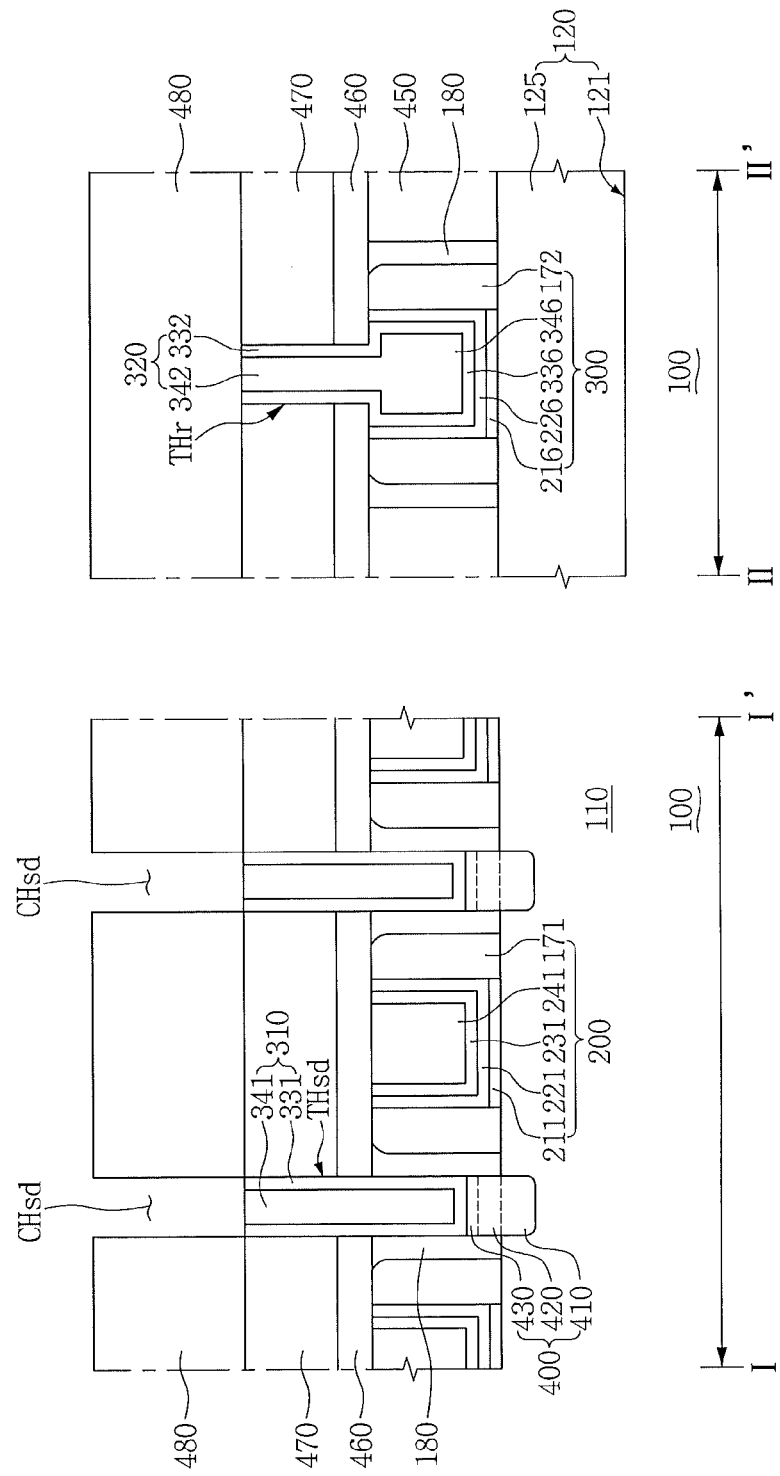
Figure 22B:
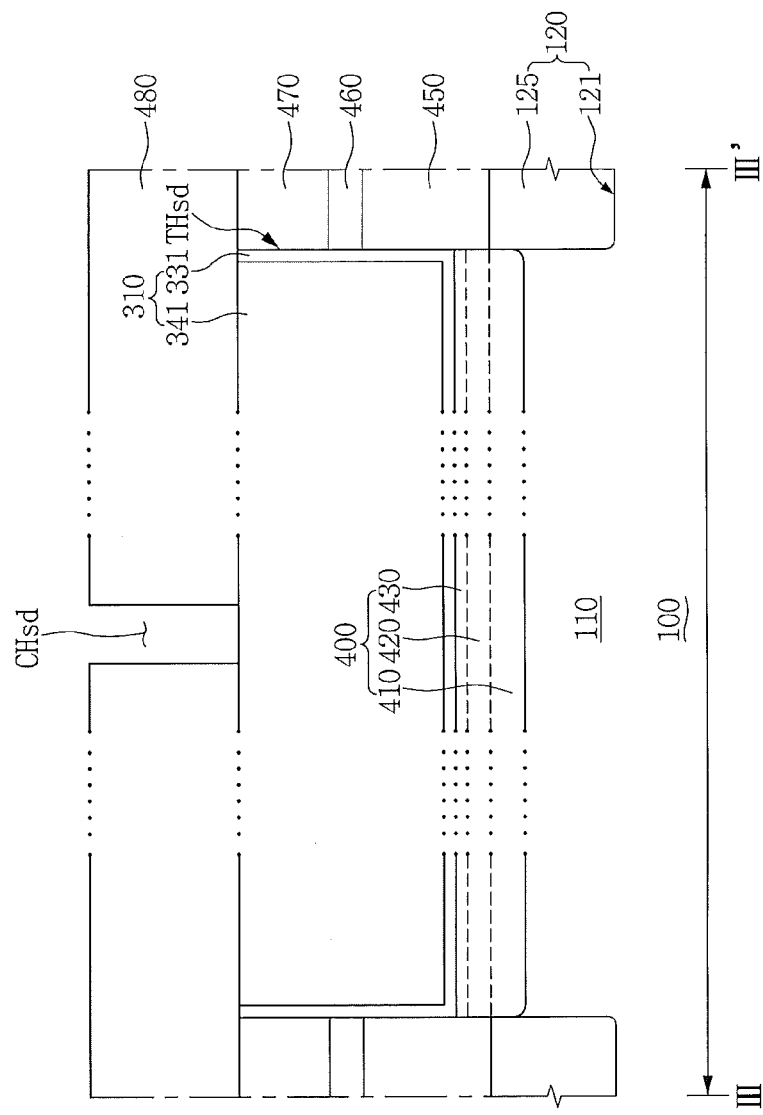
Figure 22C:
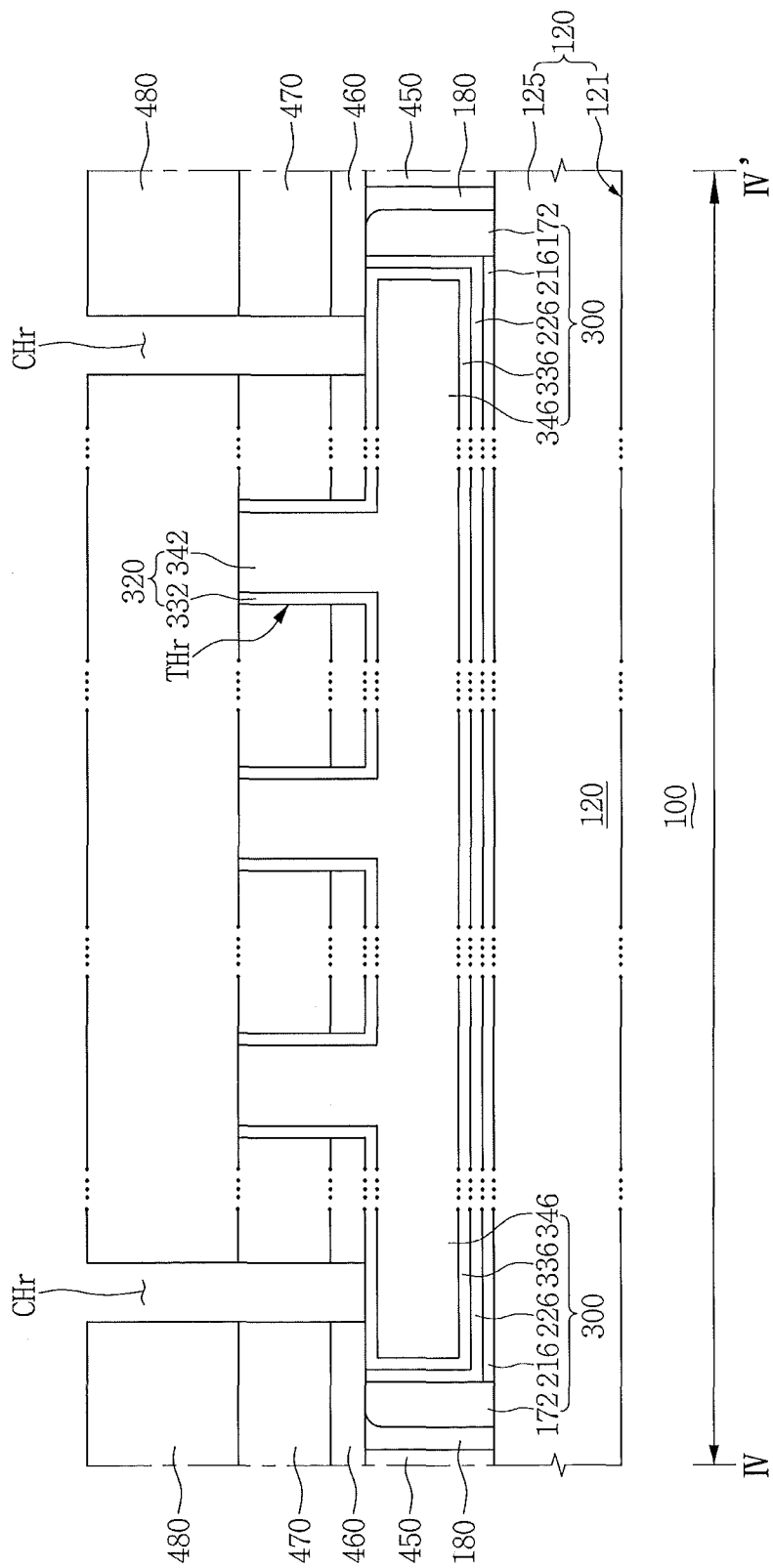
Figure 22D:
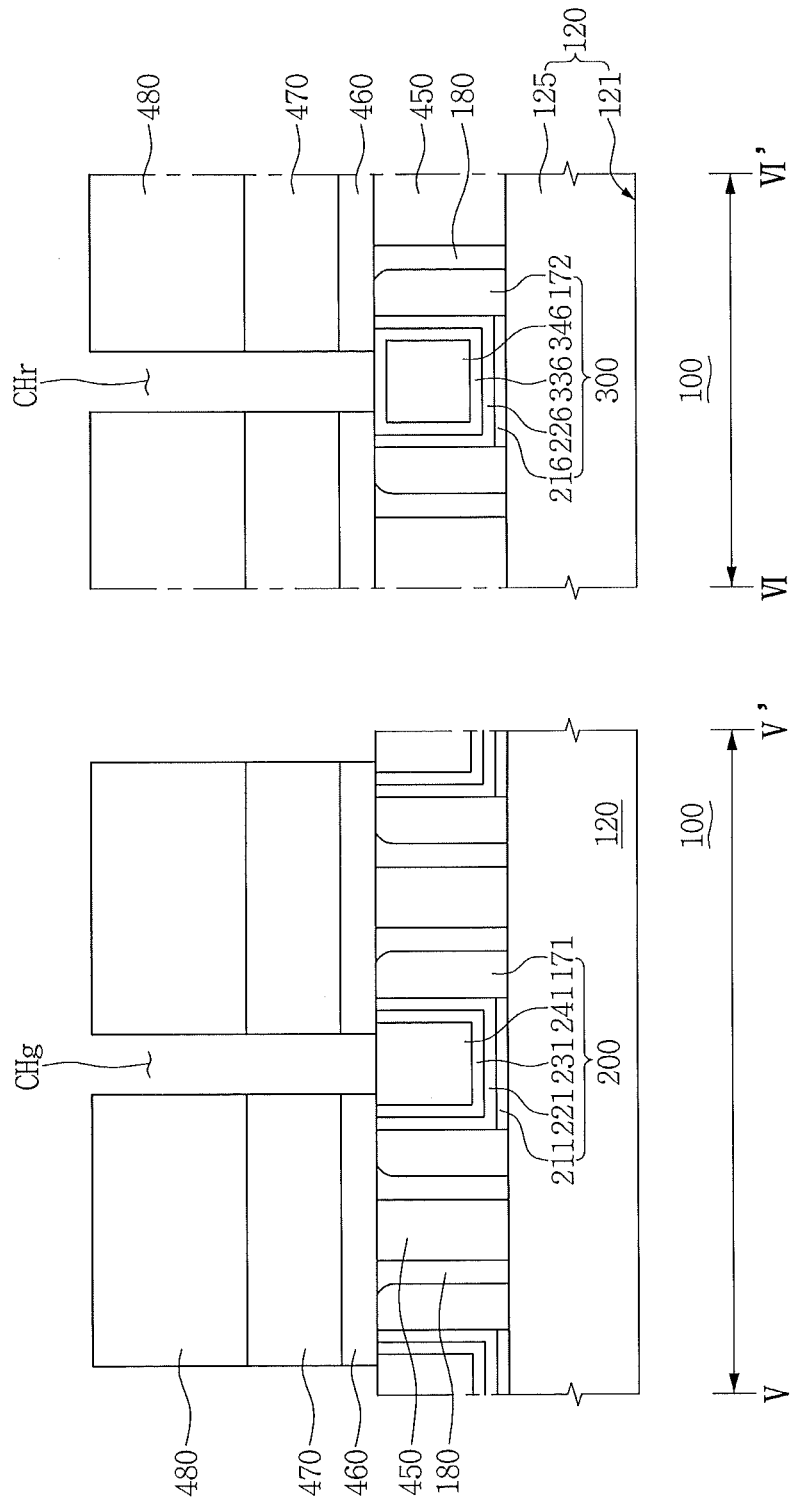
Figure 23A:
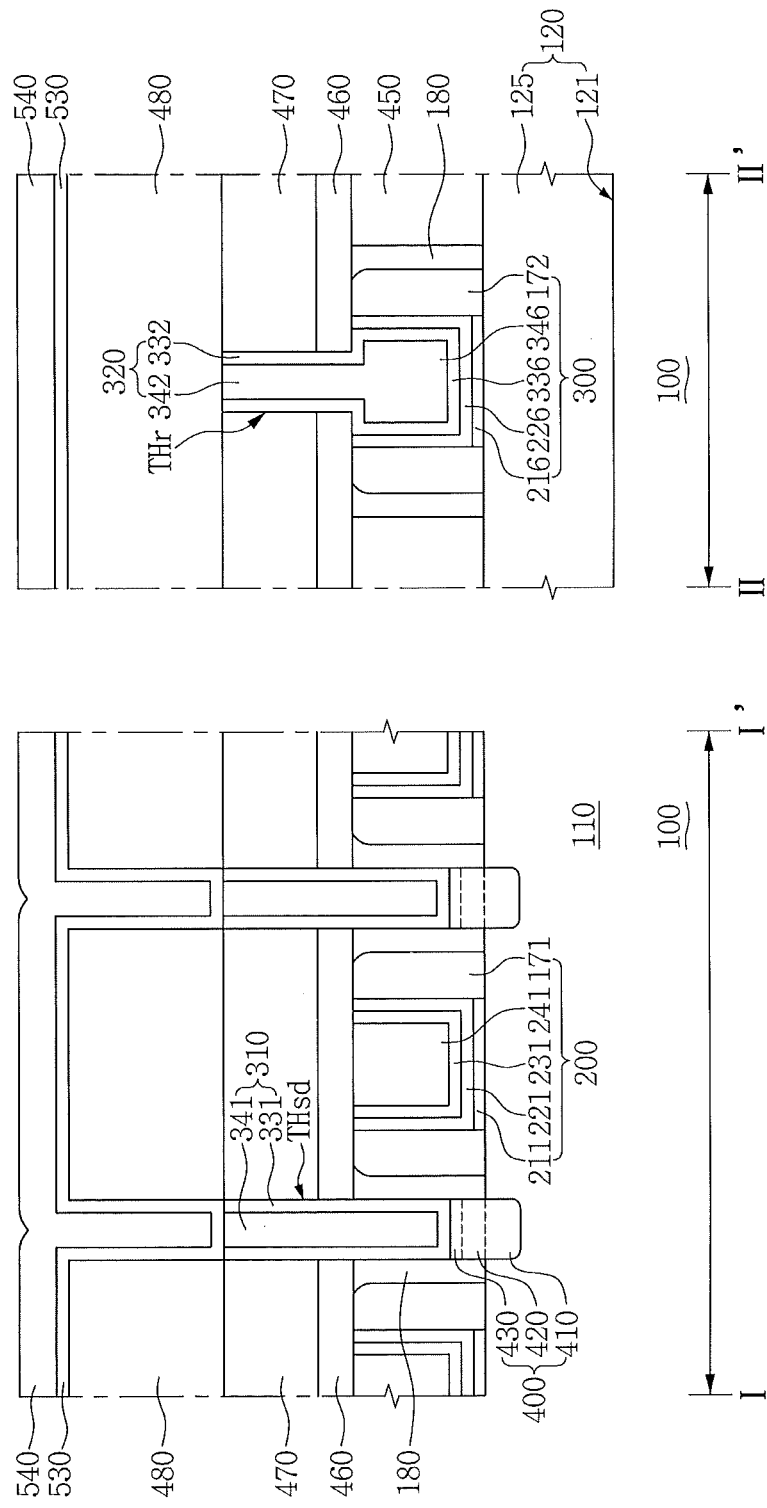
Figure 23B:
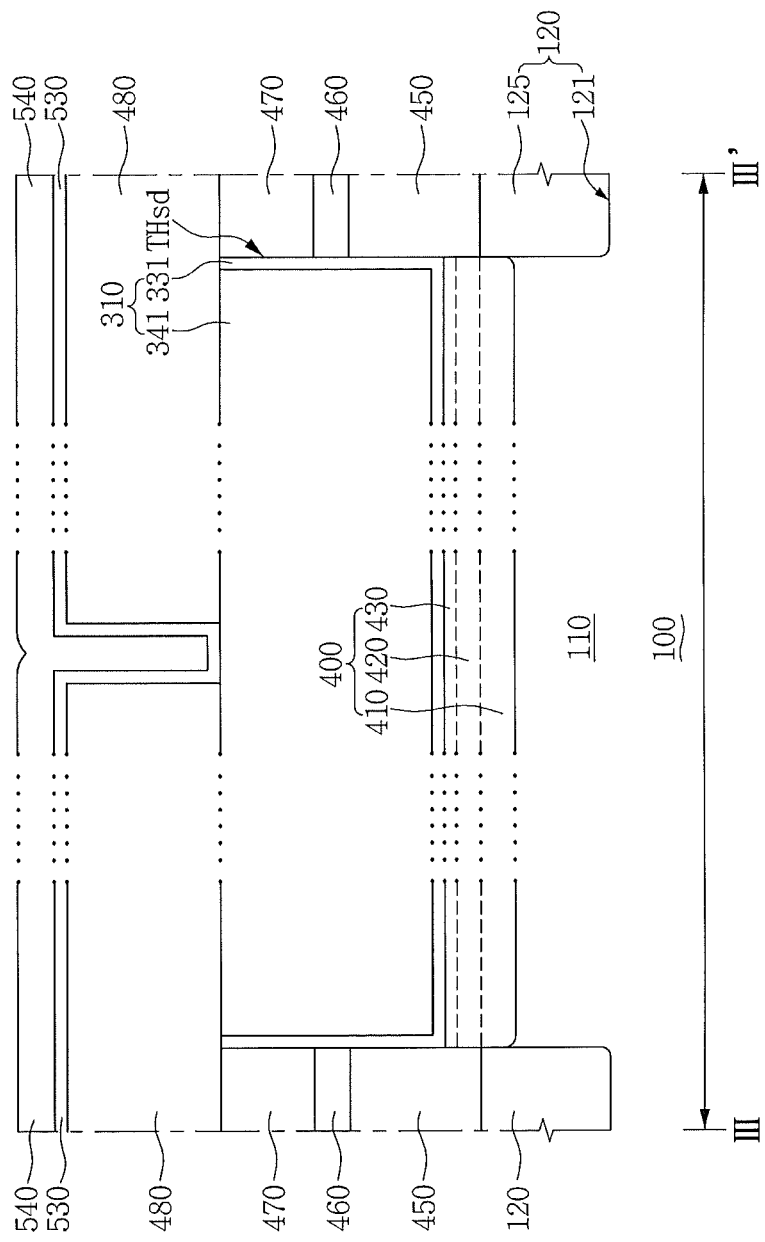
Figure 23C:
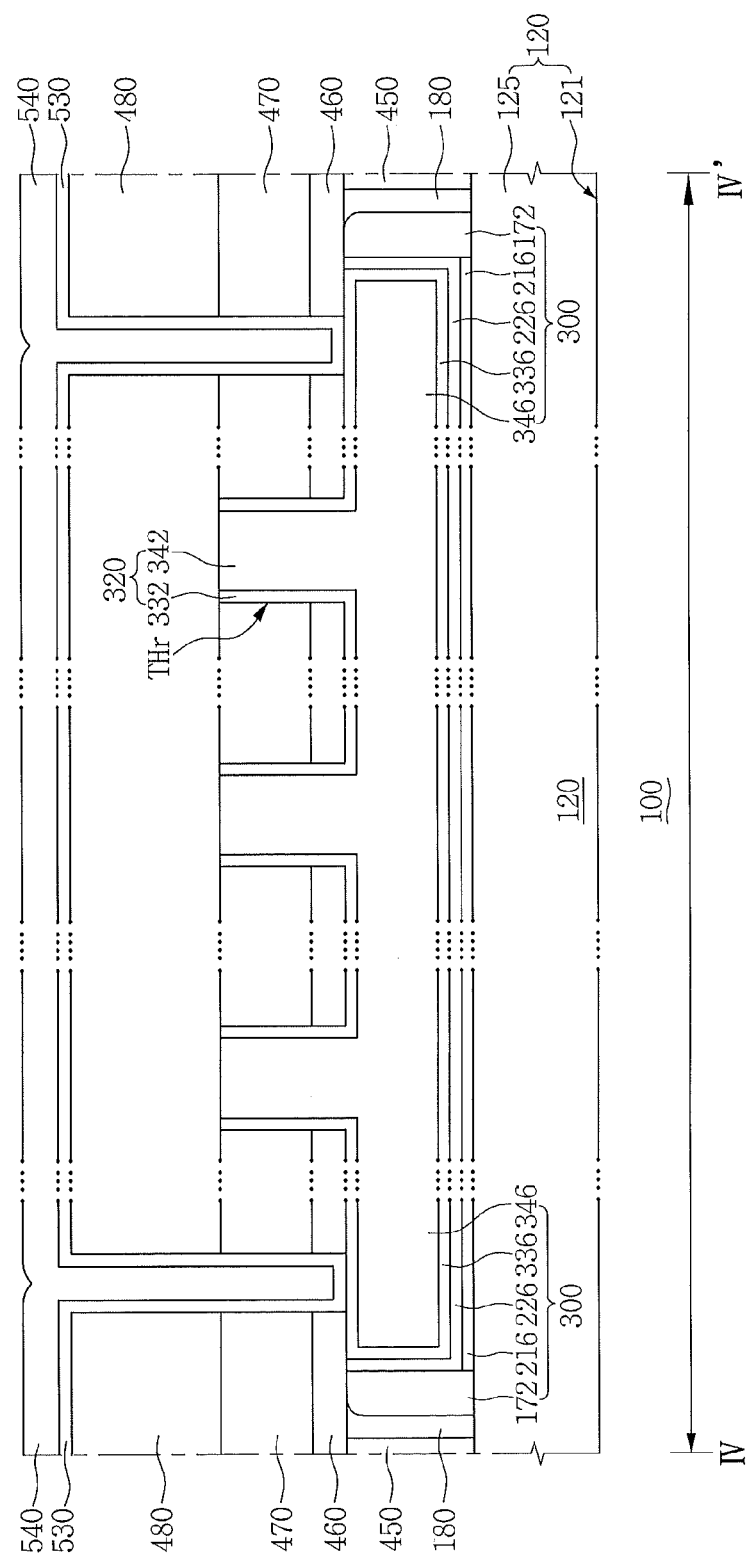
Figure 23D:
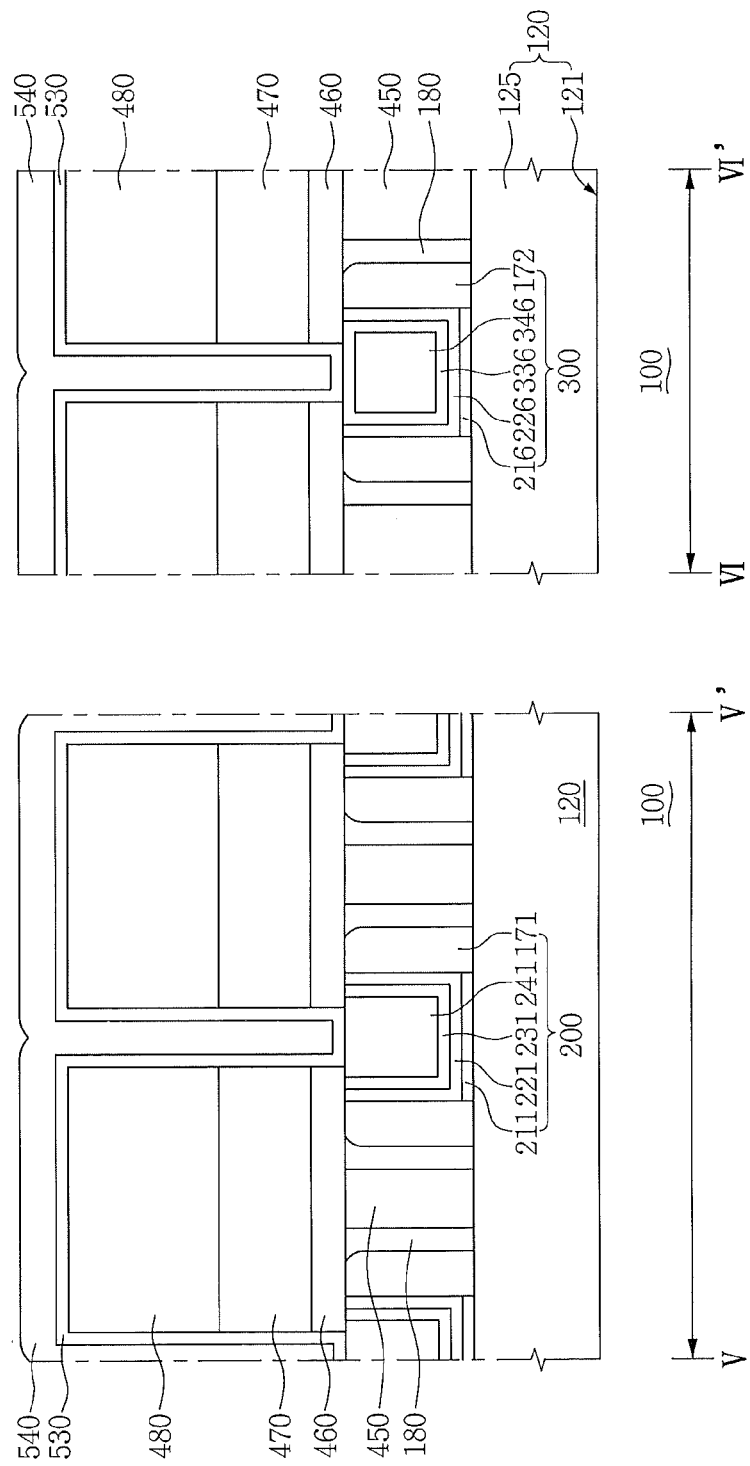
Figure 24A:
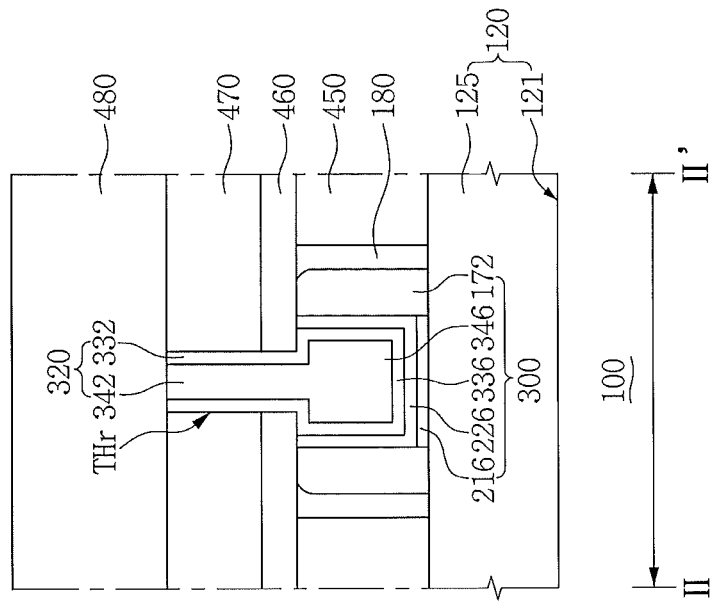
Figure 24A:
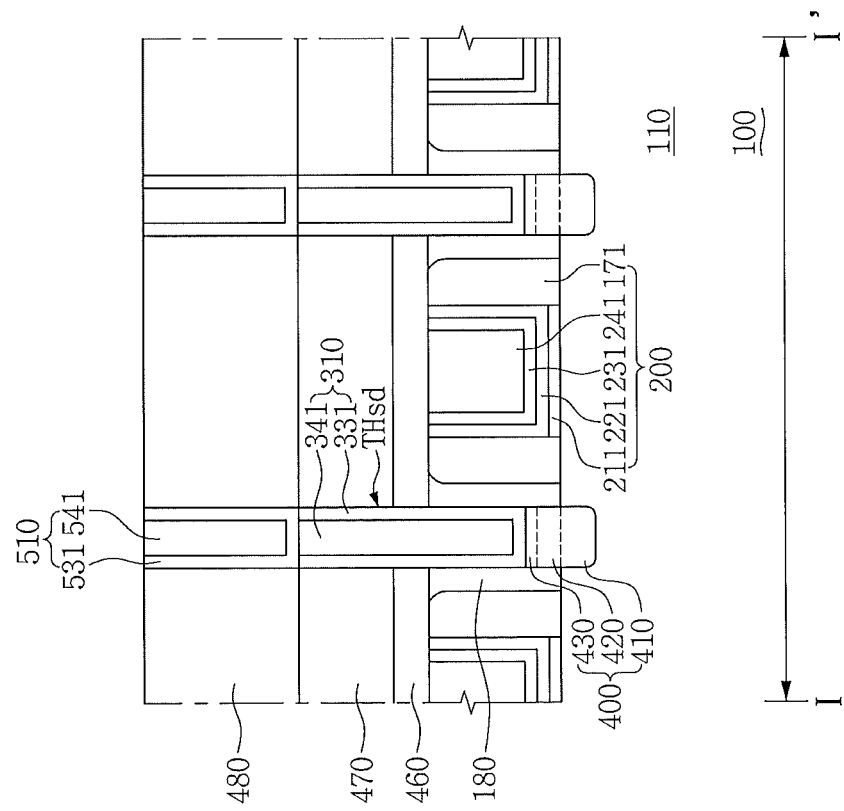
Figure 24B:
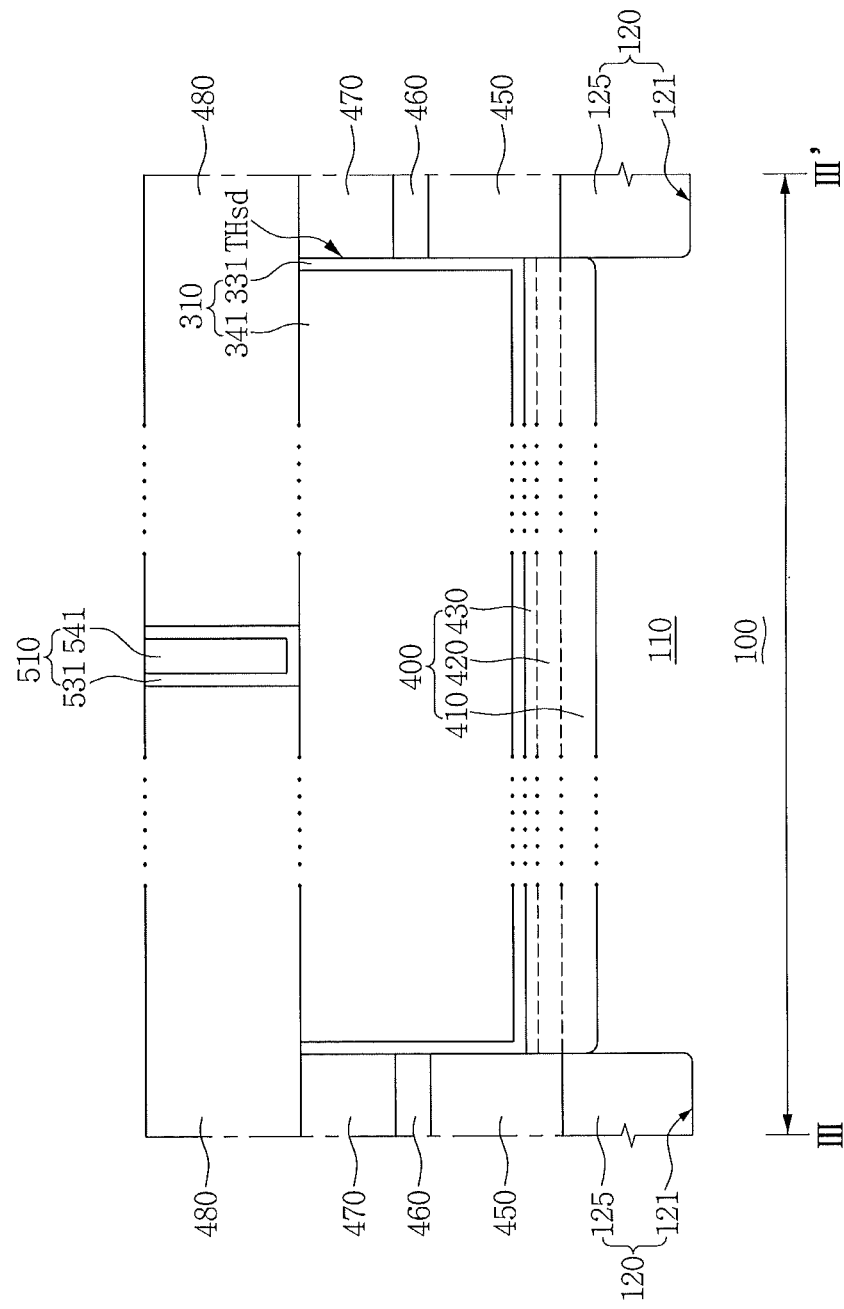
Figure 24C:
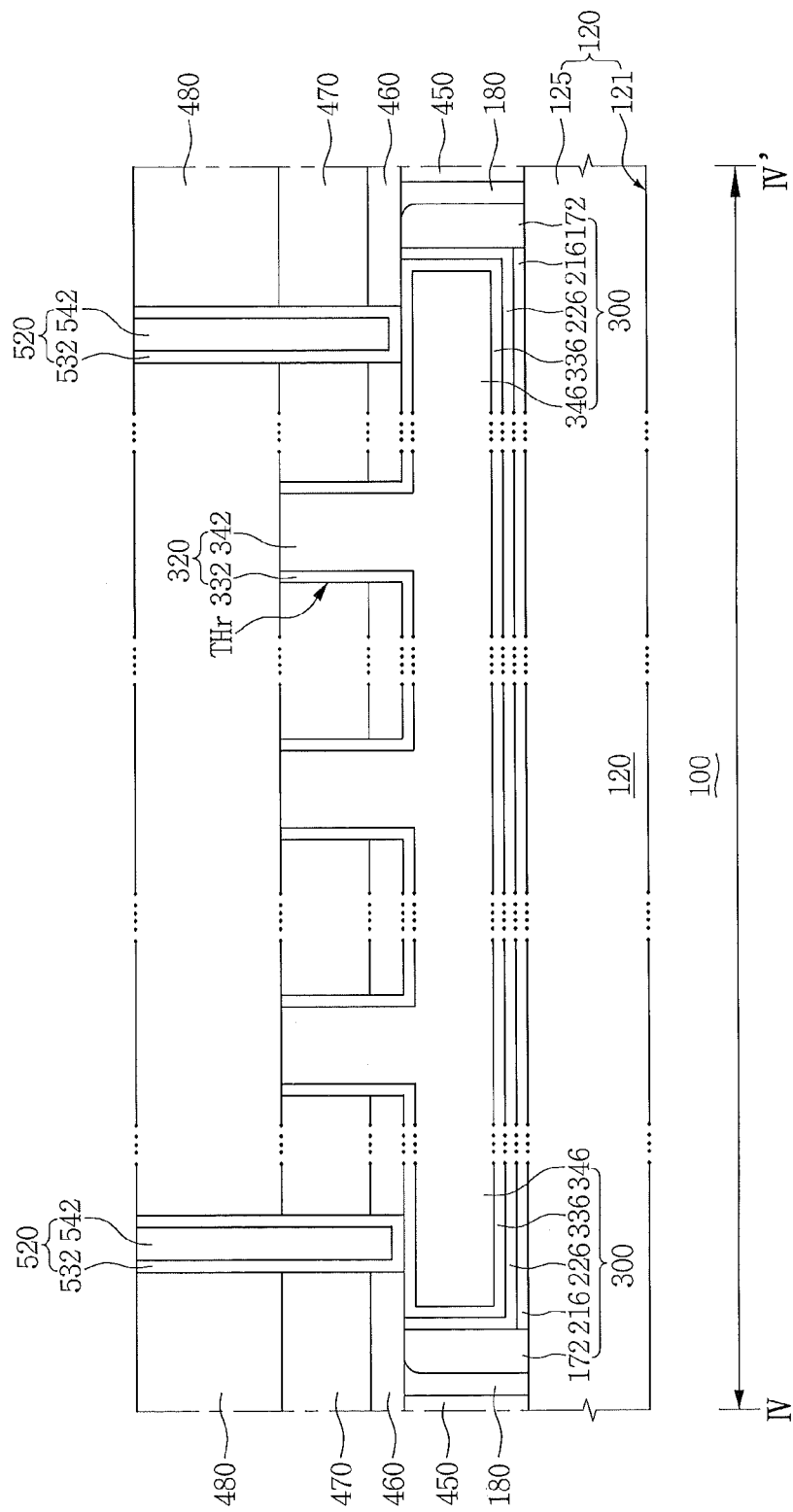
Figure 24D:
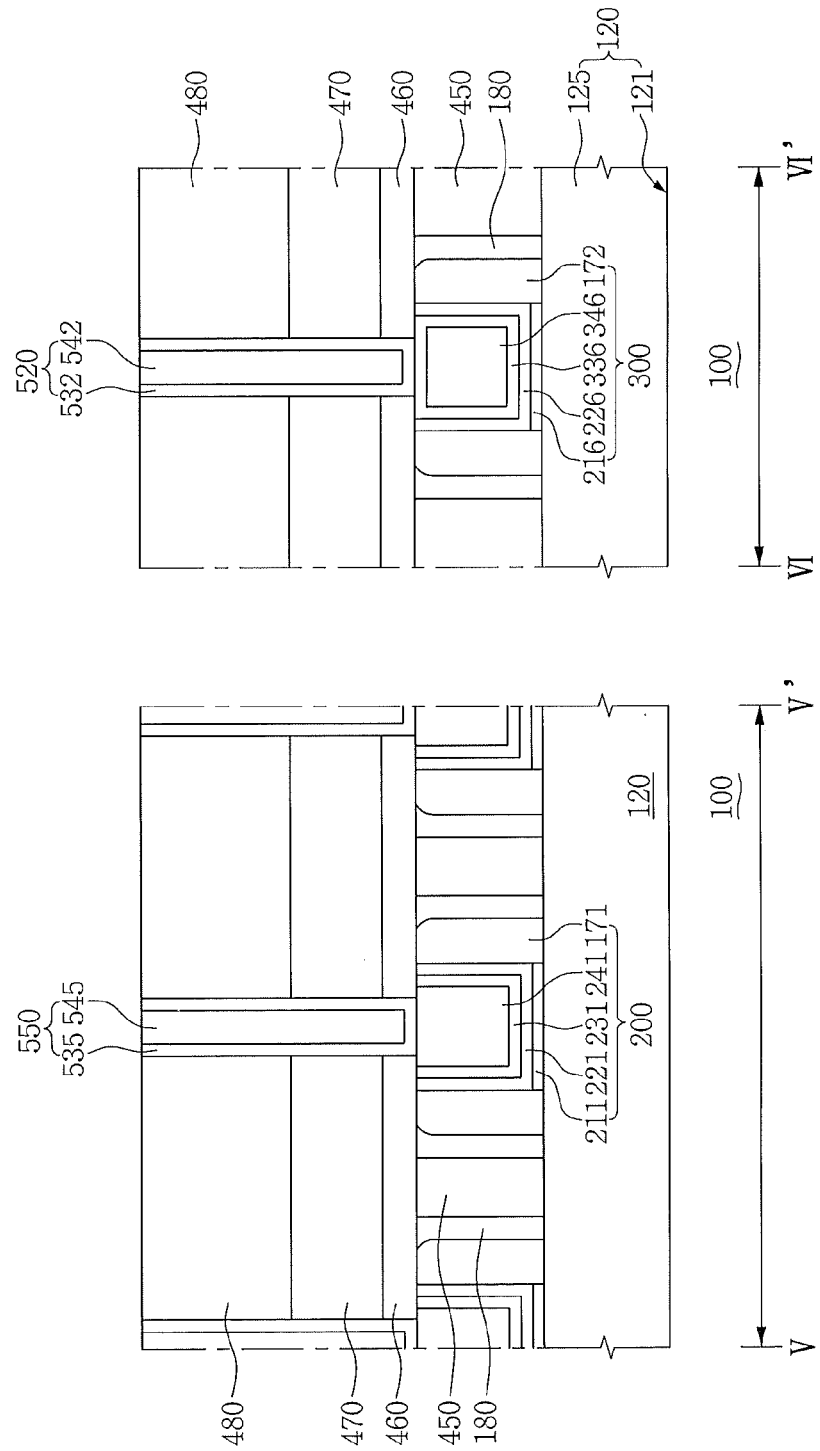

Referring to FIGS. 20A through 20C, the method may include forming a second barrier material layer 330 and a second electrode material layer 340 to fill the source/drain trench holes THsd, the resistive spaces SR, and the resistive trench holes THr. The forming the second barrier material layer 330 may include conformally forming titanium, titanium nitride, tantalum, tantalum nitride, titanium tungsten, or one of other barrier metals on inner walls of the resistive spaces SR and the trench holes THsd and THr using a deposition process. The forming the second electrode material layer 340 may include forming a metal layer including, such as tungsten, copper, nickel, cobalt, aluminum, titanium, tantalum, or one of various other metals, a metal silicide, such as tungsten silicide, titanium silicide, nickel silicide, or cobalt silicide, and/or a metal compound, such as a metal nitride, using a deposition process to fill the resistive spaces SR and the trench holes THsd and THr.

Referring to FIGS. 21A through 21D, the method may include forming a resistive structure 300, a source/drain trench plug 310, and a resistive trench plug 320 using a planarization process, such as a CMP process, and forming an upper interlayer insulating layer 480. The second barrier material layer 330 may be modified into a source/drain trench barrier layer 331, a resistive trench barrier layer 332, and a resistive barrier layer 336. The second electrode material layer 340 may be modified into a source/drain electrode 341, a resistive trench electrode 342, and a resistive electrode 346. The resistor structure 300 may include a resistive insulating layer 226, a resistive barrier layer 336, and a resistive electrode 346 formed on the field region 120. The resistor structure 300 may further include resistive spacers 172. The resistor structure 300 may further include the resistive surface insulating layer 216. The source/drain trench plug 310 may include the source/drain trench barrier layer 331 and the source/drain trench electrode 341. The resistive trench plug 320 may include the resistive trench barrier layer 332 and the resistive trench electrode 342. The resistive trench barrier layer 332 and the resistive barrier layer 336 may be formed concurrently through a process and may be contiguous with each other. The resistive trench electrode 342 and the resistive electrode 346 may be formed concurrently through a process and may be contiguous with each other. The upper interlayer insulating layer 480 may include silicon oxide.

Referring to FIGS. 22A through 22D, the method may include forming a source/drain contact hole CHsd, a resistive contact hole CHr, and a gate contact hole CHg. The source/drain contact hole CHsd may vertically penetrate the upper interlayer insulating layer 480 and expose a top surface of the source/drain trench plug 310. The resistive contact hole CHr may vertically penetrate the upper interlayer insulating layer 480, the middle interlayer insulating layer 470, and the buffer interlayer insulating layer 460, and expose the resistive barrier layer 336. The gate contact hole CHg may vertically penetrate the upper interlayer insulating layer 480, the middle interlayer insulating layer 470, and the buffer interlayer insulating layer 460, and expose the gate electrode 241.

Referring to FIGS. 23A through 23D, the method may include forming a contact barrier material layer 530 and a contact electrode material layer 540 within the source/drain contact hole CHsd, the resistive contact hole CHr, and the gate contact hole CHg. Forming the contact barrier material layer 530 may include conformally forming a layer including titanium, titanium nitride, tantalum, tantalum nitride, titanium tungsten, or one of other barrier metals on inner walls of the source/drain contact hole CHsd, the resistive contact hole CHr, and the gate contact hole CHg using a deposition process. Forming the contact electrode material layer 540 may include forming a layer including a metal, such as tungsten, copper, nickel, cobalt, aluminum, titanium, or tantalum, and/or a metal compound, such as a metal nitride, using a deposition process to fill the source/drain contact hole CHsd, the resistive contact hole CHr, and the gate contact hole CHg.

Referring to FIGS. 24A through 24D, the method may include forming a source/drain contact plug 510, a resistive contact plug 520, and a gate contact plug 550 using a planarization process, such as a CMP process. The contact barrier material layer 530 may be modified into a source/drain contact barrier layer 531, a resistive contact barrier layer 532, and a gate contact barrier layer 535. The contact electrode material layer 540 may be modified into a source/drain contact electrode 541, a resistive contact electrode 542, and a gate contact electrode 545. Subsequently, the method may include forming a capping insulating layer 490 with further reference to FIGS. 2A through 2D.

FIGS. 25A-25C, 26A-26C, 27A-27C, 28A-28C, 29A-29D, 30A-30D, 31A-31D and 32A-32D are cross-sectional views taken along the lines of FIG. 1B illustrating intermediate structures provided in operations of forming a semiconductor device according to some embodiments of the present inventive concept. For example, FIGS. 25A, 26A, 27A, 28A, 29A, 30A, 31A and 32A are cross-sectional views taken along the lines VII-VII' and VIII-VIII' of FIG. 1B, FIGS. 25B, 26B, 27B, 28B, 29B, 30B, 31B and 32B are cross-sectional views taken along the line IX-IX' of FIG. 1B, and FIGS. 25C, 26C, 27C, 28C, 29C, 30C, 31C and 32C are cross-sectional views taken along the line X-X' of FIG. 1B, and FIGS. 29D, 30D, 31D and 32D are cross-sectional views taken along the lines XI-XI' and XII-XII' of FIG. 1B.

Figure 25A:
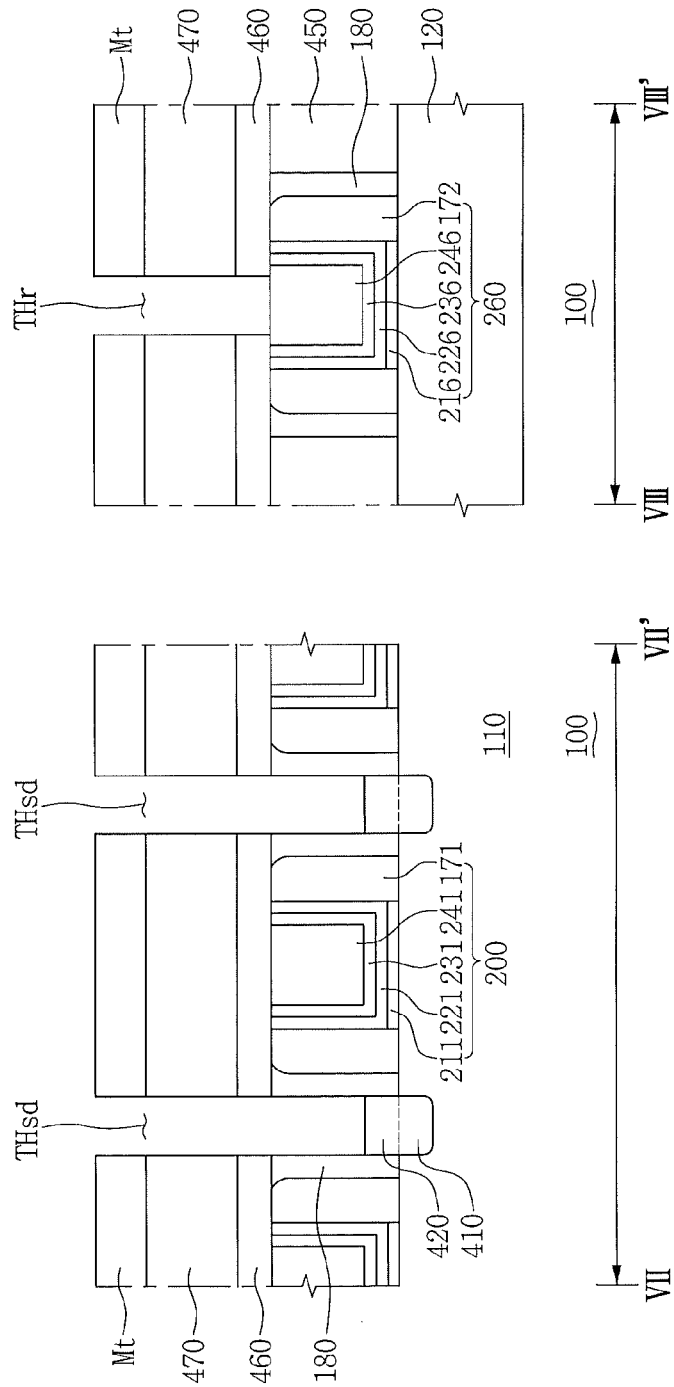
FIGS. 25A-25C, 26A-26C, 27A-27C, 28A-28C, 29A-29D, 30A-30D, 31A-31D and 32A-32D are cross-sectional views taken along the lines of FIG. 1B illustrating intermediate structures provided in operations of forming a semiconductor device according to some embodiments of the present inventive concept.
Figure 25B:
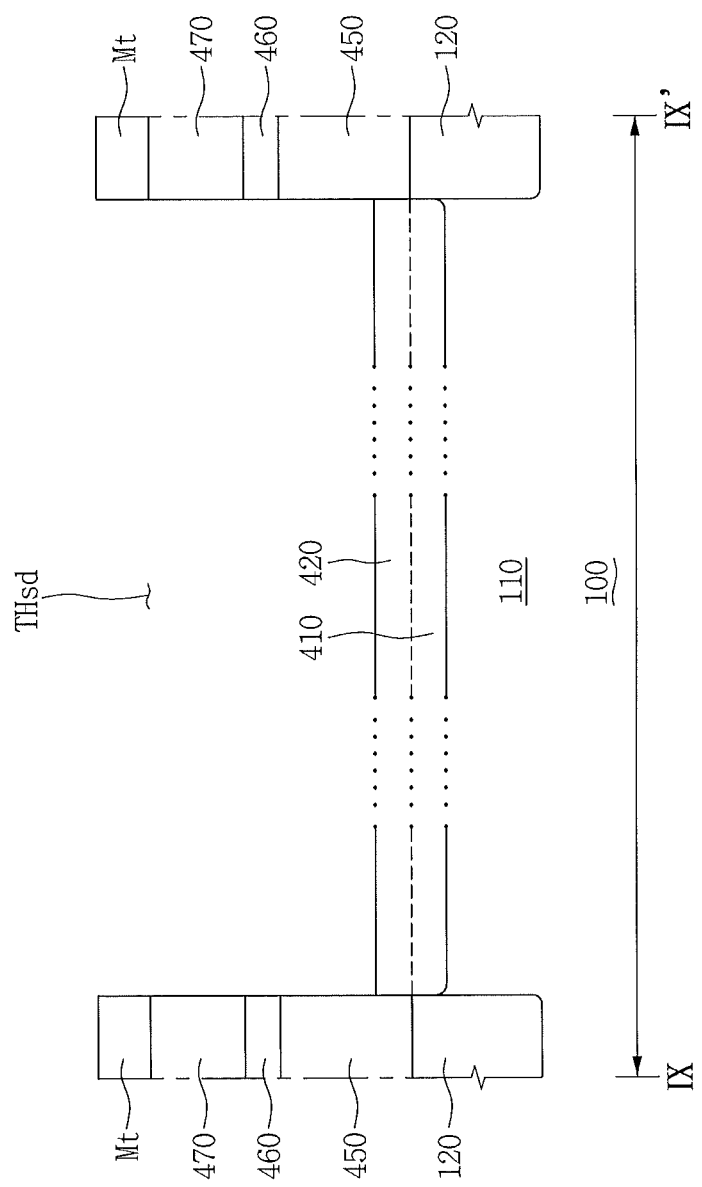
Figure 25C:
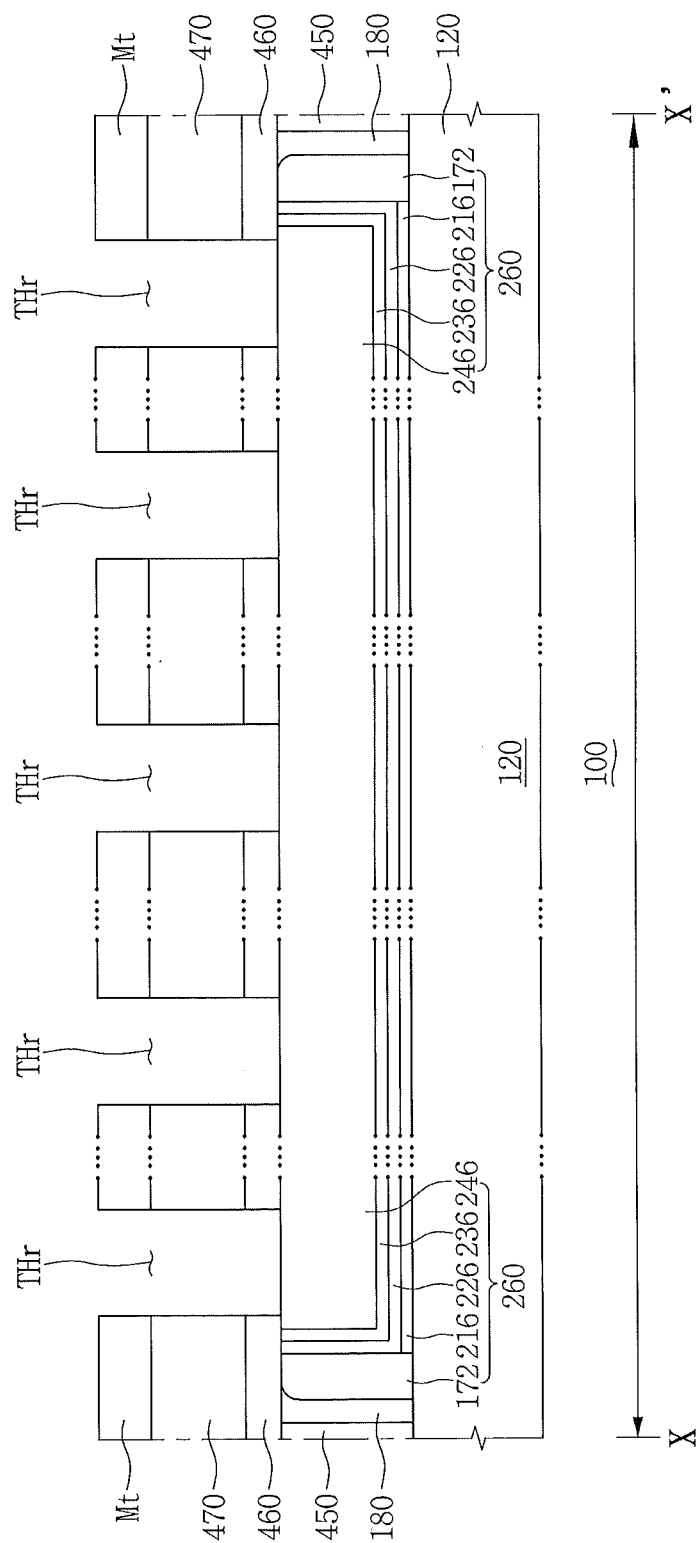

The method of manufacturing the semiconductor device may include performing the processes described with reference to FIGS. 4 through 16. Referring to FIGS. 25A through 25C, the method may include performing the processes described with reference to FIGS. 17A through 17C, specifically, forming a buffer interlayer insulating layer 460, a middle interlayer insulating layer 470, and a trench mask pattern Mt on a gate structure 200, a third preliminary structure 260, and a lower interlayer insulating layer 450, and forming source/drain trench holes THsd exposing upper source/drain regions 420 and resistive trench holes THr exposing top surfaces of a preliminary resistive electrode 246 of the third preliminary structure 260. Referring further to FIG. 25C, the resistive trench holes THr may be further disposed in positions adjacent to both end portions of the third preliminary structure 260.

Figure 26A:
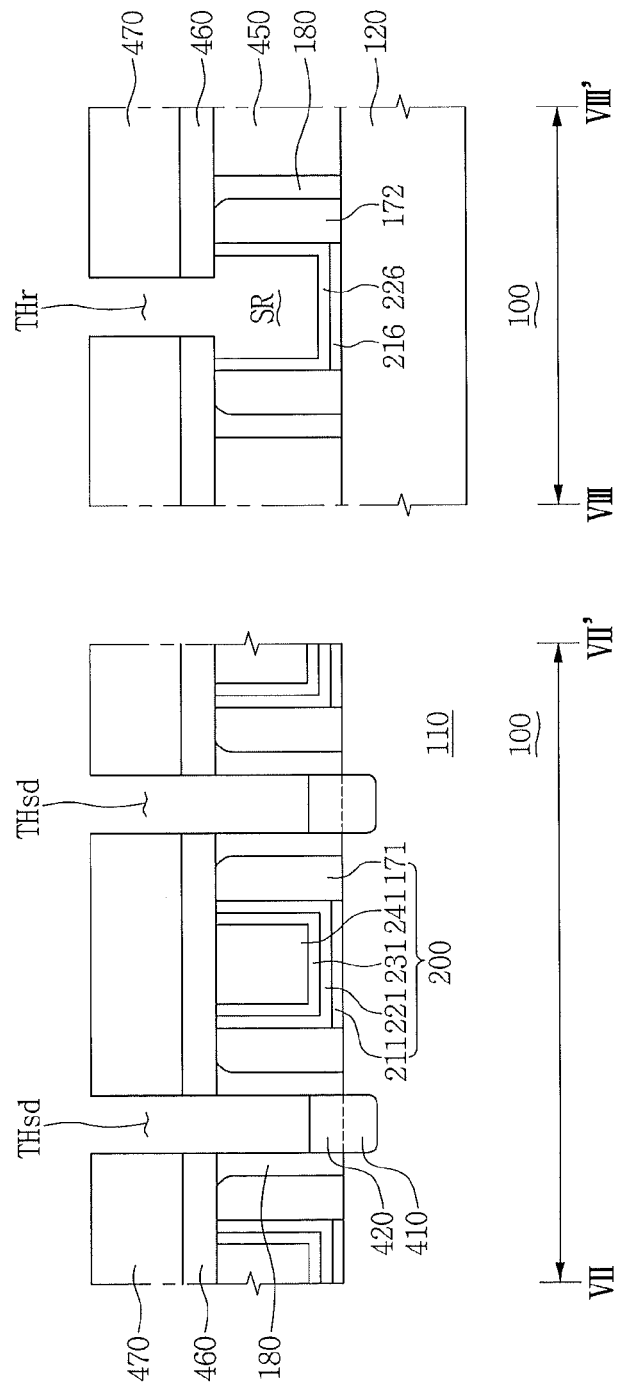
Figure 26B:
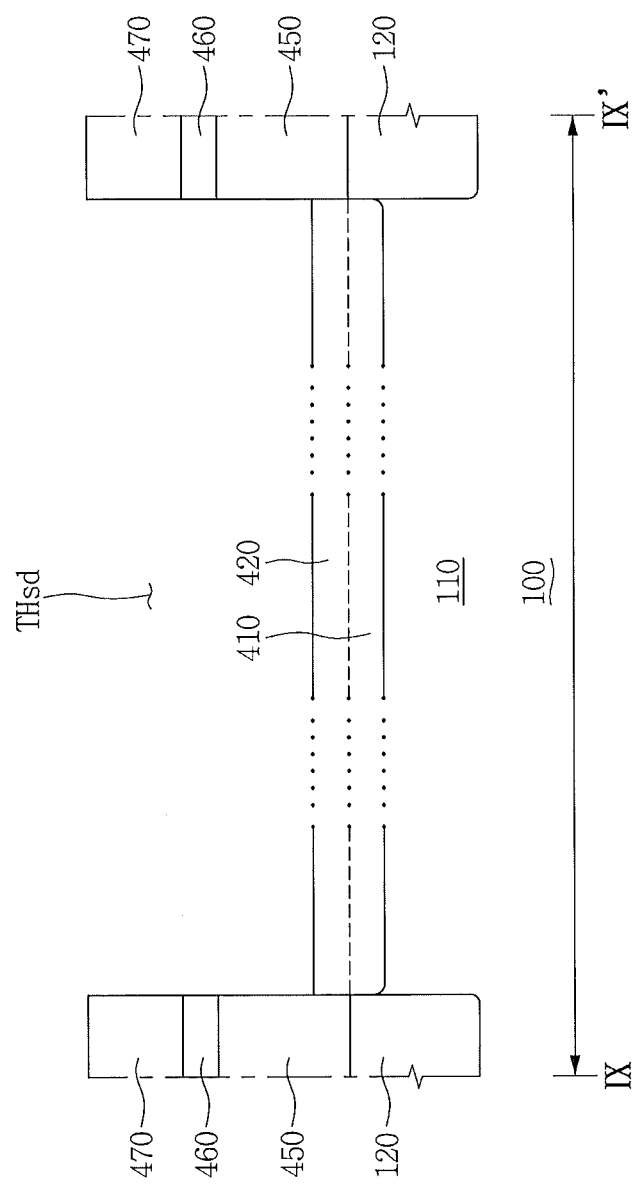
Figure 26C:
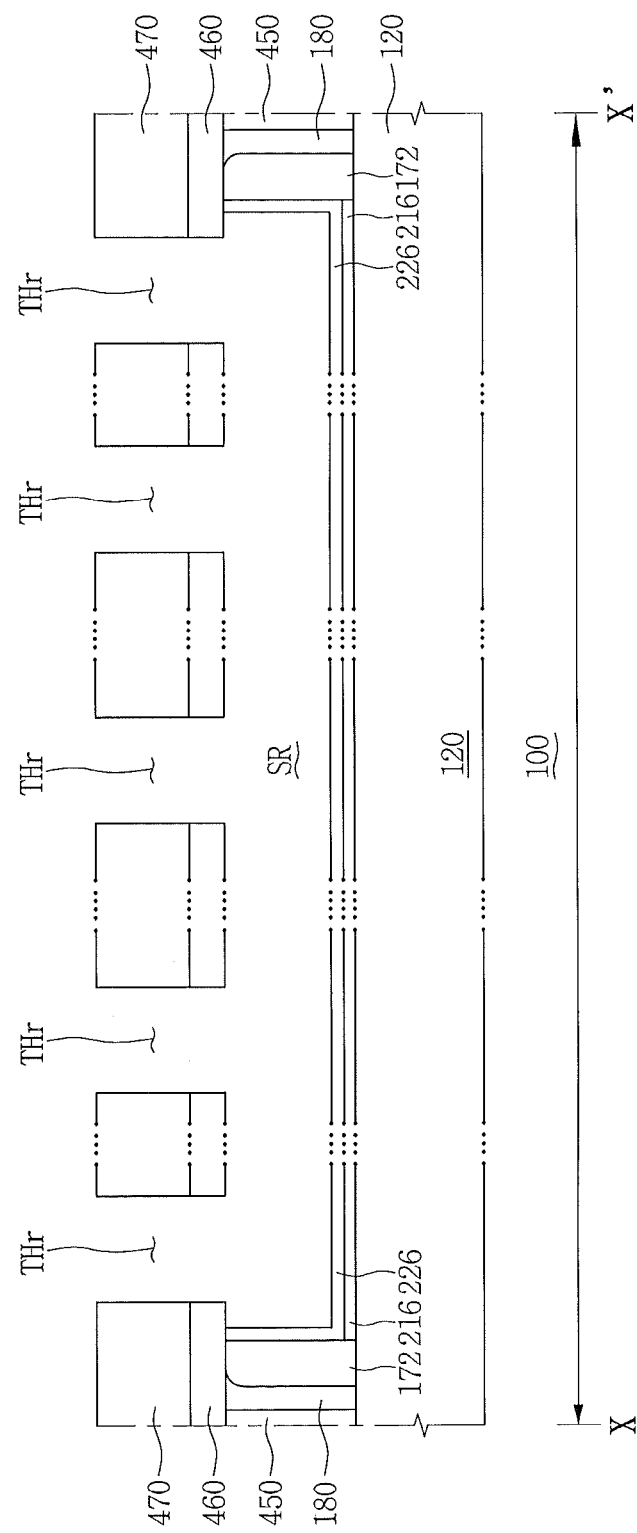

Referring to FIGS. 26A through 26C, the method may include performing the processes described with reference to FIGS. 18A through 18C, specifically, removing the preliminary resistive electrode 246 and a preliminary resistive barrier layer 236 of the third preliminary structure 260 through the resistive trench holes THr to form resistive spaces SR.

Figure 27A:
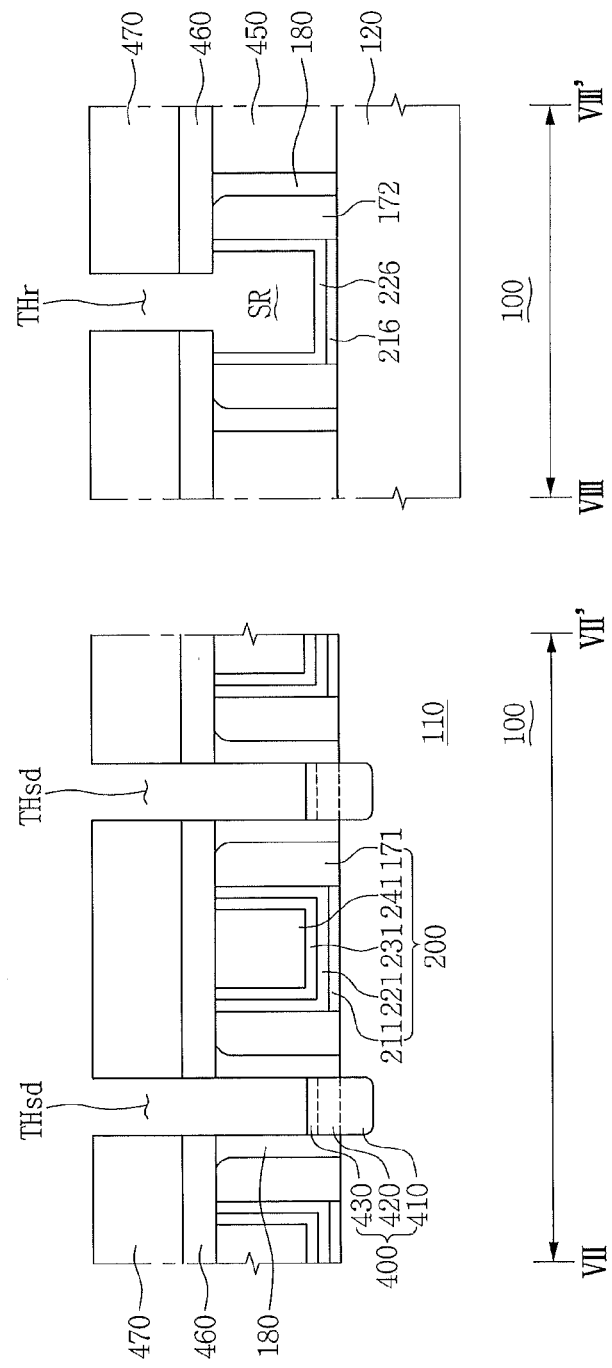
Figure 27B:
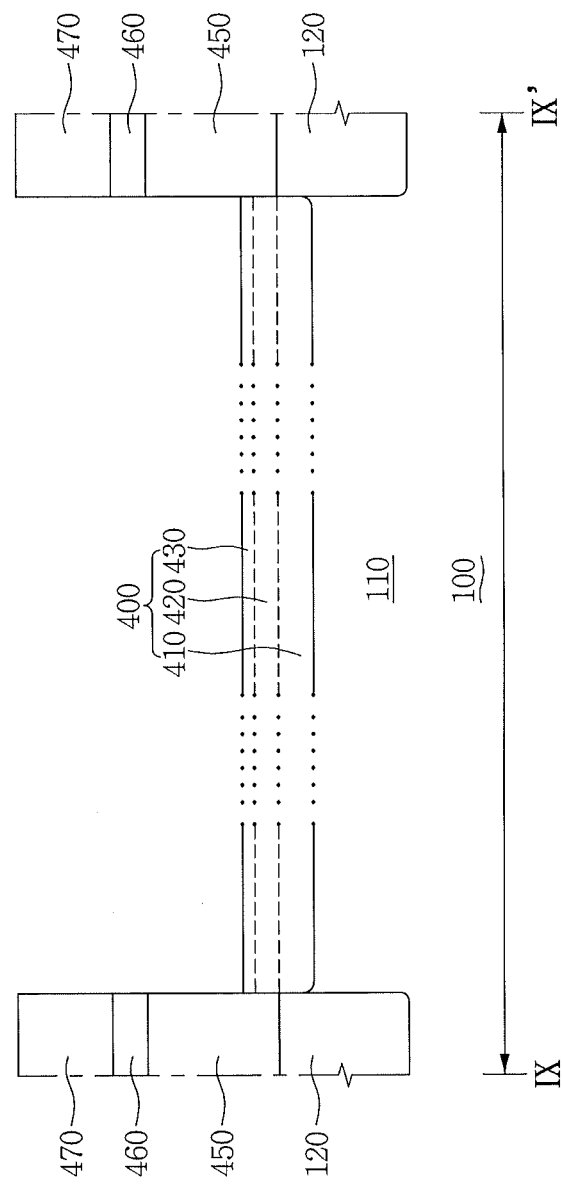
Figure 27C:
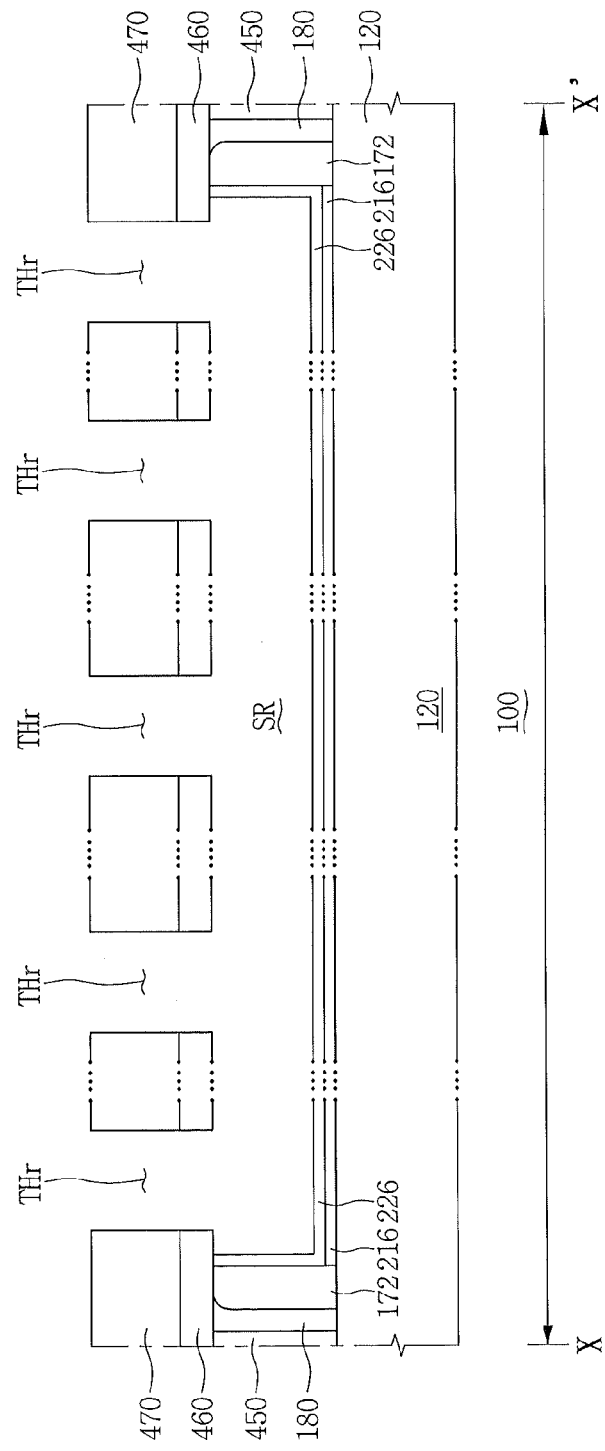

Referring to FIGS. 27A through 27C, the method may include performing the processes described with reference to FIGS. 19A through 19C, specifically, forming silicide regions 430 in the upper source/drain regions 420.

Figure 28A:
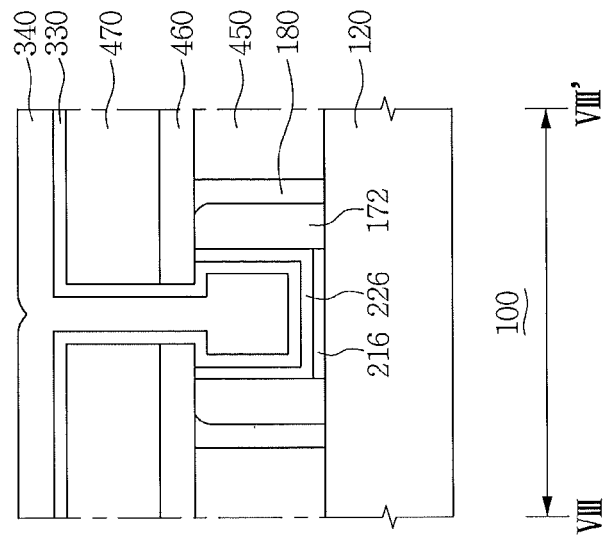
Figure 28A:
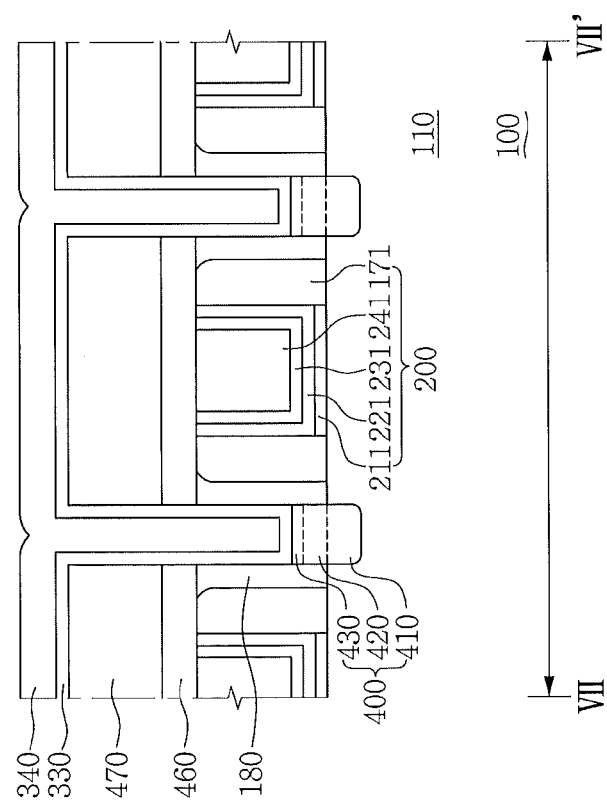
Figure 28B:
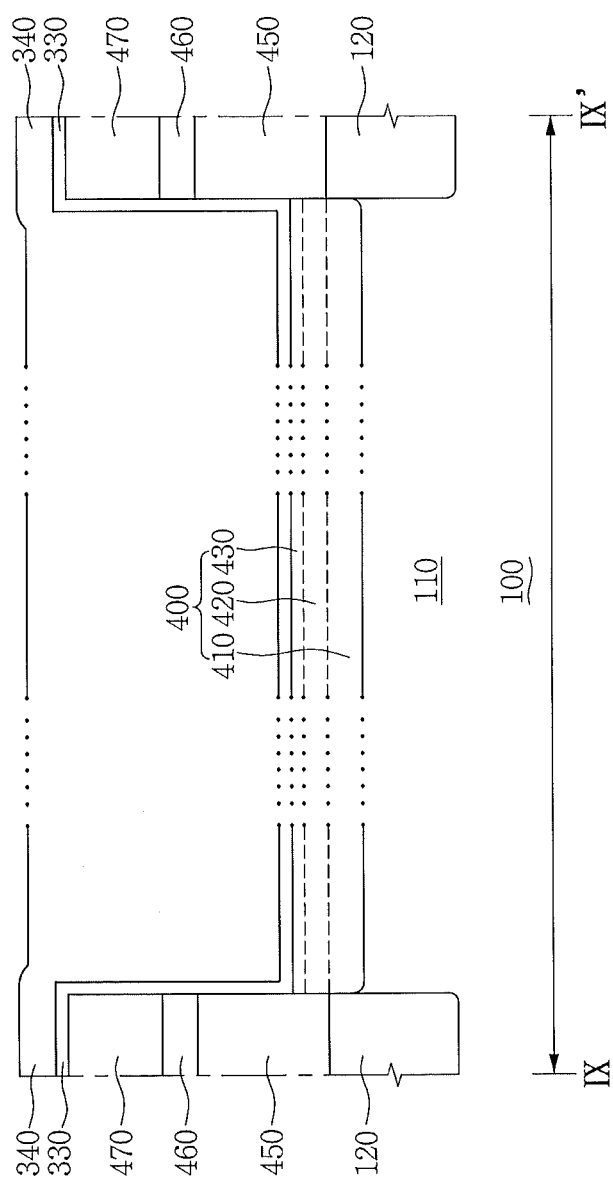
Figure 28C:
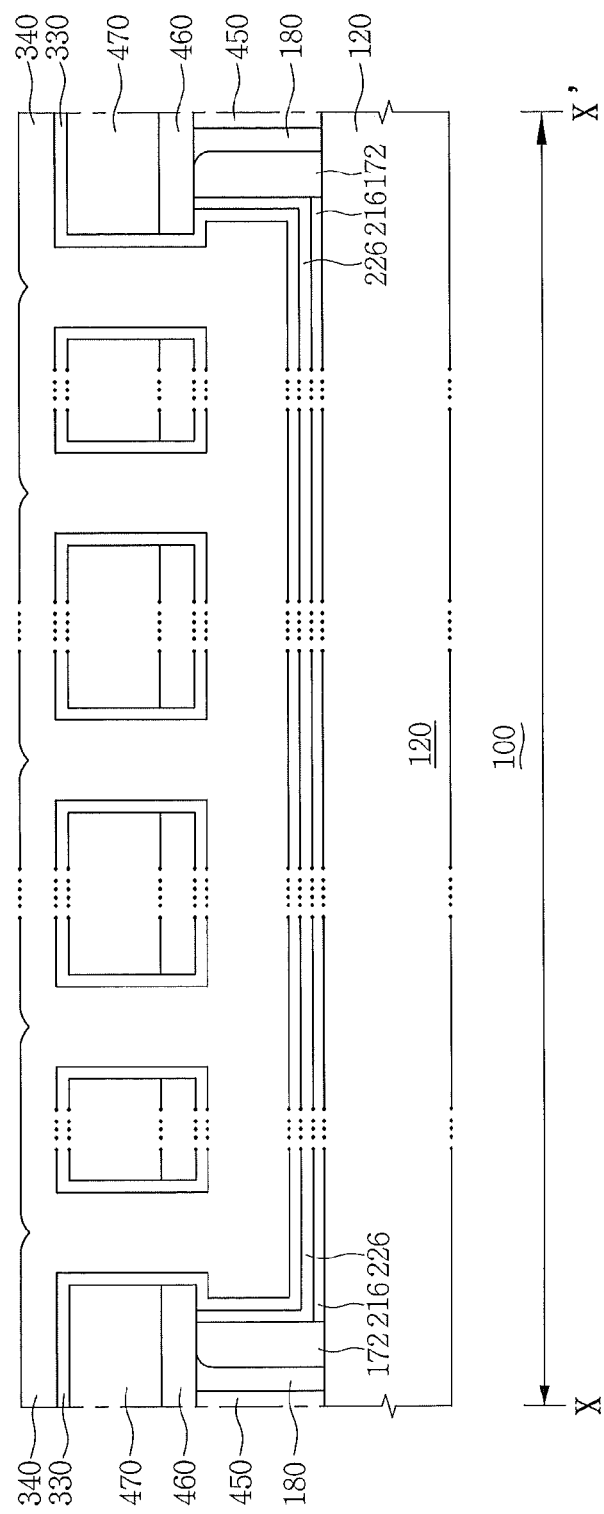

Referring to FIGS. 28A through 28C, the method may include performing the processes described with reference to FIGS. 20A through 20C, specifically, forming a second barrier material layer 330 and a second electrode material layer 340 to fill the source/drain trench holes THsd, the resistive spaces SR, and the resistive trench holes THr.

Figure 29A:
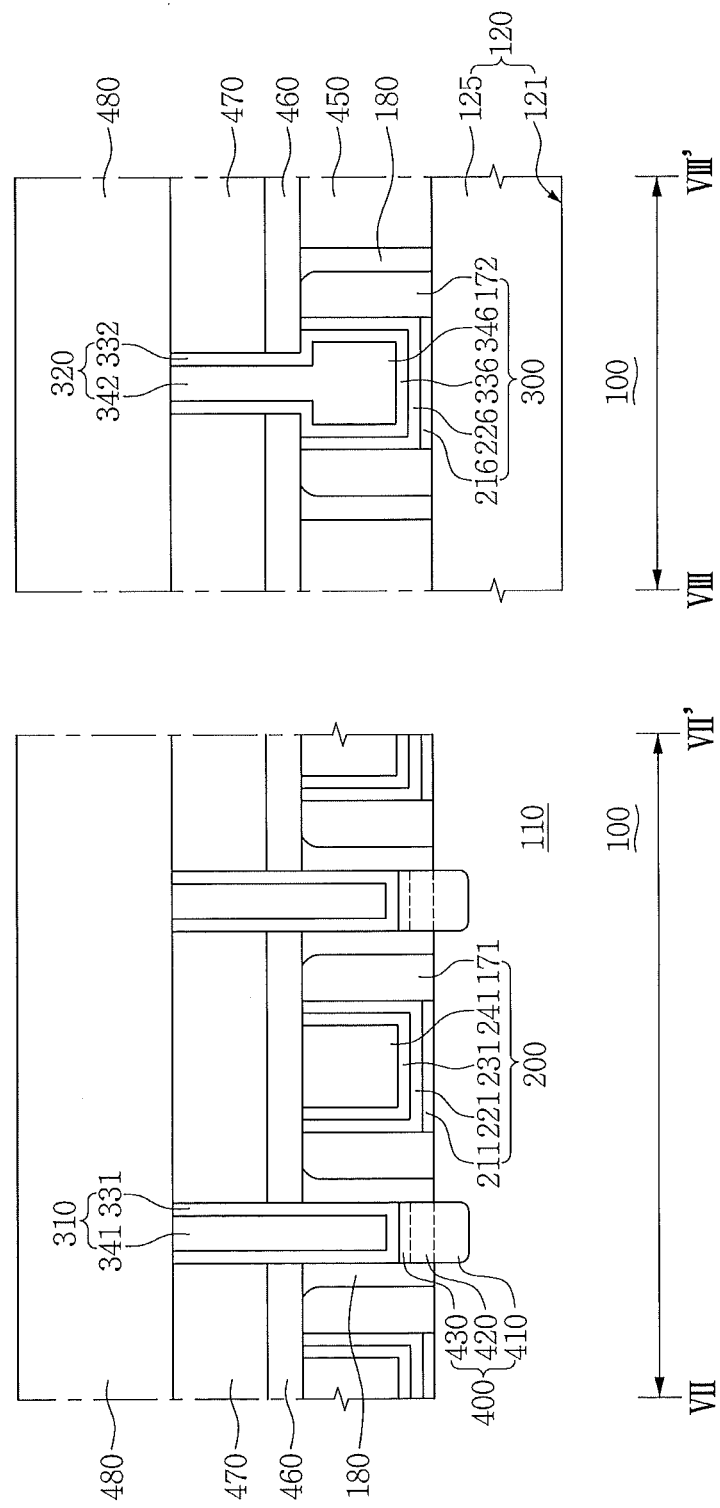
Figure 29B:
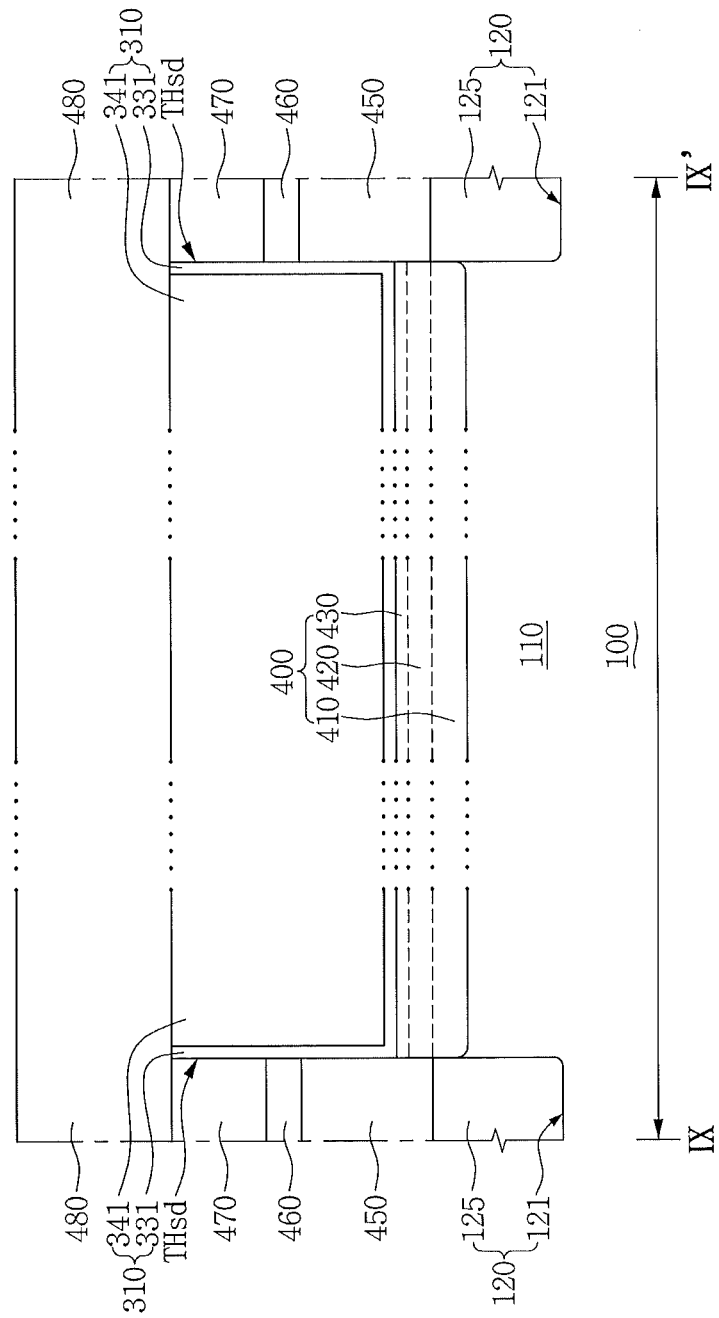
Figure 29C:
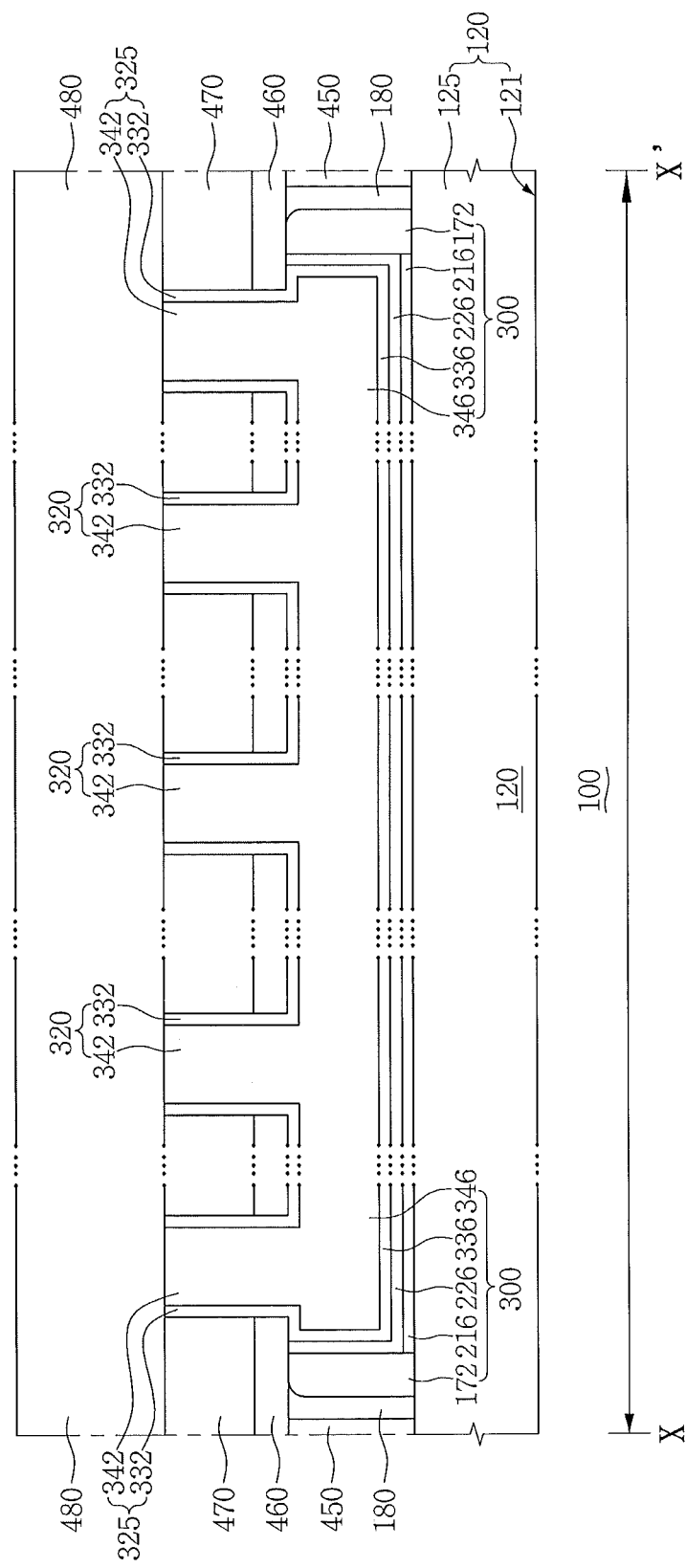
Figure 29D:
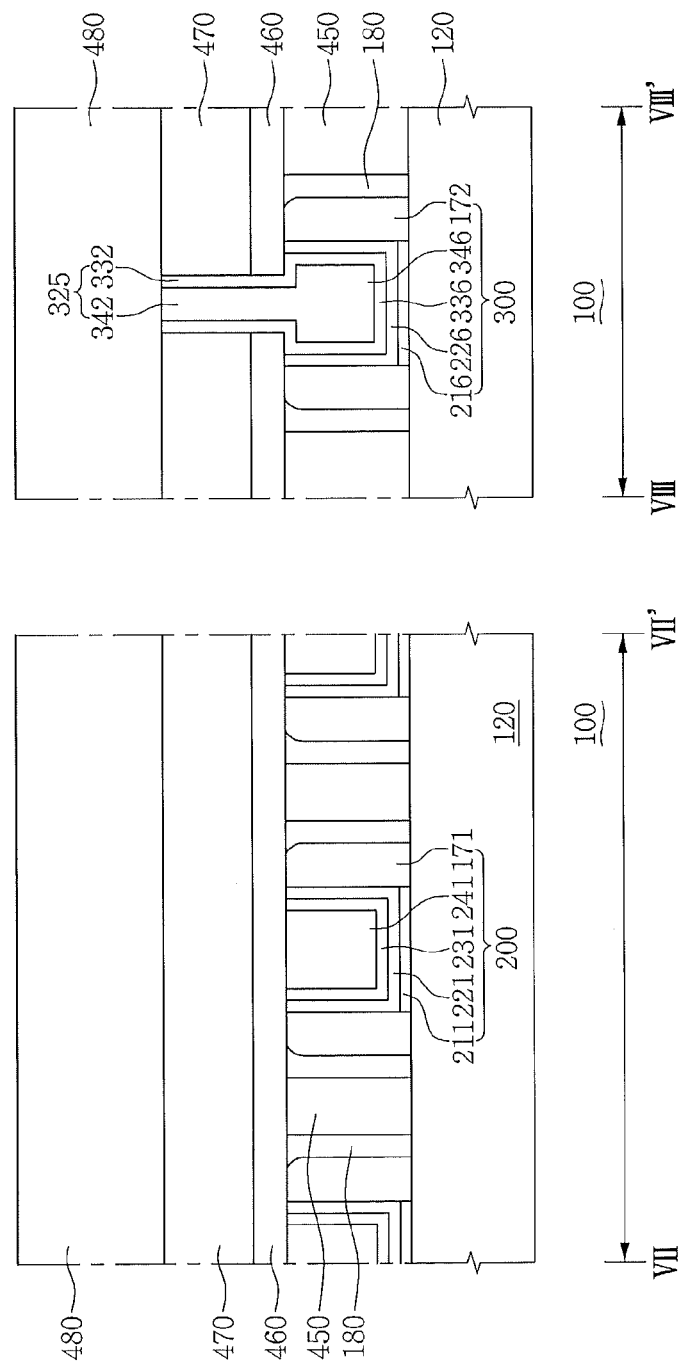

Referring to FIGS. 29A through 29D, the method may include performing the processes described with reference to FIGS. 21A through 21D, specifically, forming a resistor structure 300, a source/drain trench plug 310, and resistive trench plugs 320 and 325, and forming an upper interlayer insulating layer 480. Referring further to FIG. 29C, the resistive trench plugs 320 and 325 may include inner resistive trench plugs 320 disposed in a middle region of the resistor structure 300 or the resistive electrode 346 and outer resistive trench plugs 325.

Figure 30A:
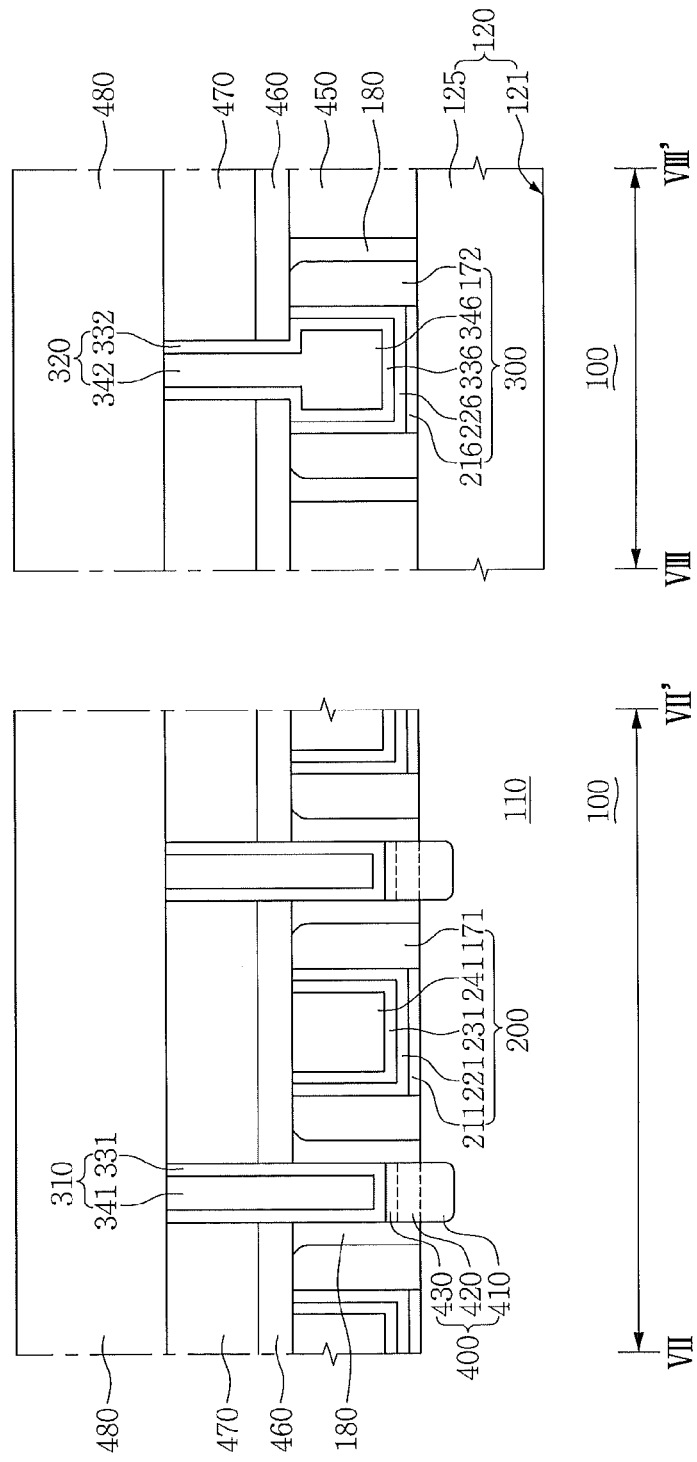
Figure 30B:
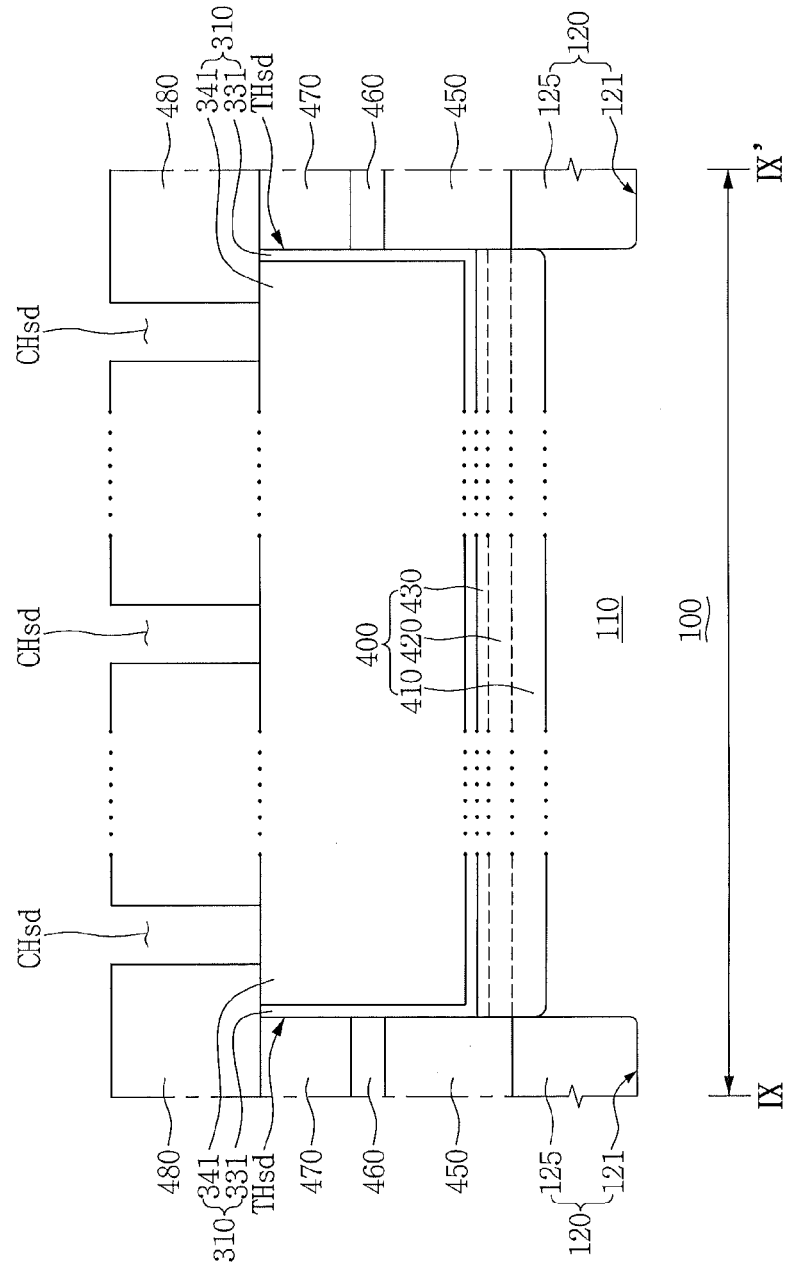
Figure 30C:
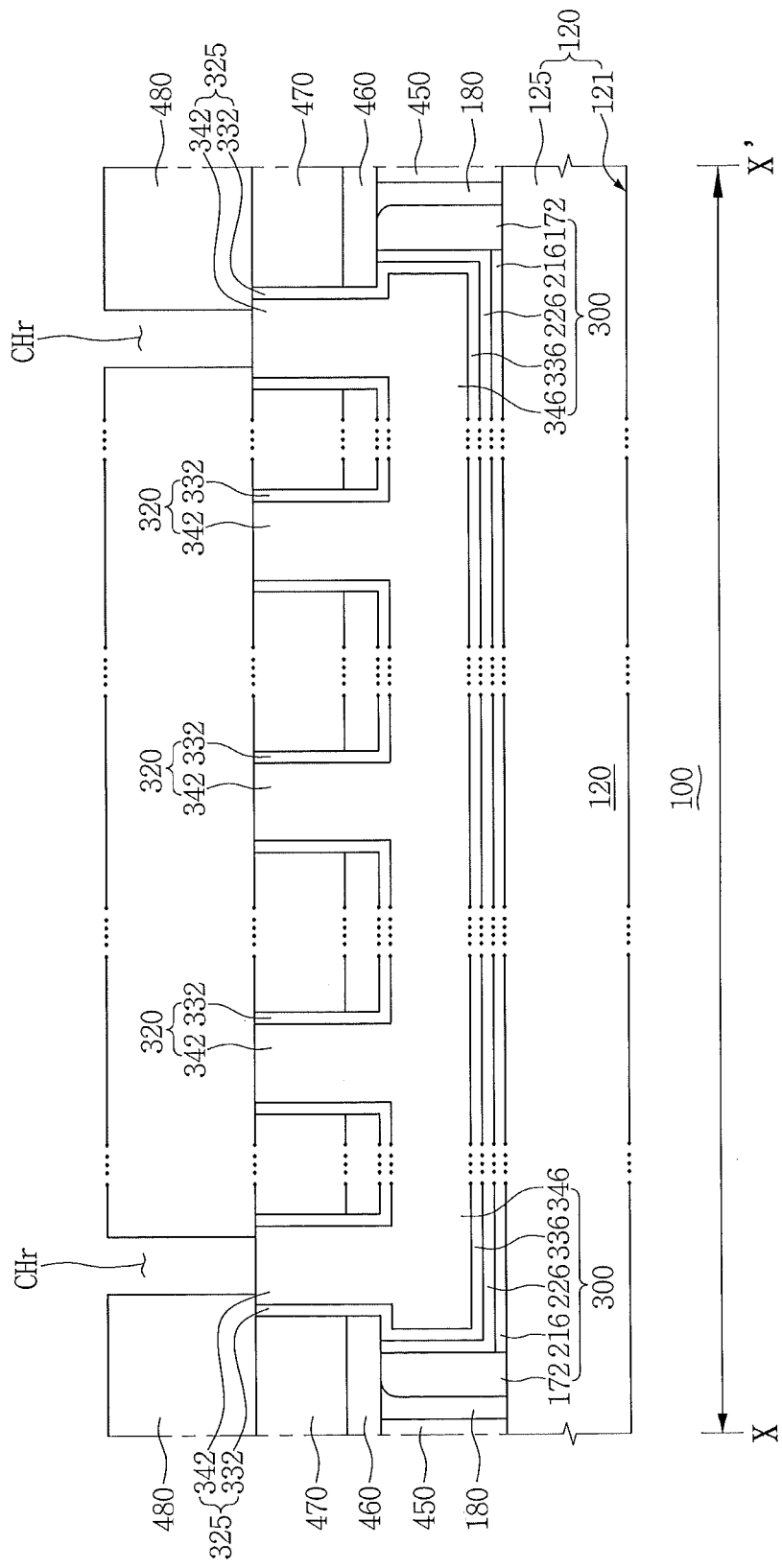
Figure 30D:
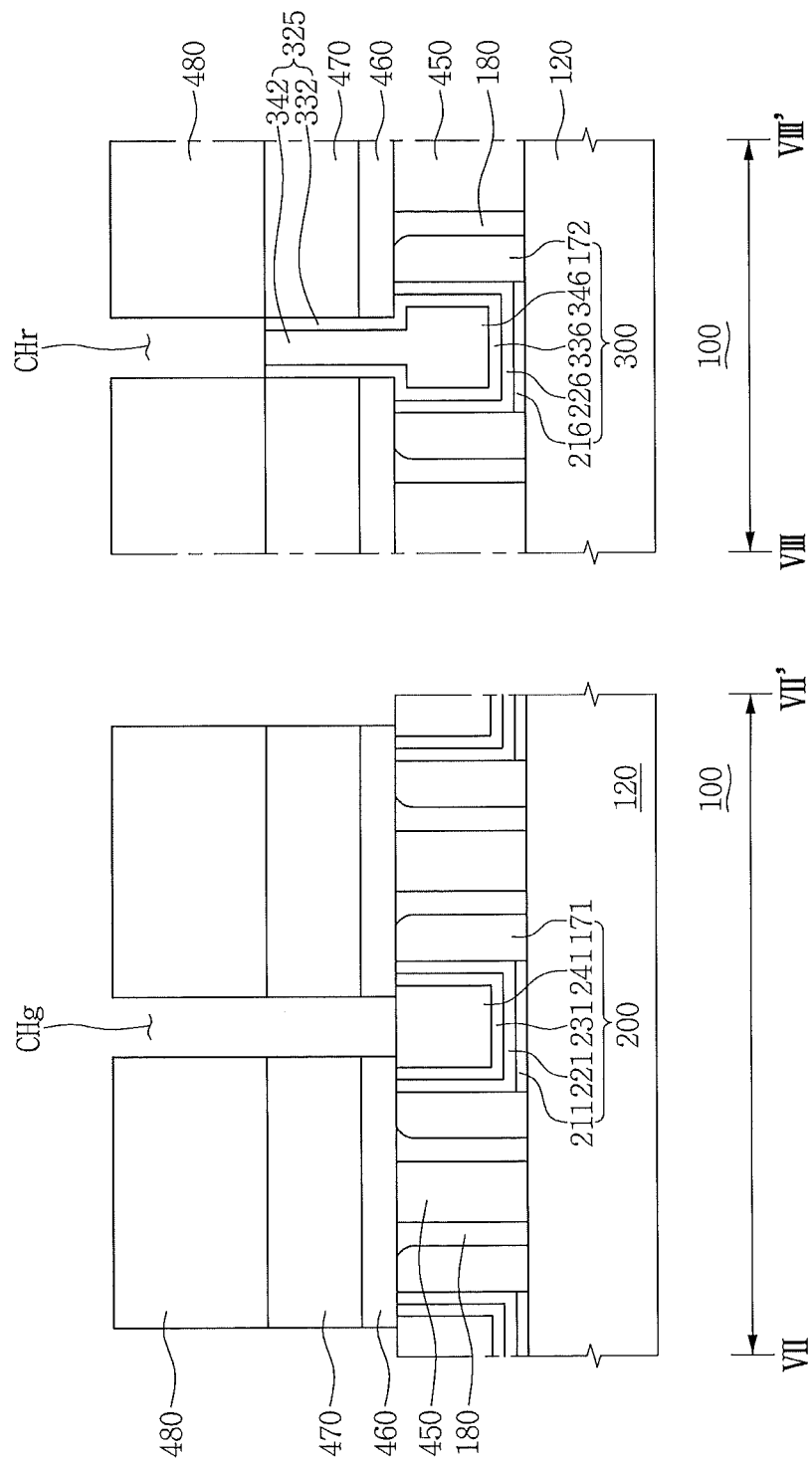
Figure 31A:
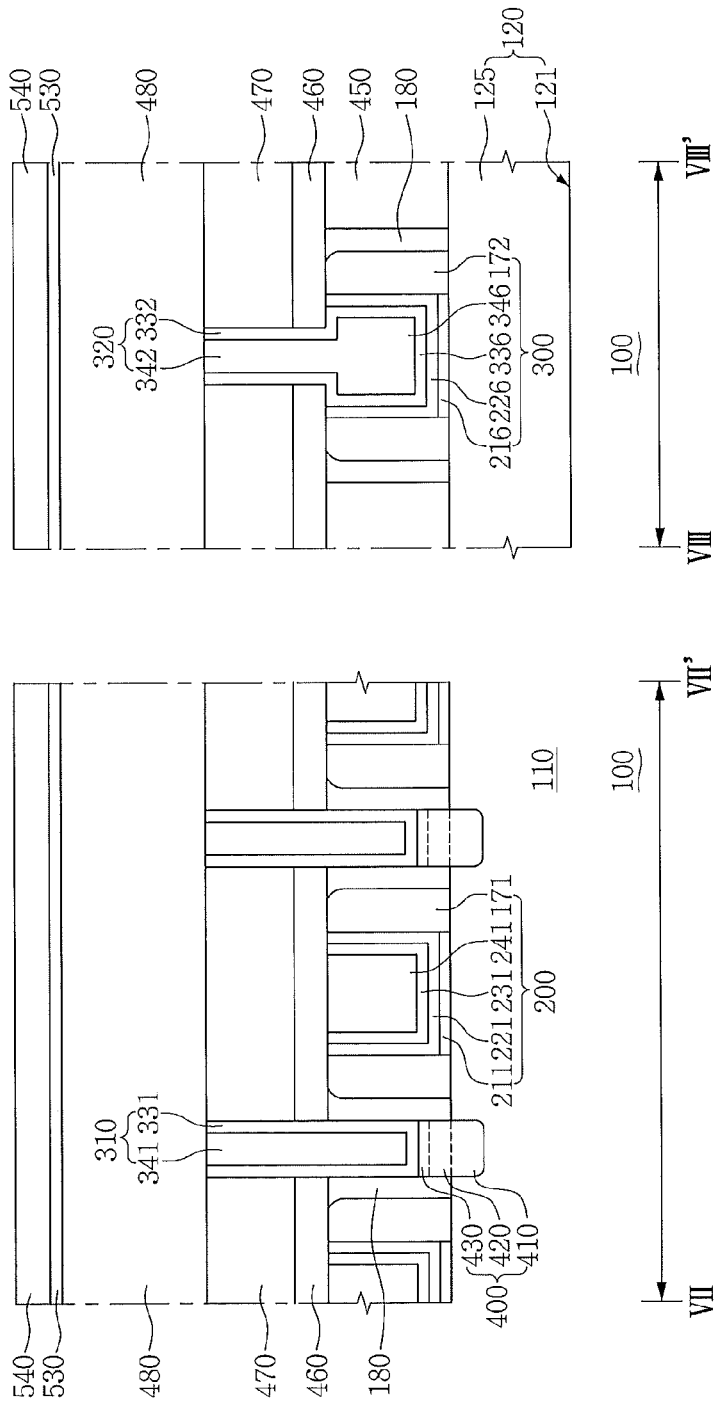
Figure 31B:
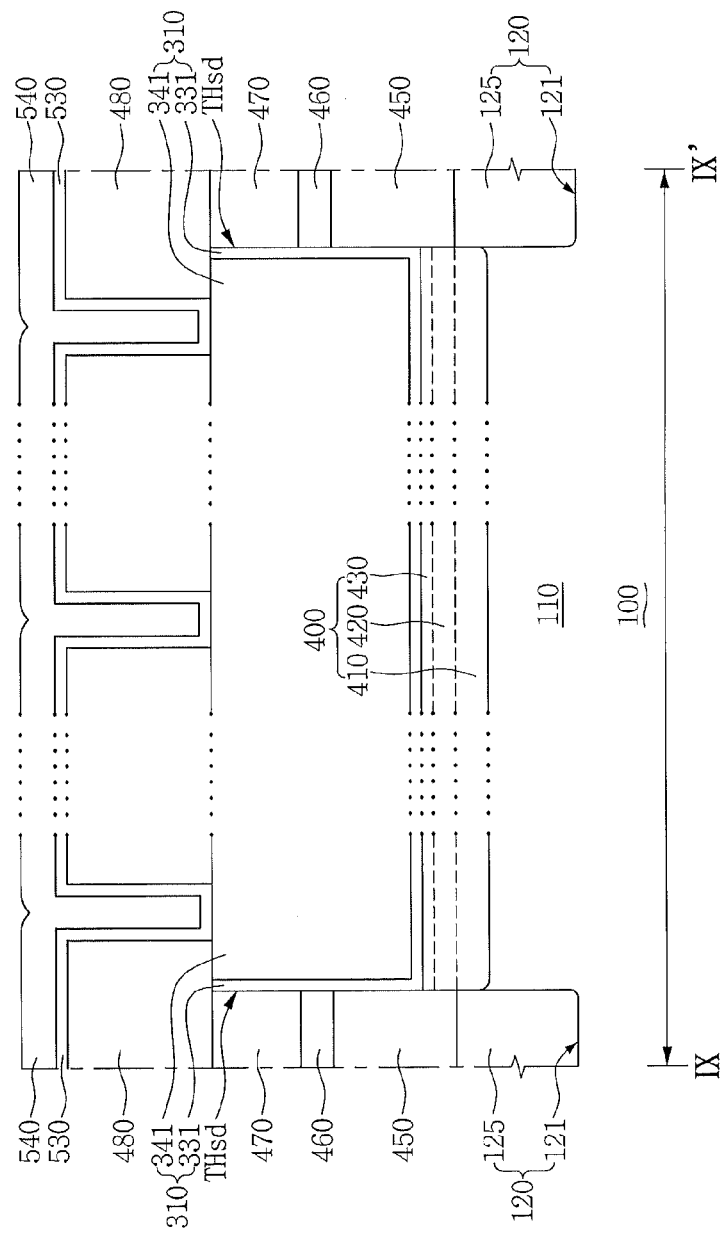
Figure 31C:
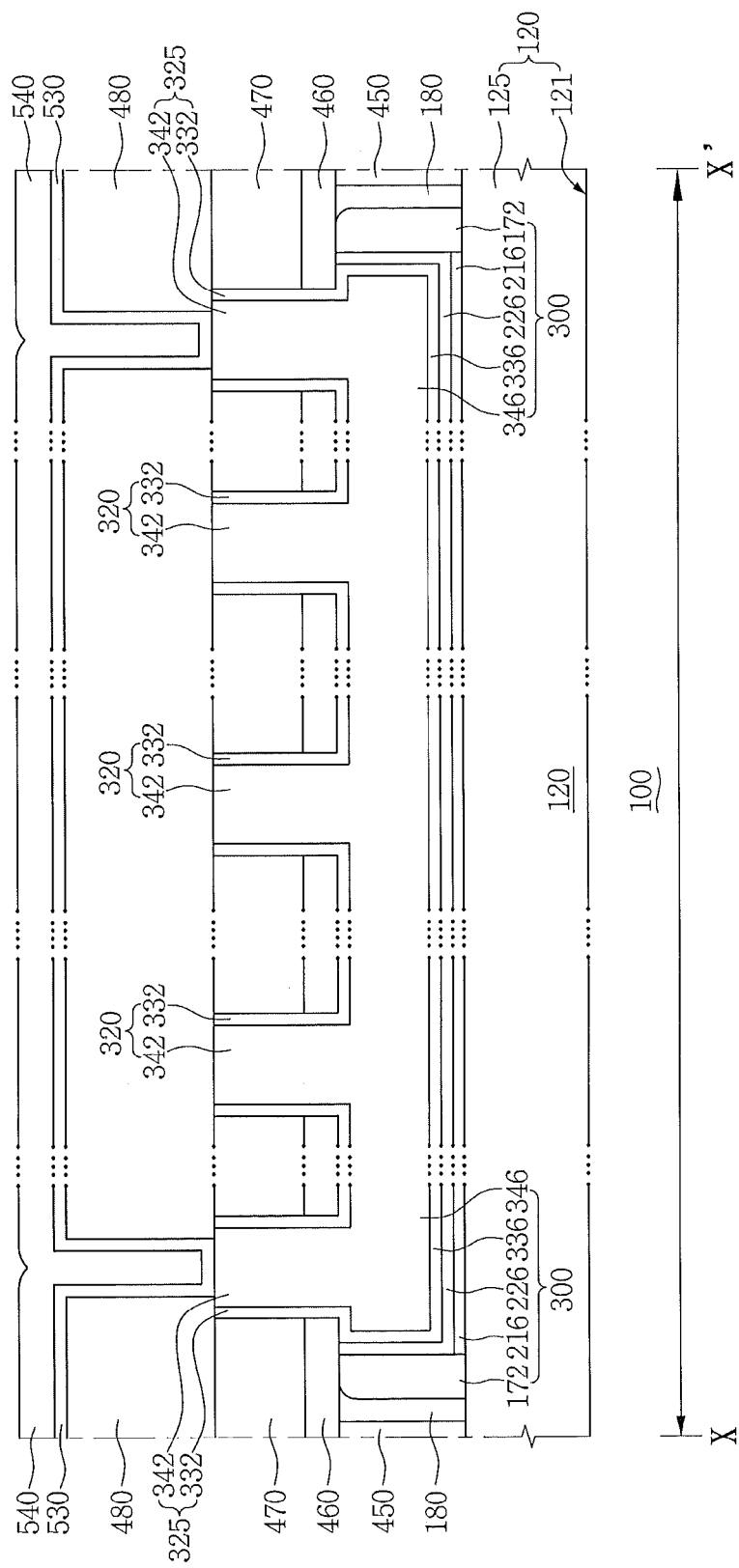
Figure 31D:
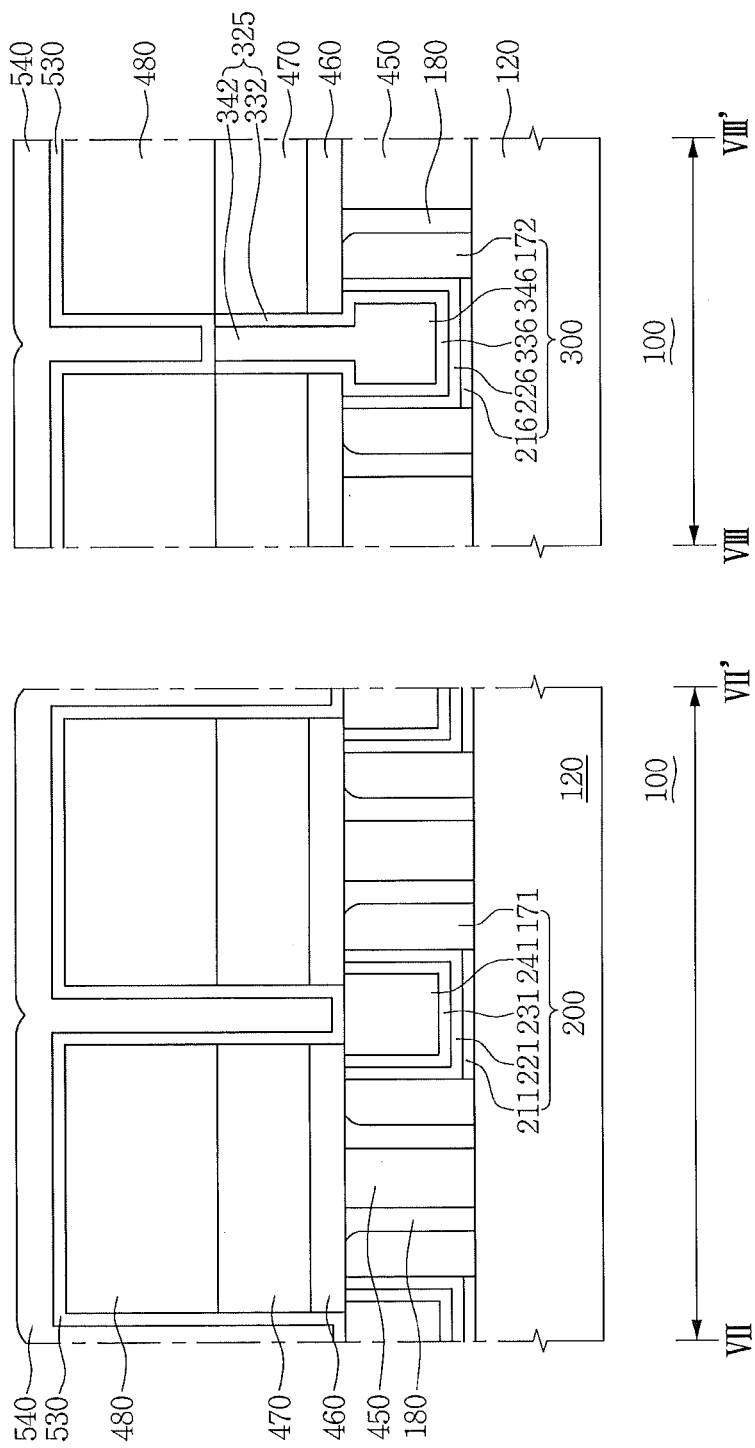

Referring to FIGS. 30A through 30D, the method may include performing the processes described with reference to FIGS. 22A through 22D, specifically, forming source/drain contact holes CHsd, resistive contact holes CHr, and gate contact holes CHg. Referring further to FIG. 30C, the resistive contact holes CHr may expose the outer resistive trench plug 325.

Referring to FIGS. 31A through 31D, the method may include performing the processes described with reference to FIGS. 23A through 23D, specifically, forming a contact barrier material layer 530 and a contact electrode material layer 540 within the source/drain contact holes CHsd, the resistive contact holes CHr, and the gate contact holes CHg.

Figure 32A:
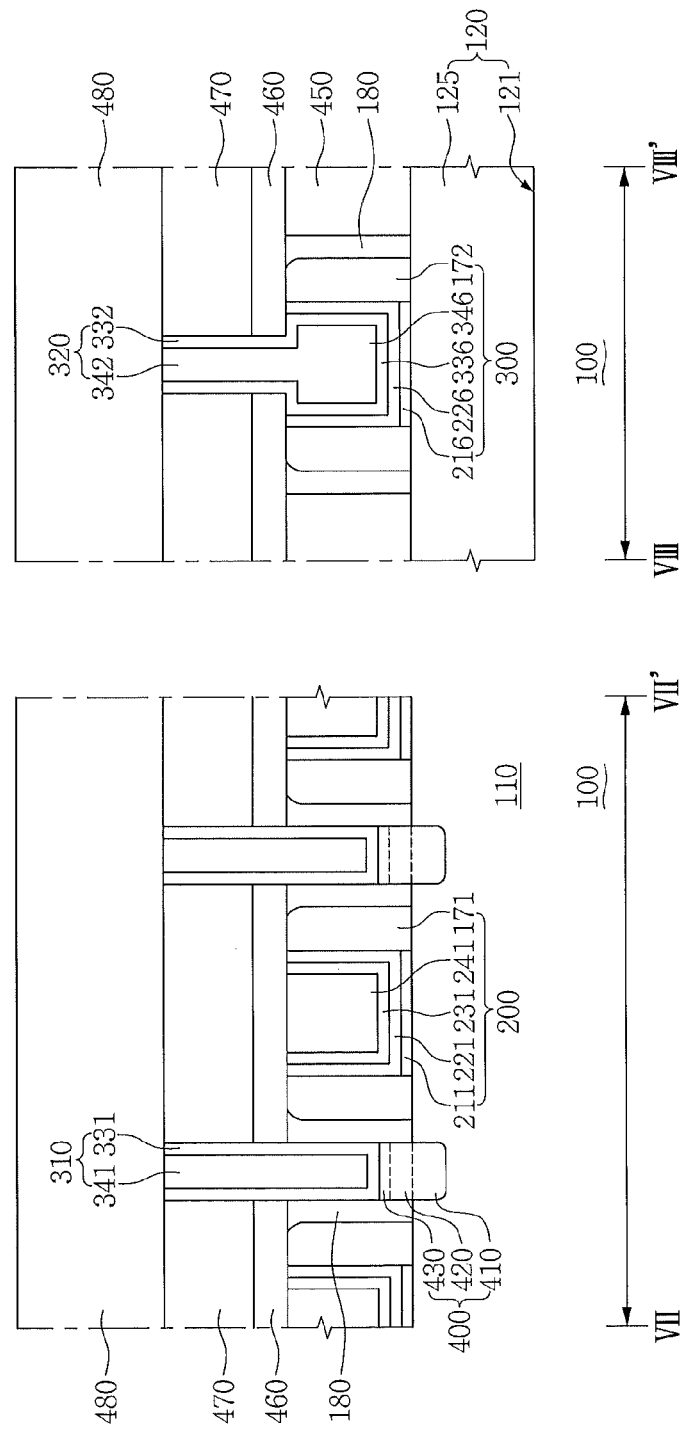
Figure 32B:
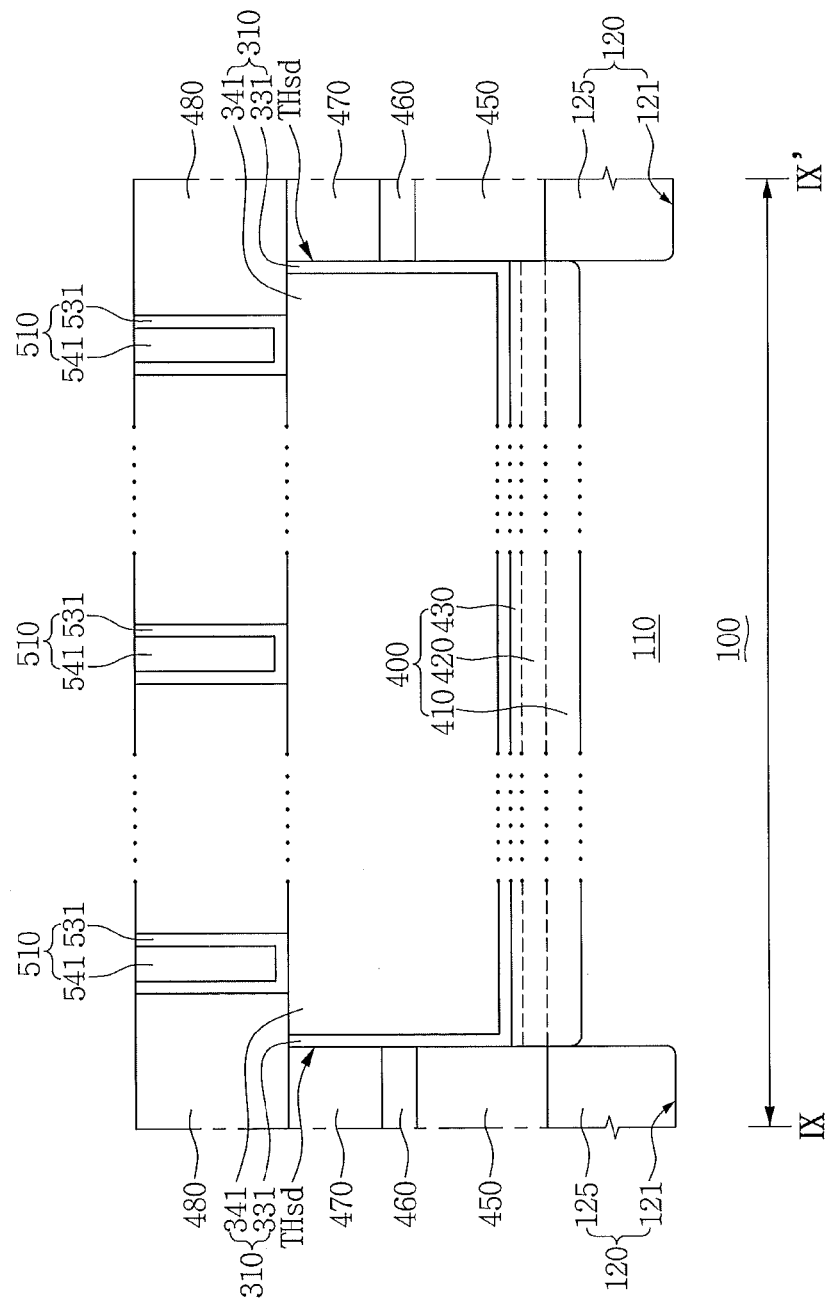
Figure 32C:
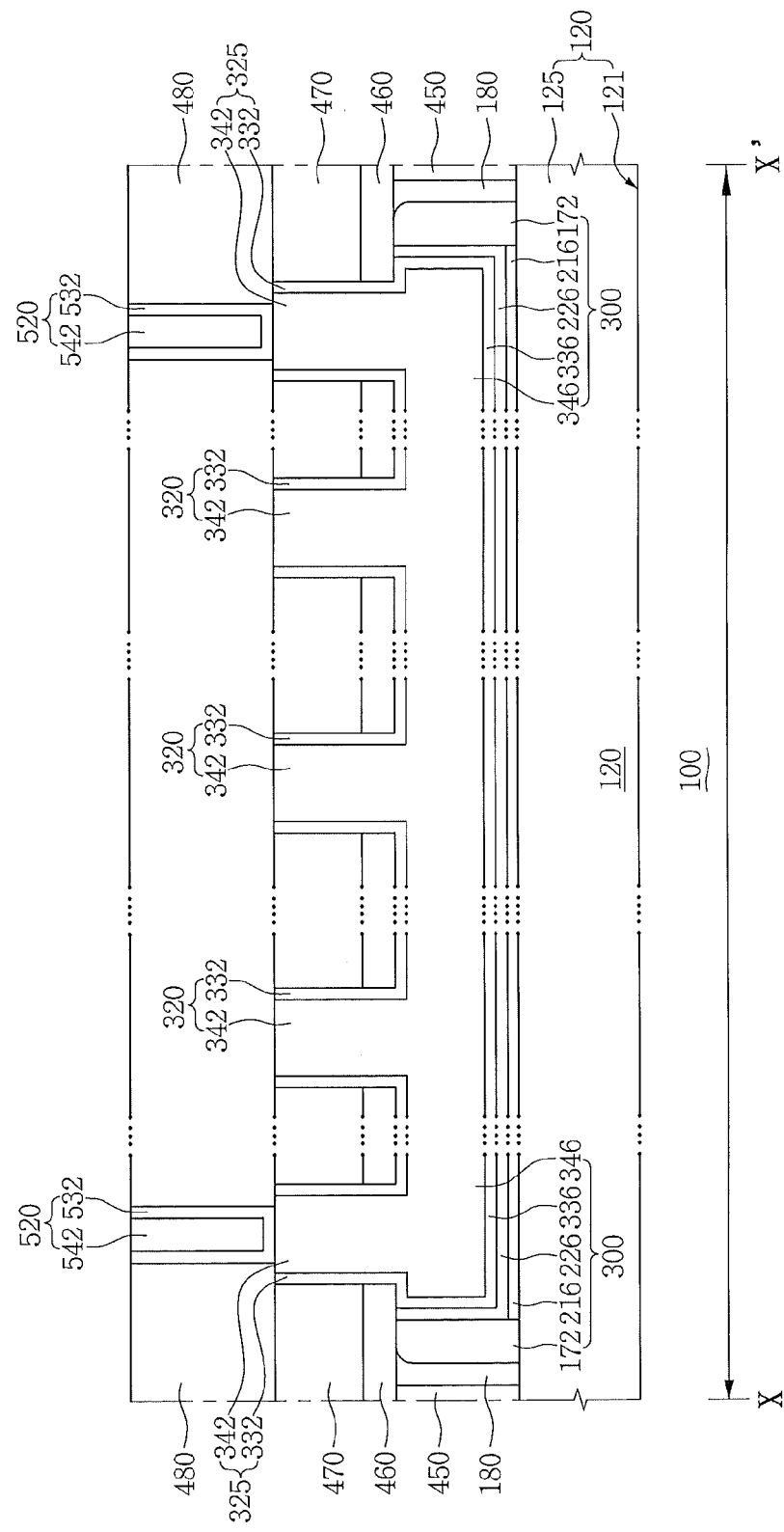
Figure 32D:
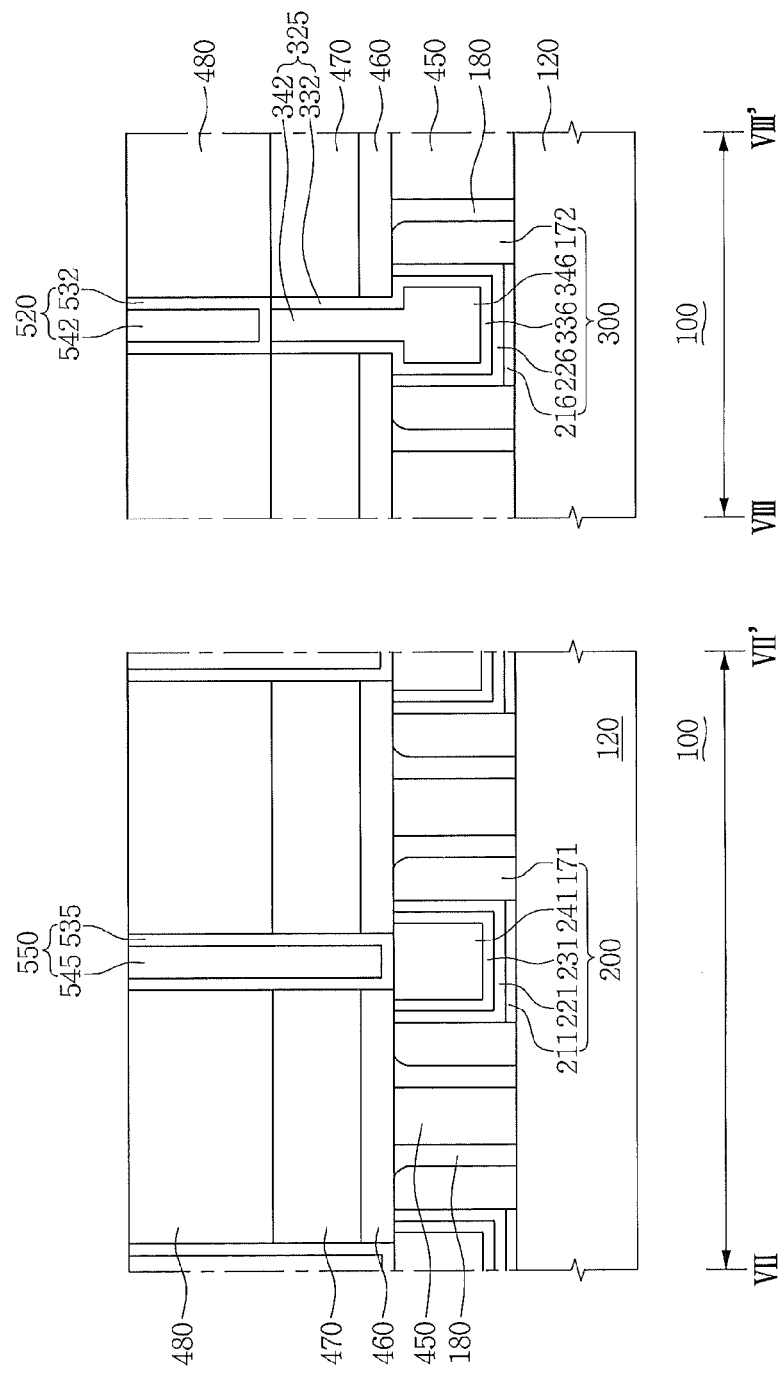

Referring to FIGS. 32A through 32D, the method may include performing the processes described with reference to FIGS. 24A through 24D, specifically, forming source/drain contact plugs 510, resistive contact plugs 520, and gate contact plugs 550. Referring further to FIG. 32C, the resistive contact plugs 520 may contact the outer resistive trench plugs 325 and may be aligned with and electrically connected to the outer resistive trench plugs 325. Subsequently, the method may further include forming a capping insulating layer 490 with further reference to FIGS. 3A through 3D.

The methods may provide methods of forming the resistor structure 300 using processes of forming the gate structure 200. Since a process of forming the gate structure 200 is compatible with processes of forming the resistor structure 300, the methods may provide a method of forming a desired metallic resistor or metallic electrical fuse using a relatively simple combination of the processes of forming the gate structure 200 and the resistor structure 300.

Figure 33A:
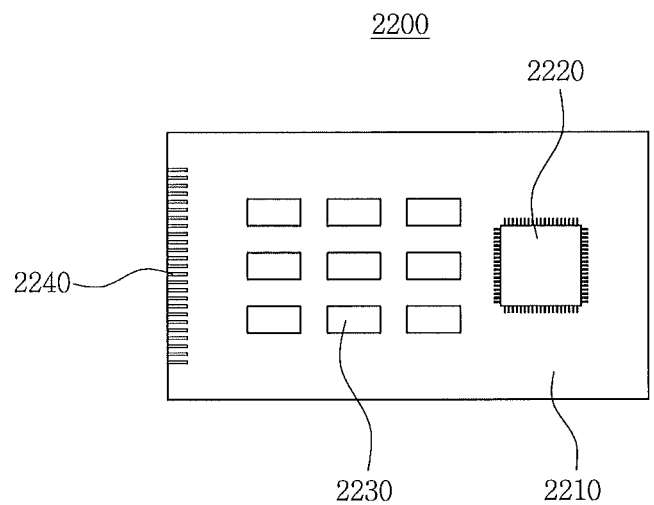
FIG. 33A is a diagram of a semiconductor module including a semiconductor device according to some embodiments of the present inventive concept.

FIG. 33A is a diagram of a semiconductor module including a semiconductor device according to some embodiments of the present inventive concept. Referring to FIG. 33A, a semiconductor module 2200 may include a semiconductor device according to some embodiments of the inventive concept. The semiconductor device may be mounted on a semiconductor module substrate 2210. The semiconductor module 2200 may further include a microprocessor (MP) 2220 mounted on the semiconductor module substrate 2210. Input/output (I/O) terminals 2240 may be disposed on at least one side of the module substrate 2210. The MP 2220 may include a semiconductor device according to some embodiments of the inventive concept.

Figure 33B:
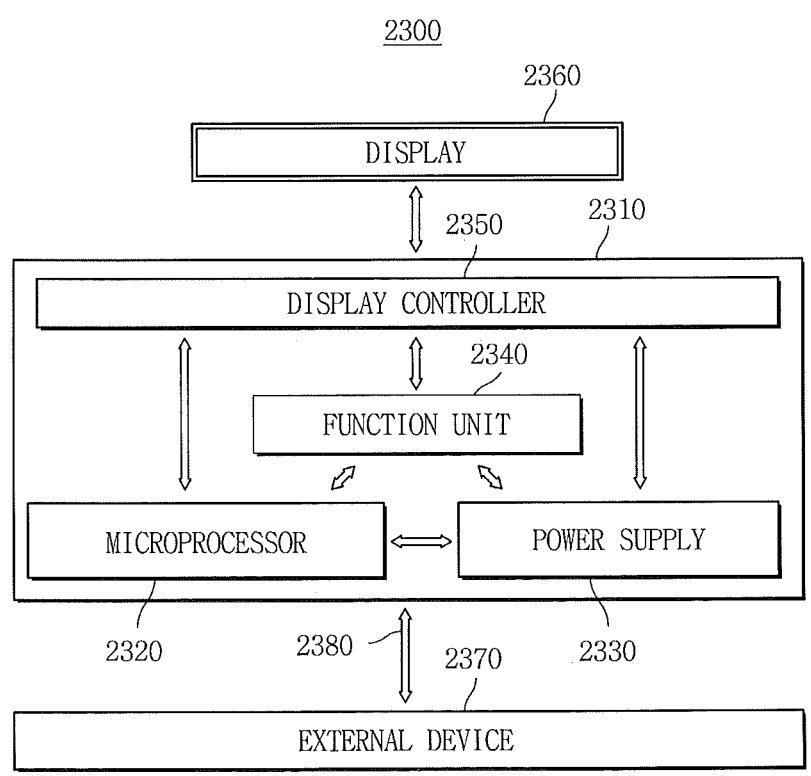
FIGS. 33B and 33C are block diagrams of electronic systems including a semiconductor device according to some embodiments of the present inventive concept.

FIG. 33B is a block diagram of an electronic systems including a semiconductor device according to some embodiments of the present inventive concept. Referring to FIG. 33B, a semiconductor device according to some embodiments of the inventive concept may be applied to the electronic system 2300. The electronic system 2300 may include a body 2310. The body 2310 may include an MP 2320, a power supply 2330, a function unit 2340, and/or a display controller 2350. The body 2310 may be a system board or motherboard having a printed circuit board (PCB). The MP 2320, the power supply 2330, the function unit 2340, and the display controller 2350 may be mounted on the body 2310. A display unit 2360 may be disposed on a top surface of the body 2310 or outside the body 2310. For example, the display unit 2360 may be disposed on a surface of the body 2310 and display an image processed by the display controller 2350. The power supply 2330 may receive a predetermined voltage from an external power source, divide the predetermined voltage into various voltage levels, and transmit the divided voltages to the MP 2320, the function unit 2340, and the display controller 2350. The MP 2320 may receive a voltage from the power supply 2330 and control the function unit 2340 and the display unit 2360. The function unit 2340 may implement various functions of the electronic system 2300. For instance, if the electronic system 2300 is a mobile electronic product, such as a portable phone, the function unit 2340 may include several elements capable of wireless communication functions, such as output of an image to the display unit 2360 or output of a voice to a speaker, by dialing or communication with an external device 2370. If the function unit 2340 includes a camera, the function unit 2340 may serve as an image processor. In some embodiments, when the electronic system 2300 is connected to a memory card to increase the capacity of the electronic system 2300, the function unit 2340 may be a memory card controller. The function unit 2340 may exchange signals with the external device 2370 through a wired or wireless communication unit 2380. In addition, if the electronic system 2300 includes a universal serial bus (USB) to expand functions thereof, the function unit 2340 may serve as an interface controller. A semiconductor device according to some embodiments of the inventive concept may be included in at least one of the MP 2320 and the function unit 2340.

Figure 33C:
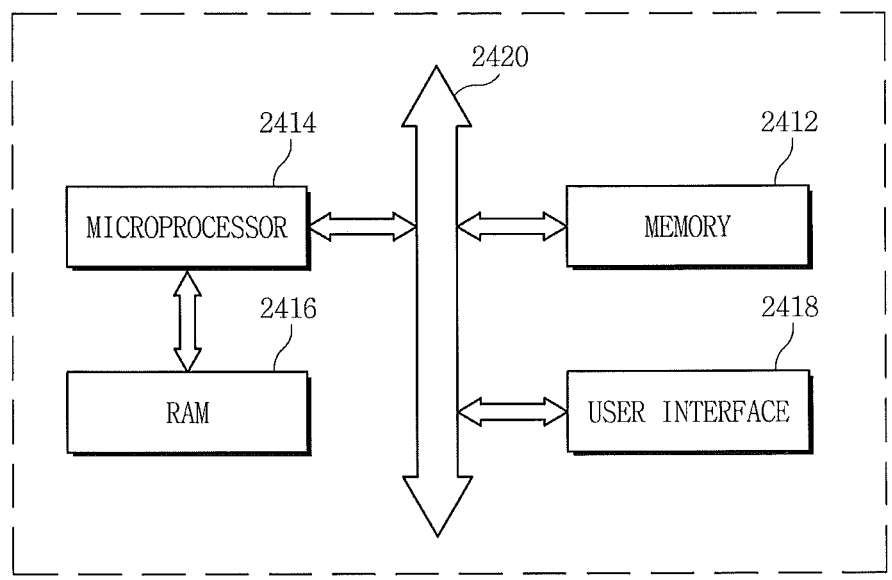

FIG. 33C is a block diagram of an electronic systems including a semiconductor device according to some embodiments of the present inventive concept. Referring to FIG. 33C, the electronic system 2400 may include at least one semiconductor device according to some embodiments of the inventive concept. The electronic system 2400 may be used to fabricate a mobile device or computer. For example, the electronic system 2400 may include a memory system 2412, an MP 2414, a random access memory (RAM) 2416, and a user interface 2418 configured to communicate data using a bus 2420. The MP 2414 may program and control the electronic system 2400. The RAM 2416 may be used as an operation memory of the MP 2414. For instance, the MP 2414 or the RAM 2416 may include at least one of the semiconductor devices 10a and 10b. The MP 2414, the RAM 2416, and/or other elements may be assembled within a single package. The user interface 2418 may be used to input data to the electronic system 2400, or output data from the electronic system 2400. The memory system 2412 may store codes for operating the MP 2414, data processed by the MP 2414, or external input data. The memory system 2412 may include a controller and a memory.

Figure 33D:
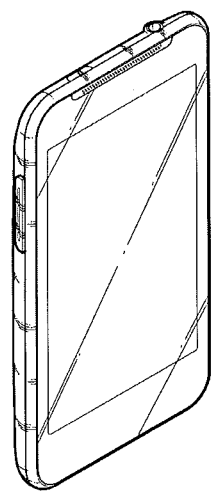
FIG. 33D is a mobile device including a semiconductor device according to some embodiments of the present inventive concept.

FIG. 33D is a mobile device including a semiconductor device according to some embodiments of the present inventive concept. The mobile device 2500 may be interpreted as a mobile phone or a tablet personal computer (PC). Furthermore, at least one semiconductor device according to some embodiments of the inventive concept may be used not only for a mobile phone or a tablet PC but also for a portable computer, such as a laptop computer, an MPEG-1 audio layer 3 (MP3) player, an MP4 player, a navigation device, a solid-state disk (SSD), a desktop computer, or electronic devices for automotive and household uses.

Semiconductor devices according to some embodiments of the inventive concept may include a resistor structure including a metal, a metal silicide, or a metal compound. Accordingly, the resistor structure may have a low resistance and thus the resistor structure may have a fine size. The semiconductor devices may have a resistor structure having the same shape as or a similar shape to a gate structure. Thus, the resistor structure may be formed using a process of forming the gate structure, and may have a fine size and desired resistance like the gate structure. The resistor structure may be used as a plurality of electrical fuses. For example, a plurality of resistor structures may be formed adjacent each other and may constitute a fuse region including a plurality of electrical fuses.

Methods of manufacturing semiconductor devices according to some embodiments of the inventive concept may provide an easy method of manufacturing a semiconductor device including a metallic gate structure and a metallic resistor structure. The methods of manufacturing the semiconductor devices may provide a method of forming the resistor structure using processes of forming the gate structure without performing additional processes for forming the resistor structure.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
an active region and a field region in a substrate;
a gate structure on the active region;
a resistor structure on the field region;
a first interlayer insulating layer on the gate structure and the resistor structure;
a resistor trench plug vertically penetrating through the first interlayer insulating layer and contacting the resistor structure;
a second interlayer insulating layer on the first interlayer insulating layer and the resistor trench plug; and
a resistor contact plug vertically penetrating through the first and second interlayer insulating layers and contacting the resistor structure, wherein the resistor contact plug is spaced apart from the resistor trench plug.

2. The device of claim 1, further comprising:
a source/drain region on the active region adjacent a side of the gate structure; and
a source/drain trench plug vertically penetrating through the first interlayer insulating layer and contacting the source/drain region.

3. The device of claim 2, wherein a top surface of the resistor trench plug is at a level equal to a top surface of the source/drain trench plug.

4. The device of claim 2, further comprising a source/drain contact plug vertically penetrating through the second interlayer insulating layer and contacting the source/drain trench plug.

5. The device of claim 4, wherein:
the source/drain trench plug comprises a source/drain trench electrode and a source/drain trench barrier layer surrounding bottom and side surfaces of the source/drain trench electrode;
the source/drain contact plug comprises a source/drain contact electrode and a source/drain contact barrier layer surrounding bottom and side surfaces of the source/drain contact electrode; and
the source/drain contact barrier layer contacts a top surface of the source/drain trench electrode.

6. The device of claim 4, wherein a top surface of the resistor contact plug is at a level equal to a top surface of the source/drain contact plug.

7. The device of claim 4, further comprising a gate contact plug vertically penetrating the first and second interlayer insulating layers and contacting the gate structure,
wherein a top surface of the gate contact plug, a top surface of the resistor contact plug, and a top surface of the source/drain contact plug are at an equal level.

8. The device of claim 1, further comprising a gate contact plug vertically penetrating the first and second interlayer insulating layers and contacting the gate structure,
wherein the field region comprise a first field region and the device further comprises a second field region, and
wherein the gate structure comprises a portion of the gate structure extending on the second field region, and the gate contact plug contacts the portion of the gate structure extending on the second field region.

9. The device of claim 1, wherein:
the resistor contact plug contacts a longitudinal edge portion of the resistor structure; and
the resistor trench plug contacts a longitudinal middle portion of the resistor structure.

10. The device of claim 1, wherein the resistor structure comprises:
a resistor insulating layer on the field region;
a resistor barrier layer on the resistor insulating layer; and
a resistor electrode on the resistor barrier layer,
wherein the resistor insulating layer has a U shape when viewed in cross section so as to surround bottom and side surfaces of the resistor barrier layer, and the resistor barrier layer surrounds bottom and side surfaces of the resistor electrode.

11. The device of claim 10, wherein:
the resistor insulating layer comprises a metal oxide;
the resistor barrier layer comprises a metal or a metal nitride; and
the resistor electrode comprises a metal or a metal silicide.

12. The device of claim 10, wherein:
the resistor trench plug comprises a resistor trench electrode and a resistor trench barrier layer surrounding the resistor trench electrode;
the resistor electrode and the resistor trench electrode are contiguous with each other; and
the resistor barrier layer and the resistor trench barrier layer are contiguous with each other.

13. A semiconductor device comprising:
an active region and a field region in a substrate;
a gate structure on the active region;
a resistor structure on the field region;
a source/drain region on the active region adjacent a side of the gate structure;
a first interlayer insulating layer covering the gate structure and the resistor structure;
a source/drain trench plug vertically penetrating through the first interlayer insulating layer and contacting the source/drain region;
a resistor trench plug vertically penetrating the first interlayer insulating layer and contacting the resistor structure, wherein the resistor trench plug is contiguous with the resistor structure, and a top surface of the source/ drain trench plug is at a level equal to a top surface of the resistor trench plug;

a second interlayer insulating layer on the first interlayer insulating layer, the source/drain trench plug, and the resistor trench plug; and a gate contact plug vertically penetrating through the first and second interlayer insulating layers and contacting the gate structure.

14. The device of claim 13, further comprising a source/drain contact plug vertically penetrating through the second interlayer insulating layer and contacting the source/drain trench plug, wherein a top surface of the gate contact plug is at a level equal to a top surface of the source/drain contact plug.

15. The device of claim 13, wherein:

the gate structure comprises a gate electrode and a gate barrier layer surrounding the gate electrode;

the resistor structure comprises a resistor electrode and a resistor barrier layer surrounding the resistor electrode;

the source/drain trench plug comprises a source/drain trench electrode and a source/drain trench barrier layer surrounding the source/drain trench electrode;

the resistor trench plug comprises a resistor trench electrode and a resistor trench barrier layer surrounding the resistor trench electrode; and the resistor electrode, the source/drain trench electrode, and the resistor trench electrode comprises a metal different from the gate electrode.

16. A semiconductor device comprising:

a substrate comprising an active region and a field region;

a first insulating layer on the substrate;

a gate electrode on the active region in the first insulating layer, wherein a top surface of the gate electrode and a top surface of the first insulating layer are at an equal level;

a second insulating layer on the first insulating layer and the gate electrode;

a resistor electrode on the field region, wherein the resistor electrode comprises a lower resistor electrode in the first insulating layer and an upper resistor electrode in the second insulating layer, and the lower and upper resistor electrodes are contiguous with each other; and a resistor barrier layer comprising a lower portion extending between the first insulating layer and the lower resistor electrode and an upper portion extending between the second insulating layer and the upper resistor electrode.

17. The semiconductor device of claim 16, wherein the lower and upper portions of the resistor barrier layer are contiguous with each other.

18. The semiconductor device of claim 16, further comprising:

a gate insulating layer on a sidewall and a bottom surface of the gate electrode; and a resistor insulating layer on a sidewall and a bottom surface of the resistor electrode, wherein a top surface of the gate insulating layer is at a level equal to a top surface of the resistor insulating layer.

19. The semiconductor device of claim 16, further comprising:

a source/drain region on the active region adjacent a side of the gate electrode;

a source/drain contact contacting the source/drain region, wherein the source/drain contact comprises a source/drain electrode in the first and second insulating layers, and a top surface of the source/drain electrode is at a level equal to a top surface of the resistor electrode.

20. The semiconductor device of claim 19, wherein the resistor electrode and the source/drain electrode comprises a metal different from the gate electrode.

* * * * *